(12) United States Patent
Wang et al.

(10) Patent No.: US 8,209,656 B1
(45) Date of Patent: *Jun. 26, 2012

(54) PATTERN DECOMPOSITION METHOD

(75) Inventors: Xiaojun Wang, Cary, NC (US); Yuane Qiu, Cupertino, CA (US); Prasanti Uppaluri, Cary, NC (US); Judy Huckabay, Fremont, CA (US); Tianhao Zhang, Raleigh, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 708 days.

This patent is subject to a terminal disclaimer.

(21) Appl. No.: 12/251,455

(22) Filed: Oct. 14, 2008

(51) Int. Cl.
*G06F 17/50* (2006.01)
*G06F 15/04* (2006.01)

(52) U.S. Cl. ............... 716/139; 716/50; 716/51; 716/52; 716/53; 716/54; 716/118; 716/119; 716/122; 716/132; 716/135

(58) Field of Classification Search ............... 716/50–55, 716/104–107, 110–112, 118–119, 122, 132, 716/135, 139
See application file for complete search history.

(56) References Cited

U.S. PATENT DOCUMENTS

| | | | |
|---|---|---|---|
| 5,552,996 | A | 9/1996 | Hoffman et al. |
| 5,739,898 | A | 4/1998 | Ozawa et al. |
| 5,784,289 | A | 7/1998 | Wang |
| 6,189,130 | B1 | 2/2001 | Gofman et al. |
| 6,518,180 | B1 | 2/2003 | Fukuda |
| 6,553,562 | B2 | 4/2003 | Capodieci et al. |
| 6,574,782 | B1 | 6/2003 | Dewey, III et al. |
| 6,578,190 | B2 | 6/2003 | Ferguson et al. |
| 6,586,341 | B2 * | 7/2003 | Moniwa et al. ............... 438/717 |
| 6,625,802 | B2 | 9/2003 | Singh et al. |
| 6,670,080 | B2 | 12/2003 | Sugita et al. |
| 6,721,938 | B2 | 4/2004 | Pierrat et al. |
| 6,893,800 | B2 | 5/2005 | Jessen et al. |
| 7,082,588 | B2 | 7/2006 | Scheffer et al. |
| 7,254,798 | B2 | 8/2007 | Scheffer et al. |
| 7,861,196 | B2 * | 12/2010 | Huckabay et al. ............ 716/136 |
| 2003/0229881 | A1 | 12/2003 | White et al. |
| 2004/0058255 | A1 | 3/2004 | Jessen et al. |
| 2004/0216065 | A1 | 10/2004 | Cobb et al. |

(Continued)

FOREIGN PATENT DOCUMENTS

WO    WO 2005/109256    11/2005

(Continued)

OTHER PUBLICATIONS

U.S. Appl. No. 12/955,895, filed Nov. 29, 2010, Huckabay, Judy, et al.

(Continued)

*Primary Examiner* — Nghia Doan
(74) *Attorney, Agent, or Firm* — Adeli & Tollen LLP

(57) ABSTRACT

Some embodiments provide a method for decomposing a region of an integrated circuit ("IC") design layout into multiple mask layouts. The method identifies a number of sets of geometries in the design layout region that must be collectively assigned to the multiple mask layouts. The method assigns the geometries in a first group of collectively-assigned sets to different mask layouts without splitting any of the geometries. The method assigns the geometries in a second group of the collectively-assigned sets to different mask layouts in such a way so as to minimize the number of splits in the geometries of the second group.

38 Claims, 34 Drawing Sheets

U.S. PATENT DOCUMENTS

| | | | |
|---|---|---|---|
| 2005/0044514 | A1 | 2/2005 | Wu et al. |
| 2005/0076316 | A1 | 4/2005 | Pierrat et al. |
| 2005/0162627 | A1 | 7/2005 | Finders et al. |
| 2006/0062445 | A1 | 3/2006 | Verma et al. |
| 2007/0031740 | A1 | 2/2007 | Chen et al. |
| 2007/0157154 | A1 | 7/2007 | Socha |
| 2008/0069432 | A1* | 3/2008 | Hsu et al. .................... 382/145 |
| 2008/0072207 | A1 | 3/2008 | Verma et al. |
| 2008/0144969 | A1 | 6/2008 | Park |
| 2009/0024967 | A1 | 1/2009 | Su et al. |
| 2009/0148783 | A1 | 6/2009 | Socha |
| 2009/0199137 | A1 | 8/2009 | Huckabay et al. |
| 2010/0017779 | A1 | 1/2010 | Kim |
| 2010/0023914 | A1* | 1/2010 | Sahouria et al. ................ 716/19 |
| 2010/0037200 | A1 | 2/2010 | Ghan et al. |
| 2010/0119144 | A1 | 5/2010 | Kulkarni et al. |
| 2011/0167397 | A1 | 7/2011 | Huckabay et al. |

FOREIGN PATENT DOCUMENTS

| | | |
|---|---|---|
| WO | WO 2005/109257 | 11/2005 |

OTHER PUBLICATIONS

Portions of prosecution history of U.S. Appl. No. 10/836,581, Mailed Mar. 1, 2003, Scheffer, Louis K.

Portions of prosecution history of U.S. Appl. No. 10/836,582, Mailed Mar. 28, 2007, Scheffer, Louis K.

Updated portions of prosecution history of U.S. Appl. No. 12/023,512, Mailed Nov. 22, 2010, Huckabay, Judy, et al.

Portions of prosecution history of U.S. Appl. No. 12/189,692, Mailed Dec. 22, 2010, Ghan, Justin, et al.

International Search Report and Written Opinion for PCT/US2005/014983, (mailing date Mar. 15, 2006, Cadence Design Systems, Inc.

International Preliminary Report on Patentability for PCT/US2005/014983, (completion date) Mar. 7, 2006, Cadence Design Systems, Inc.

International Search Report and Written Opinion for PCT/US2005/015024, mailing date Oct. 12, 2005, Cadence Design Systems, Inc.

International Preliminary Report on Patentability for PCT/US2005/015024, issuance date Nov. 1, 2006, Cadence Design Systems, Inc.

Portions of prosecution history of U.S. Appl. No. 12/023,512, Mailed Jan. 6, 2010, Huckabay, Judy, et al.

Response to Non-Final Office Action of U.S. Appl. No. 12/023,512, Mailed May 6, 2010, Huckabay, Judy, et al.

U.S. Appl. No. 13/215,113, filed Aug. 22, 2011, Sharma, Karun, et al.

U.S. Appl. No. 13/215,118, filed Aug. 22, 2011, Wang, Xiaojun.

Updated portions of prosecution history of U.S. Appl. No. 12/955,895, Mailed Aug. 16, 2011, Huckabay, Judy, et al.

Portions of prosecution history of U.S. Appl. No. 12/189,692, Mailed Jun. 30, 2011, Ghan, Justin, et al.

* cited by examiner

PATTERN DECOMPOSITION METHOD

FIELD OF THE INVENTION

The invention relates to manufacturing integrated circuits (ICs). More particularly, this invention relates to the decomposition of a single design layout into multiple mask layouts.

BACKGROUND

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components.

Design engineers design ICs by transforming logical or circuit descriptions of the ICs' components into geometric descriptions, called design layouts. IC design layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. In this fashion, design layouts often describe the behavioral, architectural, functional, and structural attributes of the IC.

To create the design layouts, design engineers typically use electronic design automation ("EDA") applications. These applications provide sets of computer-based tools for creating, editing, analyzing, and verifying design layouts.

Fabrication foundries ("fabs") manufacture ICs based on the design layouts using a photolithographic process. Photolithography is an optical printing and fabrication process by which patterns on a photolithographic mask (i.e., "photomask," or "mask") are imaged and defined onto a photosensitive layer coating a substrate. To fabricate an IC, photomasks are created using the IC design layout as a template. The photomasks contain the various geometries (i.e., features) of the IC design layout. The various geometries contained on the photomasks correspond to the various base physical IC elements that comprise functional circuit components such as transistors, interconnect wiring, via pads, as well as other elements that are not functional circuit elements but that are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

As circuit complexity continues to increase and transistor designs become more advanced and ever smaller in size (i.e., die shrink), advances in photolithographic processes are being pursued to enable the large scale, low cost manufacturing of such circuits. However, constraining factors in traditional photolithographic processes limit the effectiveness of current photolithographic processes. Some such constraining factors are the lights/optics used within the photolithographic processing systems. Specifically, the lights/optics are band limited due to physical limitations (e.g., wavelength and aperture) of the photolithographic process. Therefore, the photolithographic process cannot print beyond a certain pitch, distance, and other such physical manufacturing constraints.

A pitch specifies a sum of the width of a feature and the space on one side of the feature separating that feature from a neighboring feature. Depending on the photolithographic process at issue, factors such as optics and wavelengths of light or radiation restrict how small the pitch may be made before features can no longer be reliably printed to a wafer or mask. As such, the smallest size of any features that can be created on a wafer is limited by the pitch.

FIG. 1 illustrates a typical pitch constraint of a photolithographic process. In FIG. 1, a pitch 110 acts to constrain the spacing between printable features 120 and 130 of a design layout. While other photolithographic process factors such as the threshold 140 can be used to narrow the width 150 of the features 120 and 130, such adjustments do not result in increased feature density without adjustments to the pitch 110. As a result, increasing feature densities beyond a certain threshold is infeasible via a pitch constrained single exposure process.

Certain reticle enhancement techniques (RET) allow for photolithographic processes to extend beyond some of the various photolithographic manufacturing constraints such as the width constraint. Some common techniques include: using optical proximity correction (OPC) to distort photomask shapes to compensate for image errors resulting from diffraction or process effects that cause pattern inaccuracies, using off-axis illumination (OAI) for optimizing the angle of illumination for a particular pitch, using alternating phase shift masks (PSM) for improving lithographic resolution by introducing a particular phase shift between adjacent patterns or features on a photomask, and using scatter bars to place narrow lines or spaces adjacent to a feature in order to make a relatively isolated line behave more like a dense line.

However, these and other techniques are limited both by cost and effectiveness. To overcome these and other constraints, some fabrication processes have implemented a multiple exposure photolithographic process as illustrated in FIG. 2. This multiple exposure process, or Multi-Patterning Technology (MPT) is an important Resolution Enhancement Technique (RET) to enable drawn features to be printed at 32 nm nodes and below. The key advantage of MPT is that it does not require new manufacturing equipment or major changes in the existing manufacturing process.

In FIG. 2, a design layout 205 specifies three features 210-230 that are pitch constrained and therefore cannot be photolithographically printed with a conventional single exposure process. Analysis of the characteristics (e.g., the band limitation) of the available photolithographic process and of the design layout 205 results in the decomposition of the design layout 205 into a first exposure 240 for printing features 210 and 230 and a second exposure 250 for printing feature 220. As such, the features 210 and 230 are assigned to a first photomask for printing during the first exposure 240 and feature 220 is assigned to a second photomask for printing during the second exposure 250.

At the center of MPT is the layout decomposition software. It divides a layer of the layout drawn features into multiple masks (or exposures) so that the pitch is effectively increased on each mask (e.g., the pitch is doubled when the layer is split into two masks). For MPT layout decomposition, contact and via layer is relatively simple to handle, since the drawn features on those layers are simple rectangles. On the other hand, the decomposition of metal and poly layers (so called "wire layer") is usually quite complicated since they include more complex drawn polygons.

FIG. 3 illustrates a decomposition of a pattern 310 defined in a layer of design layout for fabricating an IC into two sets of polygons 320 and 330. Each such decomposed set of polygons 320 and 330 is printed during an exposure of a multiple exposure photolithographic printing process. For instance, polygon set 320 is printed during a first exposure in order to produce contours 340 and polygon set 330 is printed during a second exposure in order to produce contours 350. The resulting union of the contours 340 and 350 generates pattern 360 that is sufficient to approximately reproduce the original pattern 310. Accordingly, a valid decomposition solution is such that the union of the contours created/printed from each exposure closely approximates specifications within the original design layout and satisfies multi-exposure photolithographic printing constraints (e.g., the band limit and the target layout specified within the design layout) with no resulting "opens", "shorts", or other printing errors materializing on the physical wafer.

FIG. 4 illustrates some of the problems that may be caused by partitioning a single geometry on a single layer between two or more exposures. As shown, a single geometry 405 is first placed entirely on a single exposure, and the resulting geometry 410 matches the target geometry with no or open or shorted connections, etc. In some instances, the geometry 405 is broken between two or more exposures. In FIG. 4, geometry 405 has a section 435 placed on the black (or first) exposure, while two sections 440 and 445 are placed on the white (or second) exposure. When the resulting exposures are printed, the IC geometry 450 has two sections that were defined by the white exposure and one section defined by the black exposure. As shown, using multiple exposures for a single geometry may result in misaligned connections 455, or even completely "open" connections 460. Thus, single geometries split among multiple exposures are more susceptible to manufacturing defects caused by misalignment between the two exposures. In some cases, the misalignment is caused by X-Y misalignment, rotational misalignment, variation in exposure or etch times, etc.

Existing decomposition tools do not adequately account for such splits. Therefore, there is a need in the art for methods that efficiently and effectively decompose an entire layout or section of a layout while minimizing the number of splits in the geometries.

Moreover, existing decomposition tools are inefficient in the manner by which they perform decomposition analysis. Repeated polygonal patterns within a single design layout are each independently analyzed and a solution is provided for each instance as if each instance is the first such instance. Therefore, the more dense a design layout, the more time and processing resources needed to process and decompose the design layout. Therefore, there is a need for a decomposition method that efficiently takes into account such repeated polygonal patterns within a single design layout.

SUMMARY OF THE INVENTION

Some embodiments provide a method for decomposing a region of an IC design layout into multiple (e.g., two) mask layouts. In some embodiments, the IC design layout region can be part or all of a single device or routing layer (e.g., a polysilicon layer or one of the metal layers) of an IC design layout, while the multiple mask layouts can be used to create multiple masks for manufacturing (i.e., printing) the layout region of an IC device or wiring layer in multiple lithographic exposures.

In some embodiments, the method identifies a decomposition of the region of the design layout layer into multiple mask layouts by reducing the number of splits resulting from decomposing individual geometries (i.e., shapes) in the design layout into multiple geometries that are collectively defined in multiple mask layouts. To identify the decomposition, the method of some embodiments defines an objective function in terms of the potential splits of the different geometries. It then searches the solution space of the objective function to find an optimal decomposition solution that optimizes this objective function by minimizing the number of geometries (i.e., shapes) of the design layout region that are split between different mask layouts (i.e., by minimizing the number of splits in the geometries).

The method of some embodiments decomposes a region of a design layout layer by identifying a number of sets of geometries in the design layout region (which can be an entire layer or a section of a layer) that must be collectively assigned to the different mask layouts. The method then assigns the geometries in a first group of the collectively-assigned sets (referred to below as "split-free" sets) to different mask layouts without splitting any of the geometries, while assigning geometries in a second group of the collectively-assigned sets (referred to below as "must-split" sets) to different mask layouts in such a way so as to minimize the number of splits in the geometries in these "must-split" sets. The split-free sets are sets of geometries that are assigned to the different mask layouts in such a way that each geometry in each split-free set is assigned as a whole to only one mask layout, whereas the must-split sets are sets of geometries that must be assigned to the different mask layouts in such a way that at least one geometry in each must-split set is split between two mask layouts.

In order to identify sets of geometries that must be collectively assigned to the different mask layouts, some embodiments first identify all portions of all geometries that must be assigned to different mask layouts. Some embodiments identify the portions based on one or more design constraints (e.g., a minimum pitch, or width plus spacing, between the portions of the geometries). For instance, some embodiments identify portions that are too close to each other to be printed in the same exposure (called "critical portions"). Some embodiments also identify the associations between these portions (i.e., identifying pairs of portions that are "adjacent" to each other and thus need to be printed in different exposures).

In some embodiments, the method then examines whether there are one or more identified portions that present an assignment conflict that would prevent the identification of a decomposition solution. To examine this, some embodiments define a set of segment graphs that represent each critical portion as a node or vertex of a segment graph, and each association between critical portions as an edge or line in the graph. The method utilizes the set of segment graphs to determine whether the design layout region can be decomposed into two exposures that include all of the geometries of the design layout region while satisfying the design constraints. If the design layout region cannot be decomposed into two exposures, some embodiments output this information and identify the geometries that cannot be printed in two exposures so that a user can resolve the conflicts.

Some embodiments also use the set of segment graphs to identify each geometry that can be removed from the definition of the objective function and assigned immediately to one of the exposures (i.e., geometries in the split-free sets). For example, if a section of the design layout region in which a set of collectively-assigned geometries includes only geometries that each have only one critical portion, then in some cases the geometries can be immediately assigned to the different exposures without any of the geometries being split between more than one exposure. As such, the geometries can be removed from the definition of the objective function in order to reduce the complexity (and therefore, the required computational resources) of the decomposition problem.

Some embodiments also use a set of shape graphs to solve the decomposition problem. The set of shape graphs of some embodiments represents the relationships between the geometries of the design layout region. In some embodiments, two geometries are illustrated as connected in a shape graph if a portion of one geometry is in the same segment graph as a portion of the other geometry (i.e., if the assignment of a portion of one geometry to a particular exposure determines the assignment of a portion of a second geometry to a particular exposure).

Some embodiments use the shape graphs to initially assign each portion of the geometries of the design layout region to one of the multiple exposures. Some embodiments initially select one geometry at a time for assigning the portions of that geometry to a single exposure, with an ideal goal of minimizing the number of splits in the geometries between the multiple exposures. Some embodiments use the shape graphs to determine the order in which the geometries are selected. After assigning the portions of the selected geometry, some embodiments use the segment graphs to then assign all previously unassigned portions of geometries that belong to other geometries and that are associated with (i.e., are in the same segment graph as) a portion in the selected geometry.

When confronted with a geometry that cannot be assigned entirely to one particular exposure (e.g., because one portion is already assigned to a first exposure and a second portion is already assigned to a second exposure), some embodiments assign the unassigned portions of the geometry to the same exposure as the majority of the already-assigned portions of the geometry. When confronted with the task of assigning a previously unassigned portion of a geometry that has an equal number of portions previously assigned to each of two different exposures, some embodiments make a randomized decision as to which exposure the previously unassigned portion of the geometry should be assigned.

In some embodiments, these randomized decisions define variables that can be modified to traverse the solution space of the objective function. The method in these embodiments then traverses the solution space of the objective function in order to find an optimal decomposition solution that minimizes the number of splits between portions of geometries in the design layout region that are assigned to different exposures. Some embodiments search the solution space by revisiting the randomized decisions to assign portions of geometries to particular exposures, and comparing the solutions. Some embodiments also revisit the order of the assignment of the geometries to the different exposures.

Some embodiments perform a filtering operation prior to solving the objective function that in some cases reduces the complexity of the objective function. The filtering operation of some embodiments is another way of identifying split-free sets that can be assigned to the different exposures in such a way that each geometry in each split-free set is assigned as a whole to a particular exposure. In some of these embodiments, the geometries are not divided into critical portions and are instead decomposed as if each geometry is itself a critical portion. Geometries that can be assigned to the multiple exposures in this manner without any conflicts are assigned immediately and removed from the definition of the objective function.

In some embodiments, the design layout region is a hierarchical design layout region that includes one or more child sub-regions. In some embodiments, a child sub-region is an instance of a pre-defined set of geometries that may be used in multiple locations within the design layout region. Some embodiments pre-decompose each pre-defined set of geometries. In identifying an optimal decomposition solution, the decomposition of a particular set of geometries is applied to each instance of that particular set. In some embodiments, the method does not revisit the particular decomposition of a child sub-region during the optimization process.

BRIEF DESCRIPTION OF THE DRAWINGS

The novel features of the invention are set forth in the appended claims. However, for the purpose of explanation, several embodiments of the invention are set forth in the following figures.

DETAILED DESCRIPTION

Figure 1:
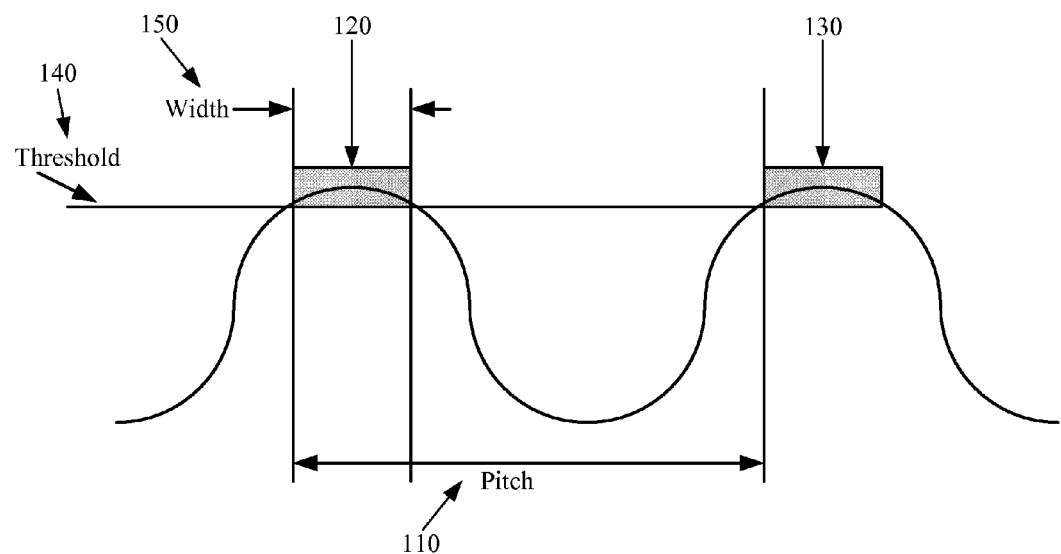
FIG. 1 illustrates a typical pitch constraint of a photolithographic process of some embodiments.
Figure 2:
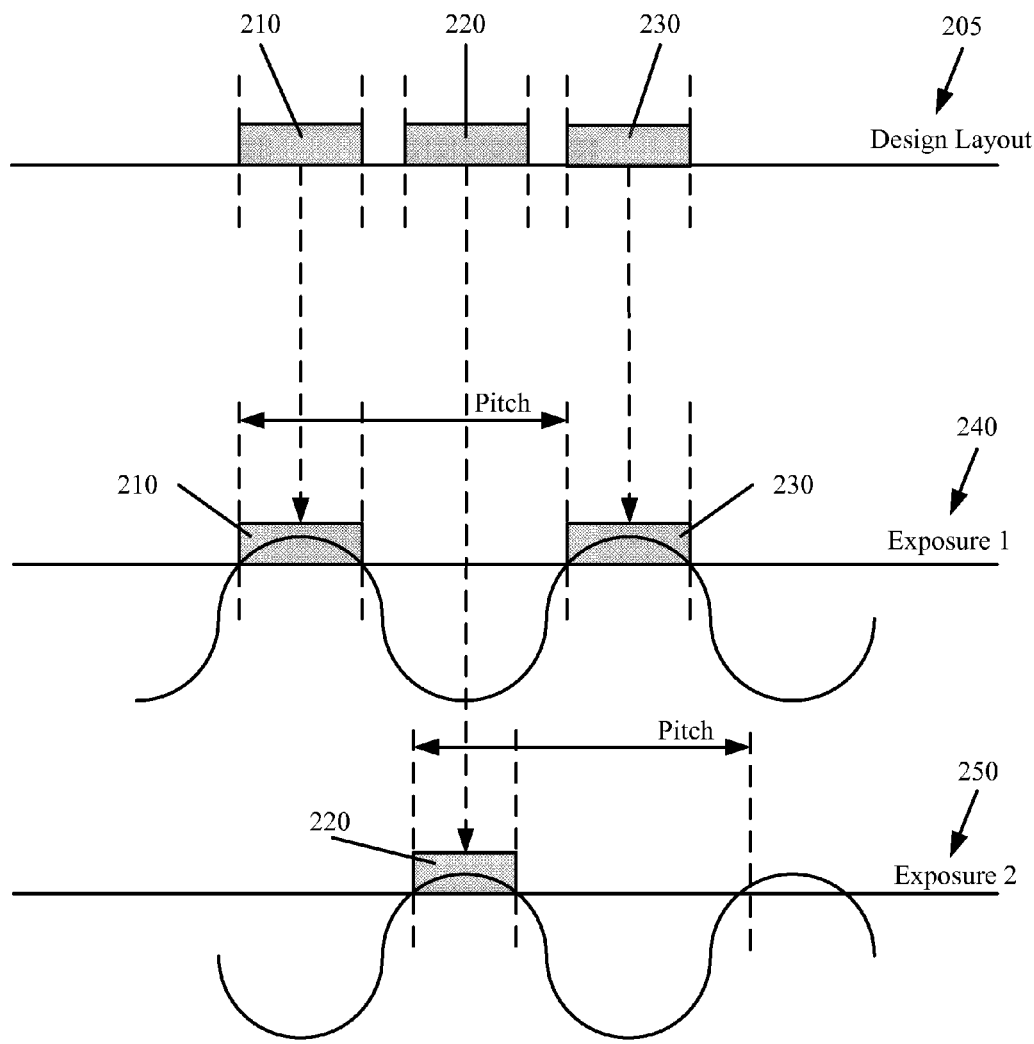
FIG. 2 illustrates an examples of a multiple exposure photolithographic process of some embodiments.
Figure 3:
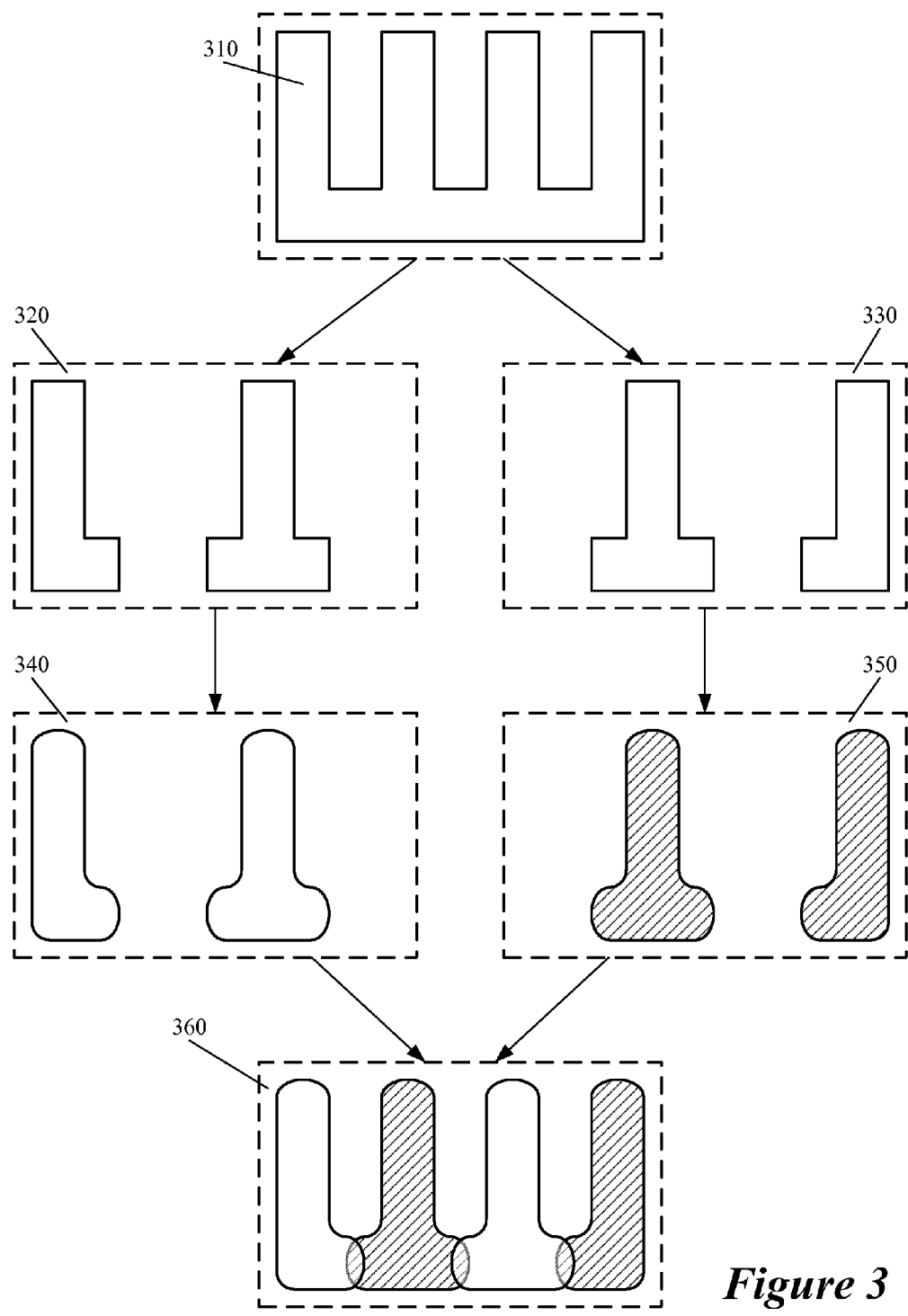
FIG. 3 illustrates a decomposition of a pattern defined in a layer of design layout for fabricating an IC into two sets of polygons of some embodiments.
Figure 4:
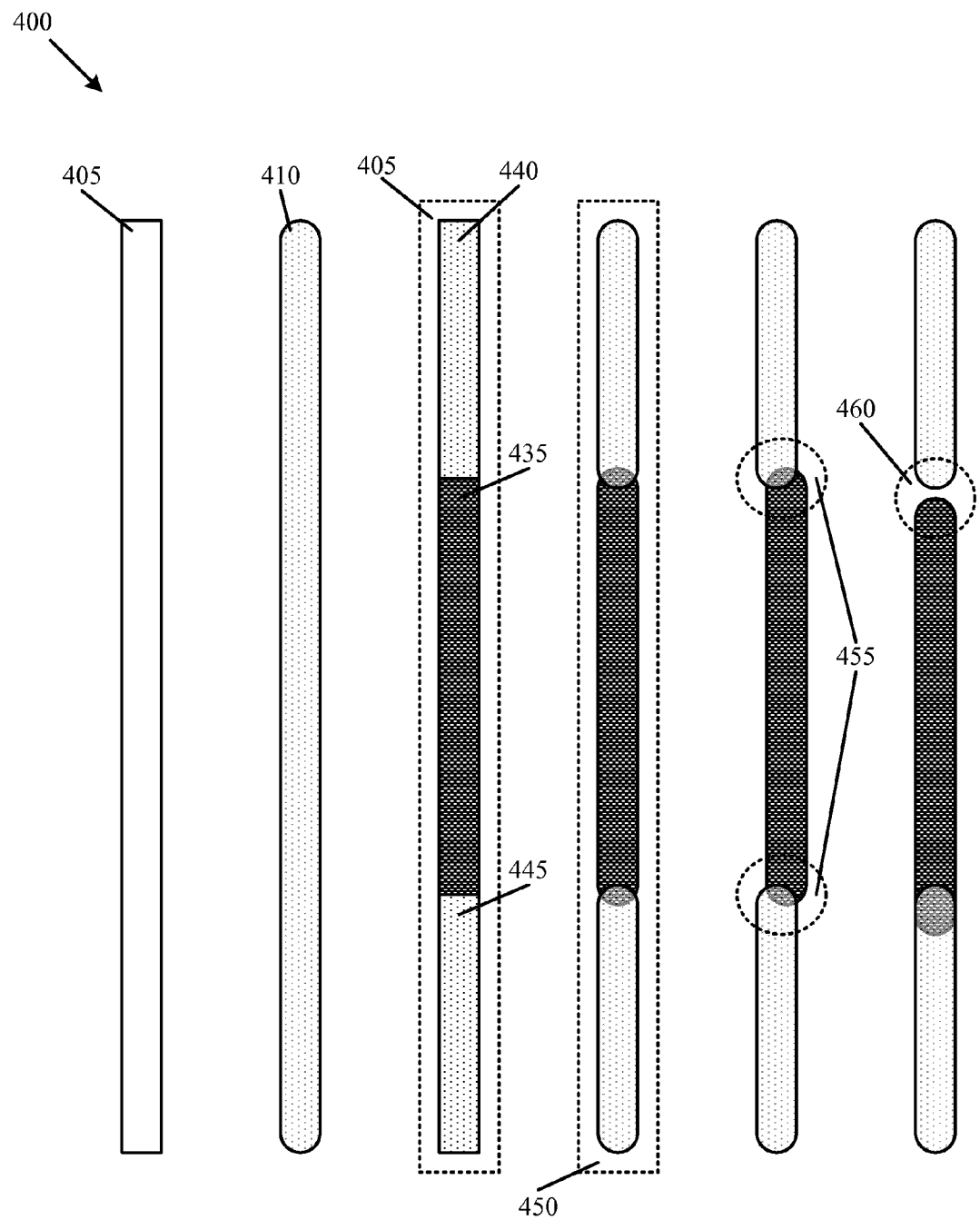
FIG. 4 illustrates some of the problems that may be caused by partitioning a single geometry on a single layer between two or more exposures of some embodiments.

In the following description, numerous details are set forth for purpose of explanation. However, one of ordinary skill in the art will realize that the invention may be practiced without the use of these specific details. For instance, not all embodiments of the invention need to be practiced with all process operations (e.g., filtering, hierarchical decomposition) referred to below. In other instances, well-known structures and devices are shown in block diagram form in order not to obscure the description of the invention with unnecessary detail.

I. Overview

Some embodiments provide a method for decomposing a region of an IC design layout into multiple (e.g., two) mask layouts. In some embodiments, the IC design layout region can be part or all of a single device or routing layer (e.g., a polysilicon layer or one of the metal layers) of an IC design layout, while the multiple mask layouts can be used to create multiple masks for manufacturing (i.e., printing) the layout region of an IC device or wiring layer in multiple lithographic exposures.

In some embodiments, the method identifies a decomposition of the region of the design layout layer into multiple mask layouts by reducing the number of splits resulting from decomposing individual geometries (i.e., shapes) in the design layout into multiple geometries that are collectively defined in multiple mask layouts. To identify the decomposition, the method of some embodiments defines an objective function in terms of the potential splits of the different geometries. It then searches the solution space of the objective function to find an optimal decomposition solution that optimizes this objective function by minimizing the number of geometries (i.e., shapes) of the design layout region that are split between different mask layouts (i.e., by minimizing the number of splits in the geometries).

The method of some embodiments decomposes a region of a design layout layer by identifying a number of sets of geometries in the design layout region (which can be an entire layer or a section of a layer) that must be collectively assigned to the different mask layouts. The method then assigns the geometries in a first group of the collectively-assigned sets (referred to below as "split-free" sets) to different mask layouts without splitting any of the geometries, while assigning geometries in a second group of the collectively-assigned sets (referred to below as "must-split" sets) to different mask layouts in such a way so as to minimize the number of splits in the geometries in these "must-split" sets. The split-free sets are sets of geometries that are assigned to the different mask layouts in such a way that each geometry in each split-free set is assigned as a whole to only one mask layout, whereas the must-split sets are sets of geometries that must be assigned to the different mask layouts in such a way that at least one geometry in each must-split set is split between two mask layouts.

In order to identify sets of geometries that must be collectively assigned to the different mask layouts, some embodiments first identify all portions of all geometries that must be assigned to different mask layouts. In some embodiments, the method then examines whether there are one or more identified portions that present an assignment conflict that would prevent the identification of a decomposition solution, prior to assigning the portions of the geometries to the different mask layouts.

Figure 5:
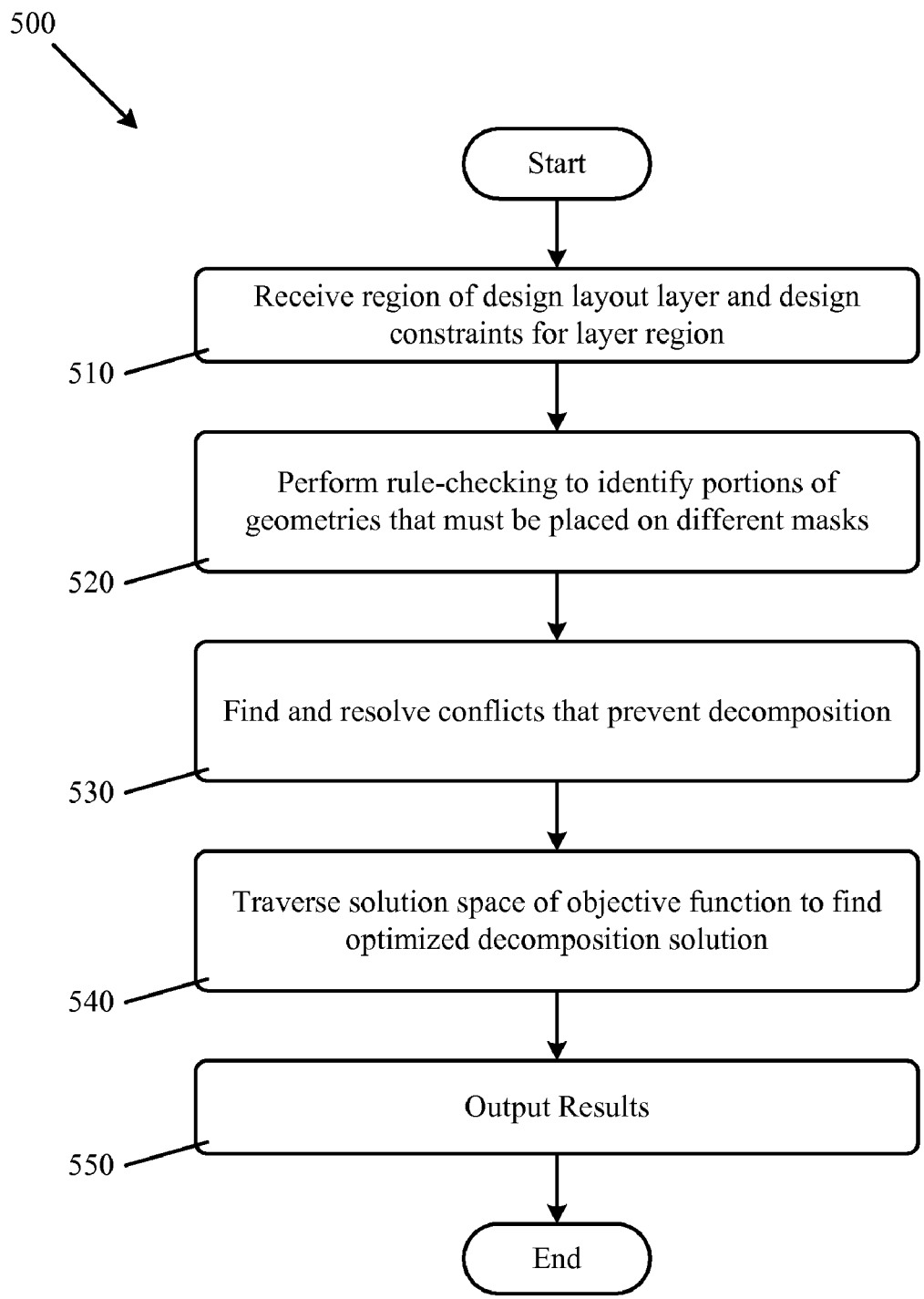
FIG. 5 conceptually illustrates a process for decomposing a layer or region of a layer into multiple exposures of some embodiments.
Figure 6:
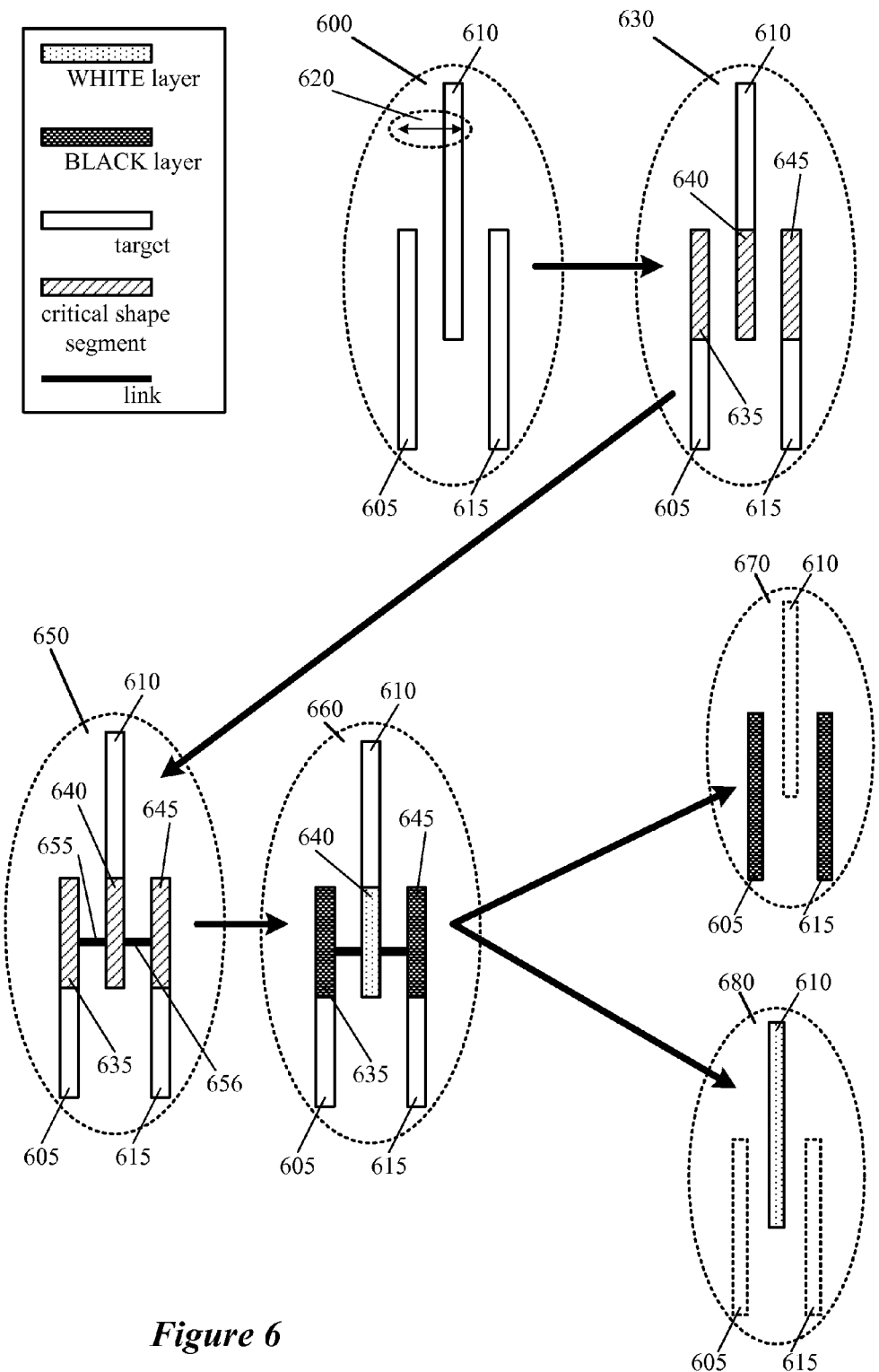
FIG. 6 illustrates a simplified example layout which is colored using the process of FIG. 5 of some embodiments.

More detailed embodiments for decomposing a design layout into multiple mask layouts are described below with reference to FIGS. 5 and 6. FIG. 5 conceptually illustrates a process 500 for decomposing a layer or region of a layer into multiple mask layouts. The process 500 starts at 510 when it receives (i) a region of a design layout layer comprising a set of geometries (i.e., shapes) at specified locations and (ii) design constraints for the design layout region. In some embodiments, the design constraints include a pitch requirement (i.e., the minimum distance that two shapes can be from each other and still be printed in the same exposure) in some embodiments. FIG. 6 illustrates a simplified example design layout region which is assigned to different exposures (i.e., assigned to different mask layouts) using the process 500. FIG. 6 illustrates a design layout region 600 that includes three shapes 605-615, and a pitch requirement 620.

After receiving the design layout region and design constraints, the process 500 performs (at 520) rule-checking to identify portions of geometries that must be assigned to different mask layouts. Some embodiments identify the portions based on the design constraints. Some embodiments identify portions (e.g., segments) are too close to each other to be printed in the same exposure (called "critical portions" or "critical shape segments"). Some embodiments also identify the associations between these portions (i.e., identifying pairs of portions that are "adjacent" to each other and thus need to be printed in different exposures).

FIG. 6 illustrates critical portions 635-645 that are closer than the pitch requirement 620 to another geometry. While the portions are described and illustrated below as rectilinear segments of rectilinear geometries, in some embodiments, the geometries and/or the portions thereof may be non-rectilinear shapes (e.g., hexagonal, rounded, etc.). FIG. 6 also illustrates associations (or "links") 655-656 between the critical portions. Link 655 is the association between critical portions 640 and 645, while link 656 is the association between critical portions 635 and 640.

The process 500 next finds and resolves (at 530) conflicts in the design layout region that prevent identification of a decomposition solution. To examine whether any such assignment conflicts exist, some embodiments define a set of segment graphs which represent each critical portion as a node or vertex of a graph, and each association between critical portions as an edge or line in the graph. The method utilizes the set of segment graphs to determine whether the design layout region can be decomposed into two exposures that include all of the geometries of the design layout region while satisfying the design constraints. If the design layout region cannot be decomposed into two exposures, some embodiments output this information and identify the geometries that cannot be printed in two exposures so that a user can resolve the conflicts.

Some embodiments also use the set of segment graphs to identify sets of geometries that can be removed from the definition of the objective function and assigned immediately to one of the exposures. For example, if a section of the design layout region in which the geometries must be collectively assigned includes geometries that each have only one critical portion, then in some cases the geometries can be immediately assigned to the different exposures without any of the geometries being split between more than one exposure. In some cases below, assigning a geometry or a portion of a geometry to a particular exposure is referred to as "coloring" the geometry or portion thereof (e.g., as black or white, or 0 or 1).

The process 500 then traverses (at 540) the solution space of the objective function to find an optimized decomposition solution. Some embodiments also use a set of shape graphs to solve the decomposition problem. The set of shape graphs of some embodiments represents the relationships between the geometries of the design layout region. In some embodiments, two geometries are illustrated as connected in a shape graph if a portion of one geometry is in the same segment graph as a portion of the other geometry (i.e., if the assignment of a portion of one geometry to a particular exposure determines the assignment of a portion of a second geometry to a particular exposure).

Some embodiments use the shape graphs to initially assign each portion of the geometries of the design layout region to one of the multiple exposures. Some embodiments initially select one geometry at a time for assigning the portions of that geometry to a single exposure, with an ideal goal of minimizing the number of splits in the geometries between the multiple exposures. Some embodiments use the shape graphs to determine the order in which the geometries are selected. After assigning the portions of the selected geometry, some embodiments use the segment graphs to then assign all previously unassigned portions of geometries that belong to other geometries and that are associated with (i.e., are in the same segment graph as) a portion in the selected geometry.

When confronted with a geometry that cannot be assigned entirely to one particular exposure (e.g., because one portion is already assigned to a first exposure and a second portion is already assigned to a second exposure), some embodiments assign the unassigned portions of the geometry to the same exposure as the majority of the already-assigned portions of the geometry. When confronted with the task of assigning a previously unassigned portion of a geometry that has an equal number of portions previously assigned to each of two different exposures, some embodiments make a randomized decision as to which exposure the previously unassigned portion of the geometry should be assigned.

In some embodiments, these randomized decisions define variables that can be modified to traverse the solution space of the objective function. The method in these embodiments then traverses the solution space of the objective function in order to find an optimal decomposition solution that minimizes the number of splits between portions of geometries in the design layout region that are assigned to different exposures. Some embodiments search the solution space by revisiting the randomized decisions to assign portions of geometries to particular exposures, and comparing the solutions. Some embodiments also revisit the order of the assignment of the geometries to the different exposures. FIG. 6 illustrates (in section 660) that critical portions 635 and 645 are colored black (i.e., assigned to a first exposure or mask layout), while critical portion 640 is colored white (i.e., assigned to a second exposure or mask layout).

The process 500 then outputs (at 550) the results of the decomposition. FIG. 6 illustrates a first exposure 670 that prints geometries 605 and 615, and a second exposure 680 that prints geometry 610.

Some embodiments perform a filtering operation prior to solving the objective function that in some cases reduces the complexity of the objective function. The filtering operation of some embodiments is another way of identifying split-free sets that can be assigned to the different exposures in such a way that each geometry in each split-free set is assigned as a whole to a particular exposure. In some of these embodiments, the geometries are not divided into critical portions and are instead decomposed as if each geometry is itself a critical portion. Geometries that can be assigned to the multiple exposures in this manner without any conflicts are assigned immediately and removed from the definition of the objective function.

In some embodiments, the design layout region is a hierarchical design layout region that includes one or more child sub-regions. In some embodiments, a child sub-region is an instance of a pre-defined set of geometries that may be used in multiple locations within the design layout region. Some embodiments pre-decompose each pre-defined set of geometries. In solving the objective function, the decomposition of a particular set of geometries is applied to each instance of that particular set. In some embodiments, the method does not revisit the particular decomposition of a child sub-region during the optimization process.

II. Overall Decomposition Flow

Figure 7:
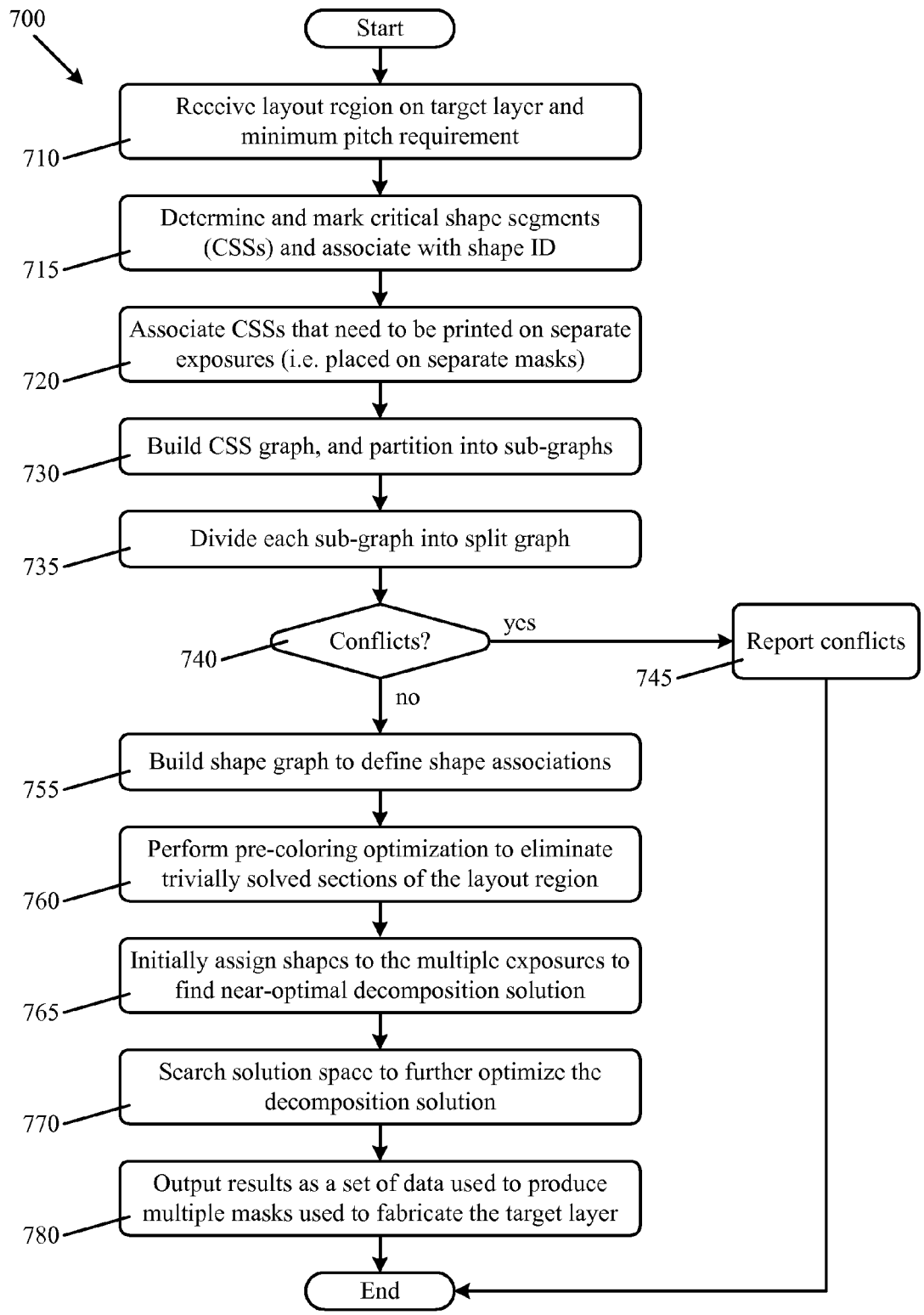
FIG. 7 conceptually illustrates a more detailed process for decomposing a design layout region of an IC into multiple exposures of some embodiments.
Figure 8:
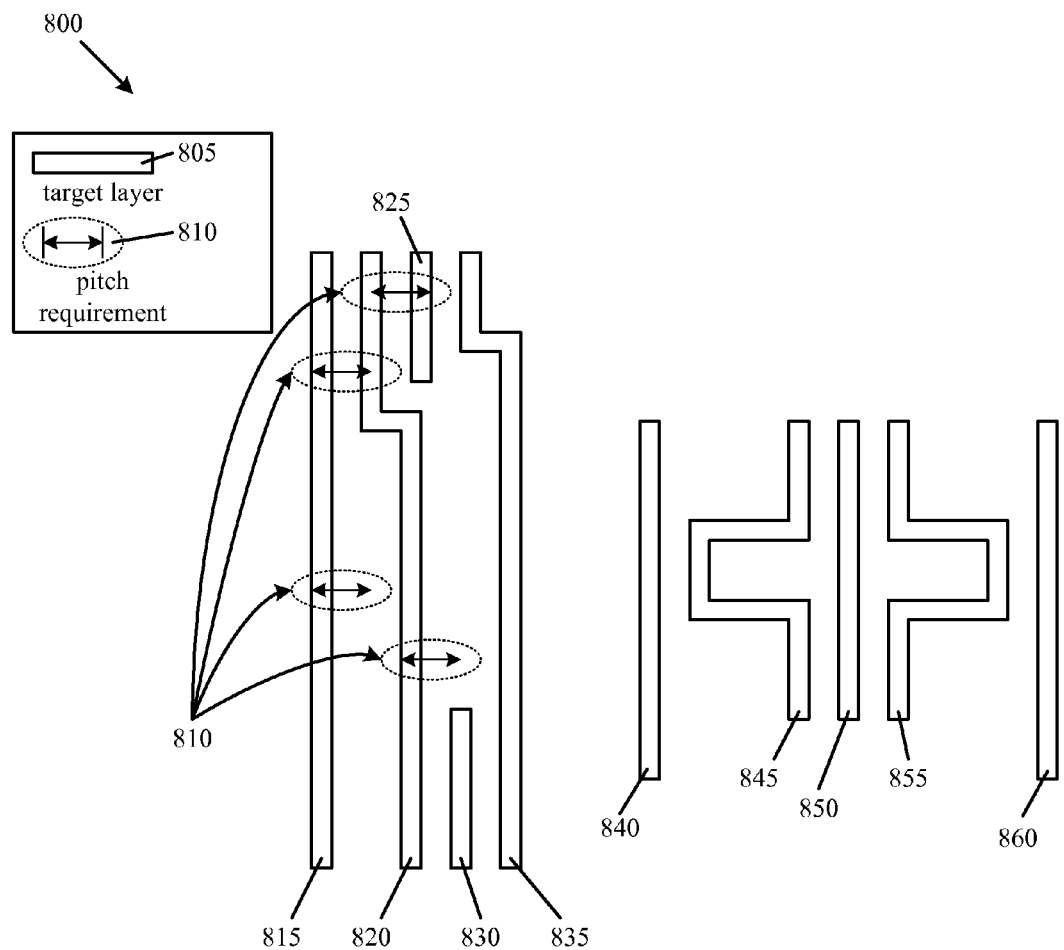
FIG. 8 illustrates a design layout region and pitch requirement of some embodiments.

FIG. 7 conceptually illustrates a more detailed process of some embodiments for decomposing a design layout region of an IC into multiple exposures. Process 700 begins at 710 when it receives the design layout region of the IC that is to be decomposed along with a pitch requirement for the exposures. In some embodiments, the pitch requirement is the minimum width of a shape plus the distance that two shapes can be from each other and still be printed in the same exposure, while in other embodiments, the pitch requirement is the minimum distance that two shapes can be from each other and still be printed in the same exposure. FIG. 8 illustrates a design layout region 800 and pitch requirement 810. The design layout region 800 includes ten shapes 815-860.

A. Rule-Checking

The process 700 next identifies (at 715) the critical shape segments ("CSSs") and associates each CSS with a shape ID that represents the geometry which includes the particular CSS. Critical shape segments, in some embodiments, are portions of a geometry that are within the pitch requirement of another geometry. As such, the CSS cannot be printed in the same exposure as the geometry to which it is too close.

Figure 9:
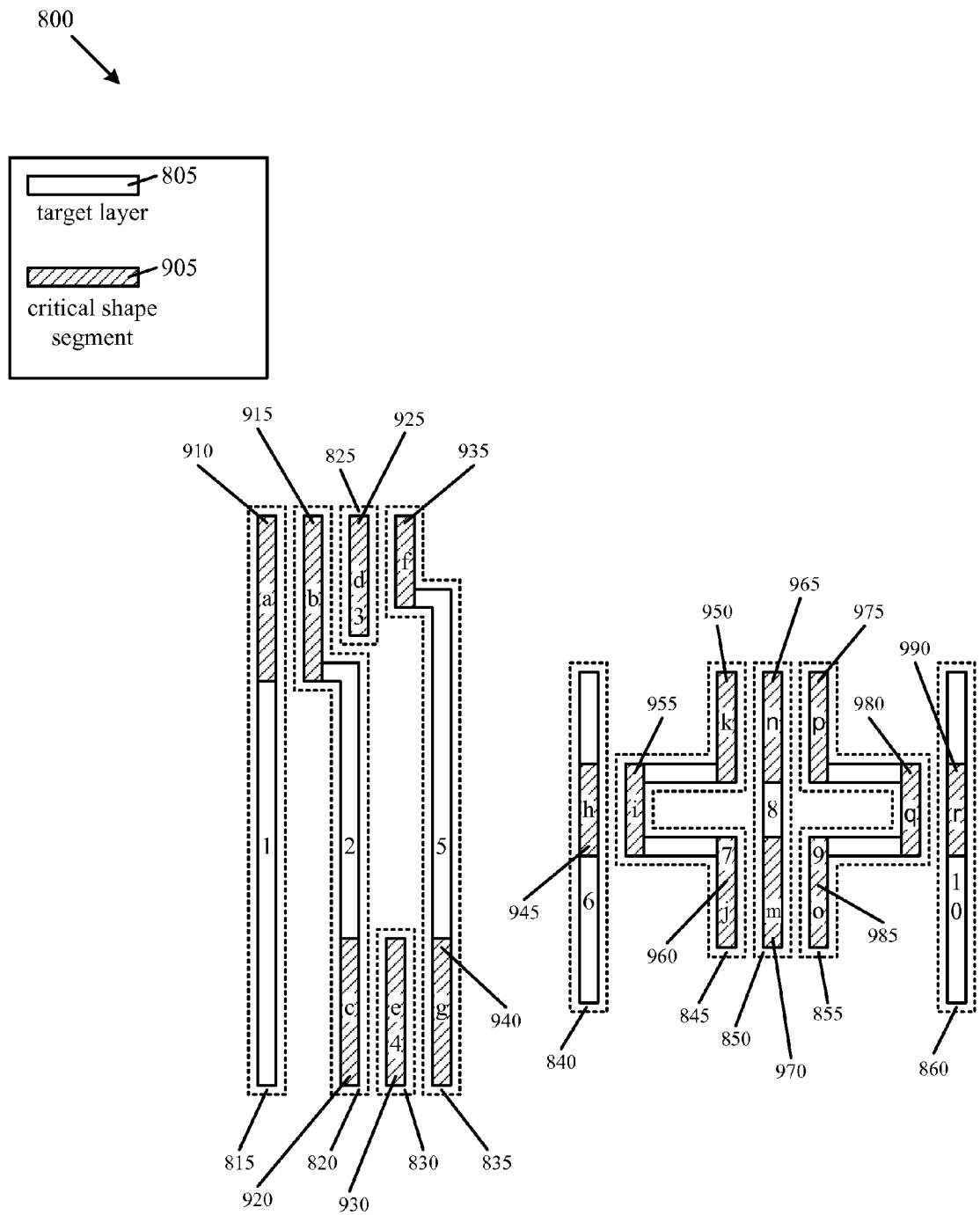
FIG. 9 illustrates the design layout region of FIG. 8 after each critical portion has been identified and marked.

FIG. 9 illustrates the shapes 815-860 of FIG. 8 after each CSS has been identified and marked (at 715) as a CSS 905. For instance, shape 815 includes a single CSS 910 that is within the minimum pitch requirement 810 of shape 820 (specifically, the section of shape 820 indicated by CSS 910), while the remainder of shape 815 is not within the minimum pitch requirement of any other shapes, and thus is not placed on the CSS layer 905. Likewise, the rest of the CSSs 910-990 are identified on the remaining shapes 820-860.

As shown in FIG. 9, in some cases a single shape (e.g., 820) may have multiple CSSs (e.g. 915 and 920). In other cases (not shown), a shape may have no CSSs (i.e. no portion of the shape on the target layer is within the minimum pitch requirement of any portion of another shape on the target layer).

In addition to identifying each CSS, the process 700 associates (at 715) the shape ID with each CSS, so that the CSS is linked to the shape that includes it. As shown in FIG. 9, for instance, shape 815 may be designated as shape "1" while CSS 910 may be designated as CSS "a." The process transfers (at 715) the shape ID to the CSS ID, such that CSS a becomes CSS a[1]. As another example, shape 820 may be designated as shape "2" while CSSs 915 and 920 are designated as CSSs "b" and "c," respectively. Consequently, the process will transfer the shape ID to the CSS IDs, so that CSSs b and c become b[2] and c[2]. The other CSSs are likewise associated with their respective shape IDs. Some embodiments utilize the CSS to shape mapping in later stages of the decomposition process (i.e., for finding optimal decomposition solutions).

Figure 10:
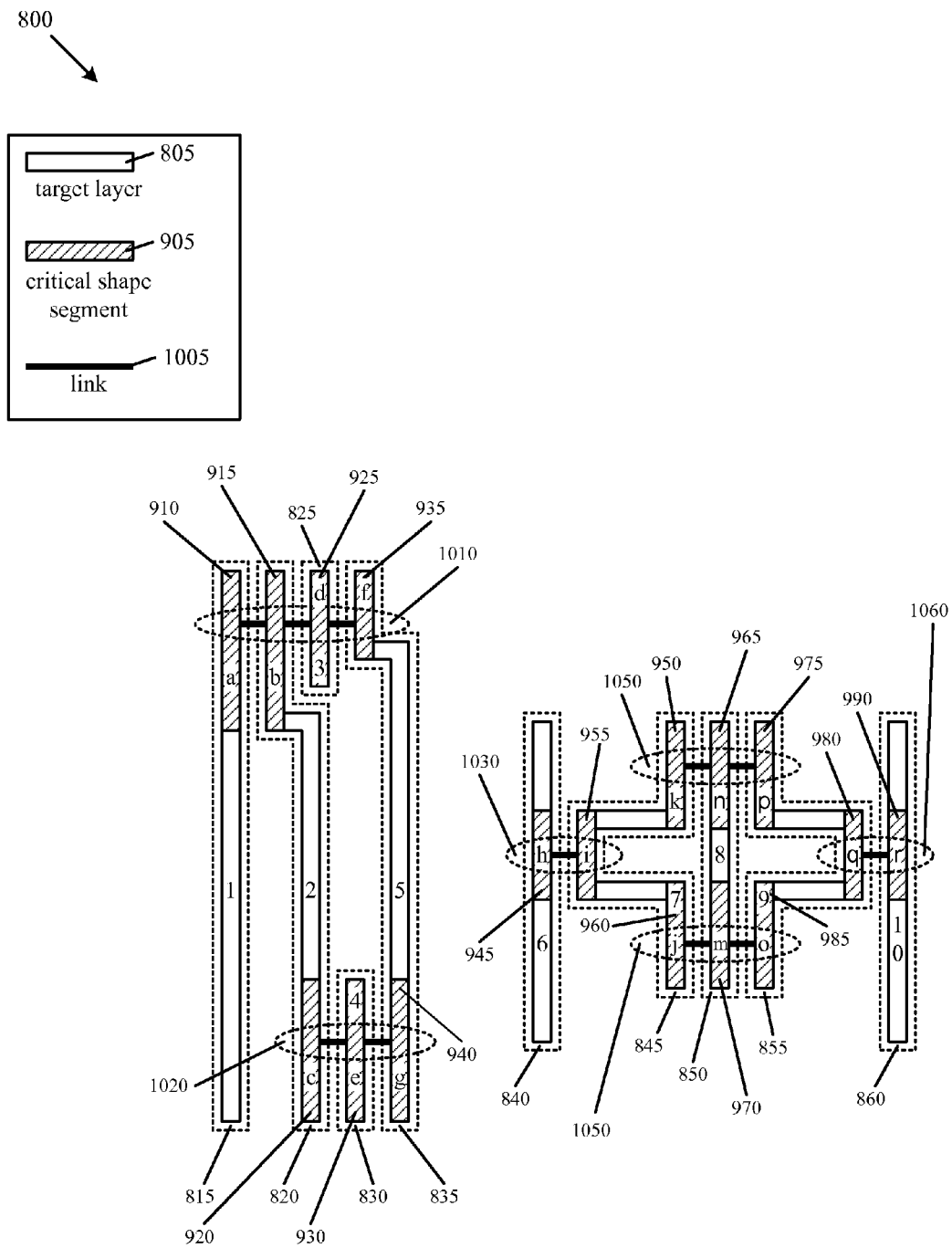
FIG. 10 illustrates the shapes and critical portions from FIGS. 8 and 9 after they have been associated through a link layer.

The process next associates (at 720) CSSs to other CSSs to indicate the associated CSSs will need to be printed during separate exposures during the decomposition process. FIG. 10 illustrates the shapes and CSSs from FIGS. 8 and 9 after they have been associated through a link layer 1005. The link layer is a virtual or conceptual layer that is not printed on any exposures or placed on any masks. Some embodiments do not use a link layer, and instead just use pairs of associated CSSs. As shown, one section 1010 of the link layer associates CSS 910 to CSS 915, CSS 915 to CSS 925, and CSS 925 to CSS 935. Some embodiments also treat as linked CSSs that are indirectly linked through a combination of the link layer and other CSSs (e.g. CSS 910 is associated with CSS 925 through two sections of the link layer and CSS 915). Likewise, the other sections 1020-1060 of the link layer associate the other CSSs 940-990.

B. Pre-decomposition

Figure 11:
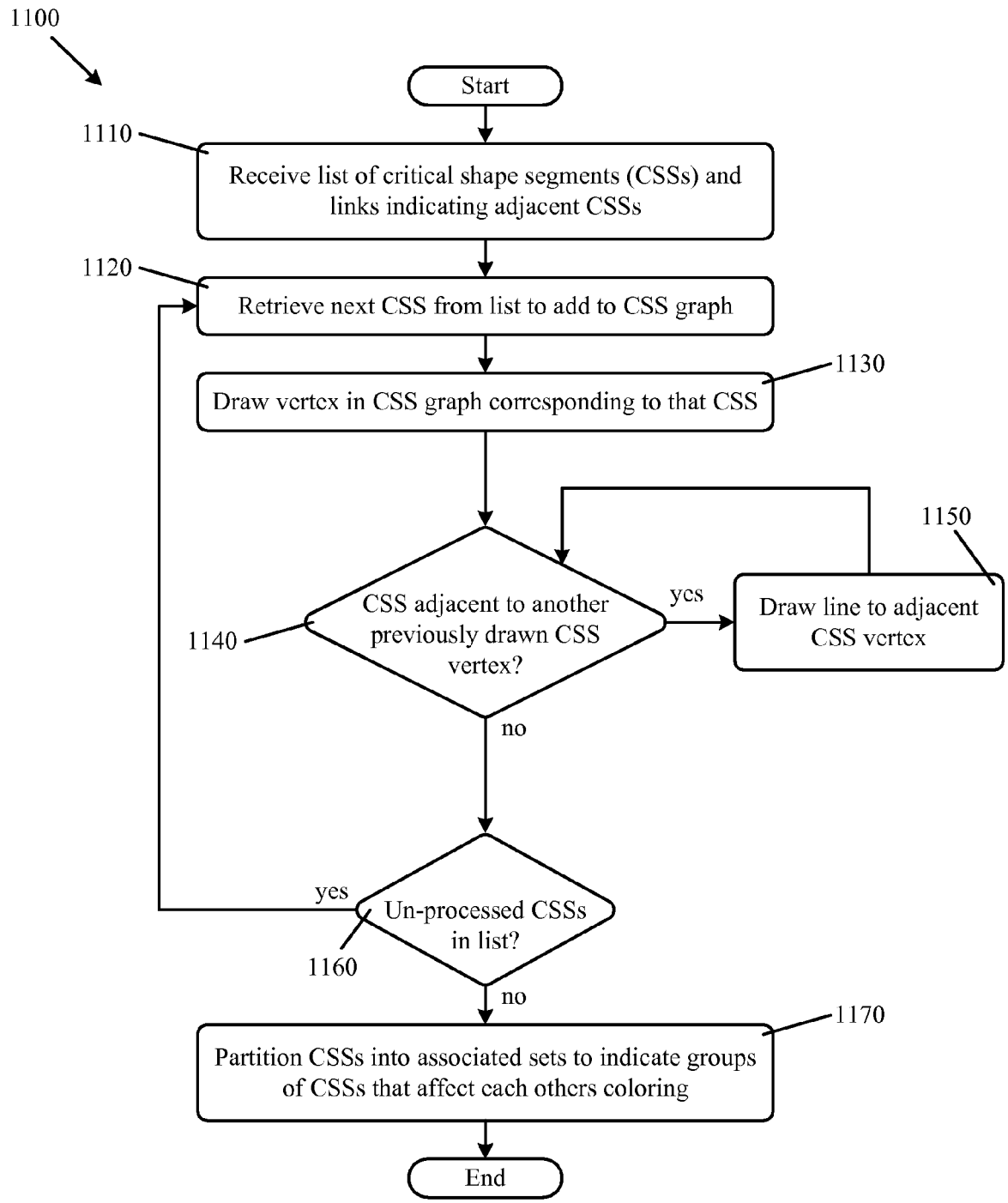
FIG. 11 illustrates a process for generating and partitioning a critical shape segment ("CSS") graph of some embodiments.

Process 700 continues (at 730) by building a CSS graph and partitioning the CSS graph into sub-graphs. Some embodiments use the sub-graphs to verify whether the design layout region can be decomposed into the desired number (e.g., two) of exposures. FIG. 11 conceptually illustrates a process 1100 of some embodiments for generating and partitioning a CSS graph.

Figure 12:
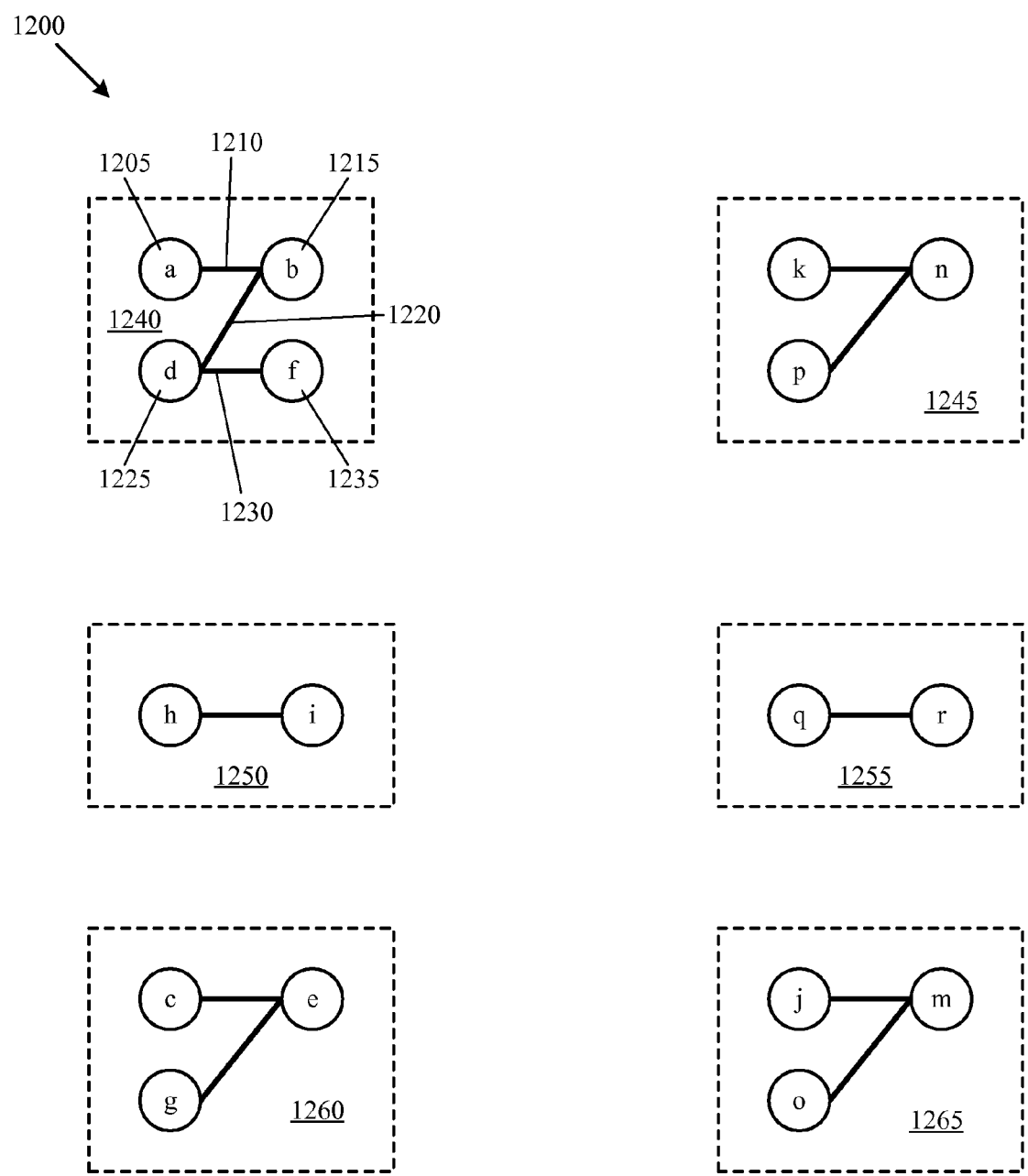
FIG. 12 illustrates the CSS graph drawn based on the example design layout region given above in reference to FIGS. 8-10.

FIG. 12 illustrates the CSS graph 1200 drawn based on the example design layout region given above in reference to FIGS. 8-10. Each CSS from the design layout region is a vertex in the CSS graph. Two vertices are "adjacent" if there is a link (in the link layer) that touches both of the corresponding CSSs (i.e. if there is an edge between the two nodes in the resulting CSS graph). The node names in CSS graph 1200 correspond to the CSSs from design layout region 800: in this example, the nodes are named "a" to "r" (omitting the letter "l"), with each node name corresponding to one of the CSSs 910-990.

As shown, the process 1100 receives (at 1110) a list of CSSs and the links between them. Some embodiments receive this information as a list of CSSs, and for each CSS, all CSSs that are adjacent to that CSS. Other embodiments receive a list of pairs of adjacent CSSs. Still other embodiments receive the information in other forms. The process retrieves (at 1120) a first CSS from the list and draws (at 1130) a node corresponding to that CSS. The first CSS in the example list is CSS 910, which is designated as node "a" and placed in the CSS graph as node 1205. Some embodiments will not necessarily start at the end of a series of linked CSSs (e.g., CSS 915 might be the first CSS retrieved from the list).

The process 1100 then determines (at 1140) whether the current CSS is adjacent (i.e., directly connected through the link layer) to any previously drawn CSS. Some embodiments traverse the list of CSSs to determine whether the current CSS is part of any pairs, whereas other embodiments have a list of all nodes adjacent to the current node. If there are other adjacent previously drawn CSS nodes, the process draws (at 1150) a line (or link) connecting the current CSS node to the previously drawn CSS node. Since the current CSS node is the first drawn node, there are no previously-drawn adjacent CSS nodes. Although CSS 905 is adjacent to CSS 915, no edge will be drawn the first time through because CSS 915 is not yet drawn into the sub-graph. This edge will be drawn later, once a node for CSS 915 is drawn.

If the current CSS node is adjacent to a previously drawn CSS node, then the process draws (at 1150) an edge between the adjacent nodes, and returns to 1140 to determine whether there are any more previously drawn nodes adjacent to the current node.

Once there are no more previously-drawn adjacent CSS nodes, the process 1100 determines (at 1160) whether there are any unprocessed CSSs in the list. If all CSSs have been processed, then the process 1100 proceeds to 1170. If there are more remaining CSSs (at 1160), the process returns to 1120 to retrieve the next CSS from the list, and adds a node to the graph for the CSS. This CSS is now the current CSS. The process 1100 then repeats operations 1130-1160 for the new current CSS.

In the example, after drawing node 1205, the process would return to select the next CSS (e.g., CSS 915) as the current CSS, draw the node 1215, and determine whether node 1215 is adjacent to any previously drawn nodes. Node 1215 is adjacent to nodes 1205 and 1225. If only node 1205 is already drawn, then only the edge between nodes 1205 and 1215 would be drawn at that time. Some embodiments do not necessarily take a continuous path through the CSSs, so after drawing node 1205, the next CSS selected might not be adjacent to CSS 905 (e.g., CSS 970). Eventually, after processing all of the CSSs, all the nodes of the CSS graph would be drawn, as would all edges indicating the adjacent CSSs.

When all CSSs have been added to the CSS graph 1200, the process 1100 partitions (at 1170) the associated CSSs into sub-graphs by identifying sets of linked CSS nodes as sub-graphs. In other words, each sub-graph includes a set of CSS nodes that are directly or indirectly linked to each other. The CSS nodes in a first sub-graph may not be linked to any CSS nodes in another sub-graph. Thus, in the example shown in FIG. 12, the CSS graph 1200 is partitioned into six sub-graphs 1200.

While the process 1100 illustrates one example of a process to generate a CSS graph, one of ordinary skill in the art will recognize that other processes may be used to generate a CSS graph. For example, some embodiments may initially order the CSSs, making the generation of the CSS graph less computationally intensive. Furthermore, one of ordinary skill will recognize that the CSS graph generation (and partitioning of the CSS graph into sub-graphs) may occur at different times within the overall decomposition process.

The decomposition process 700 next divides (at 735) the sub-graphs into "split" or bipartite graphs. A valid split graph assigns each node to one of two sets. The two sets are disjoint (i.e., no node may be a member of both sets), and each set can be mapped to a decomposed exposure with no conflict (i.e., two nodes within a set may not be connected by an edge). The successful division of a sub-graph into a split graph indicates that the design layout region corresponding to the sub-graph may be successfully decomposed into two exposures while satisfying the set of manufacturing constraints.

Figure 13:
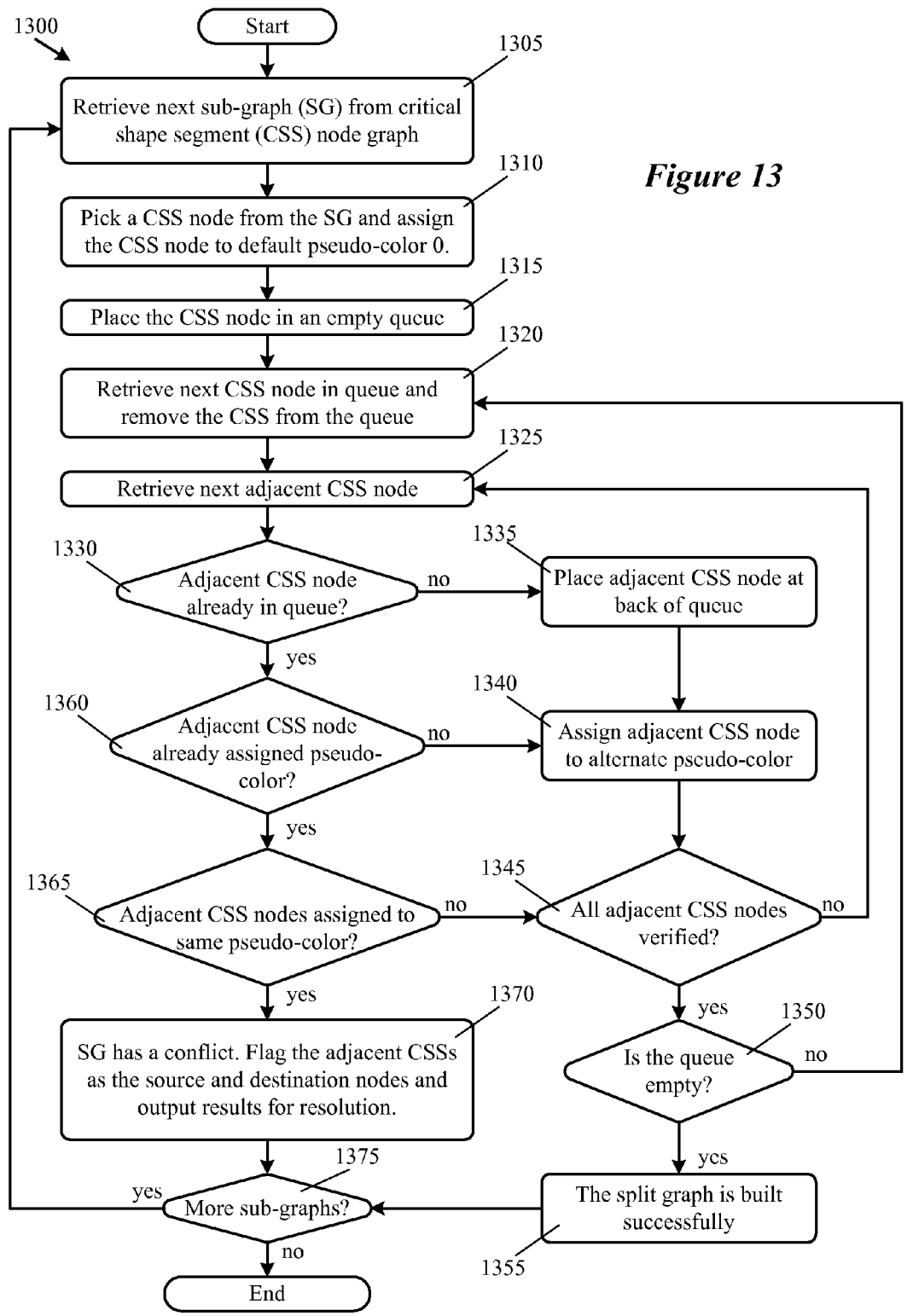
FIG. 13 illustrates the process used to divide the sub-graphs drawn using the CSS graph drawing process of FIG. 11 into split graphs of some embodiments.
Figure 14:
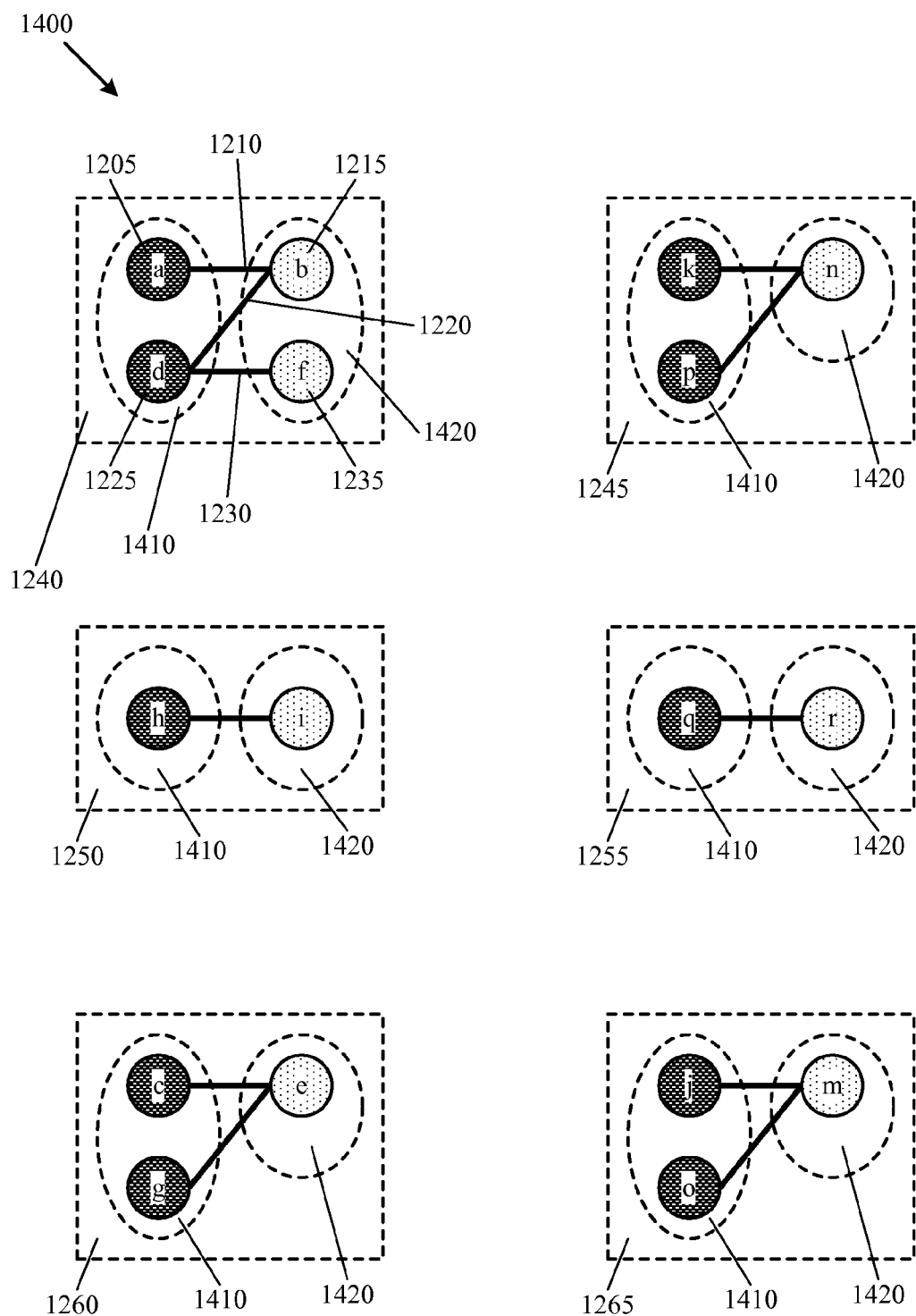
FIG. 14 illustrates the resulting split graphs based on the sub-graphs of FIG. 12 of some embodiments.

FIG. 13 conceptually illustrates a process 1300 of some embodiments used to divide the sub-graphs into split graphs. In some embodiments, the sub-graphs are drawn using the CSS graph drawing process 1100. The process 1300 starts at 1305 by retrieving a sub-graph. FIG. 14 illustrates the sub-graphs from FIG. 12, including sub-graph 1240. The sub-graph 1240 includes CSS nodes 1205, 1215, 1225, and 1235 representing four CSSs 910, 915, 925, and 935.

The process then picks (at 1310) a CSS node at random from the received sub-graph and assigns the CSS to pseudo-color 0, or "black" (i.e., one of the multiple exposures that will be used to print the design layout region). Referring to sub-graph 1240, the process might begin by selecting node 1205 and assigning it to pseudo-color 0.

Next, the process places (at 1315) the selected CSS node in an empty queue (i.e., a first-in-first-out data structure). The process then retrieves (at 1320) the next CSS node from the queue and removes the CSS node 1205 from the queue. The initial time through operation 1320, the process will queue will only have the CSS node selected at 1310.

The process 1300 then determines (at 1325) a second CSS node that is adjacent to the CSS node retrieved at 1320. A second node is adjacent to the retrieved node if there is an edge that connects the two nodes. In the example, node 1205 is the retrieved node, and node 1215 is the only node adjacent to node 1205. Therefore, node 1215 would be the next adjacent CSS node. In some embodiments, if more than one node is adjacent to the node retrieved at 1320, the next adjacent node is determined randomly from among the multiple adjacent nodes. Some embodiments define a list, for each node, of all adjacent nodes, and use this list at 1325. Because sub-graphs are only drawn for linked CSSs, there is always at least one CSS adjacent to every other CSS.

The process 1300 then determines (at 1330) whether the second (adjacent) CSS node is or has already been in the queue. If not, the process places (at 1335) the CSS node at the back of the queue. The process then assigns (at 1340) the adjacent CSS node to the alternate pseudo-color as compared to the pseudo-color of the retrieved node (i.e., if the retrieved node has a pseudo-color of 0, then the adjacent node is assigned a pseudo-color of 1). Referring to the example in FIG. 14, node 1215 would not have yet been placed in the queue, so it is placed in the queue and assigned a pseudo-color of 1 (node 1205 having a pseudo-color of 0).

After placing the current adjacent node in the queue and assigning it a pseudo-color, the process 1300 determines (at 1345) whether all nodes adjacent to the retrieved nodes have been verified. If more nodes adjacent to the retrieved node exist, the process returns to 1325 to determine the next node that is adjacent to the node retrieved at 1320. If there are no more adjacent nodes, the process 1300 determines (at 1350) whether the queue is empty. If the process determines that the queue is empty, then the split graph has been successfully built for the present sub-graph and the process proceeds to 1375. If the queue is not empty, then the process returns to 1320 to retrieve the next (i.e., the first in) node in the queue, and remove this node from the queue.

Referring again to sub-graph 1240, after assigning node 1215 a pseudo-color of 1, the process would determine that there are no more nodes adjacent to 1205, and would then determine that the queue is not empty (because 1215 is in the queue). The process would then retrieve 1215 and remove it from the queue.

If, at 1330, the adjacent node has already been in the queue, the process proceeds to 1360 to determine whether the adjacent node was already assigned a pseudo-color. If the adjacent node has not been assigned a pseudo-color, the process proceeds to 1340 to assign it the opposite pseudo-color as the current retrieved node.

If, on the other hand, the adjacent node has been assigned a pseudo-color, the method determines whether the adjacent node has been assigned the same pseudo-color as the current retrieved node. If the pseudo-colors are different, the process 1300 proceeds to 1345 to determine whether there are any more nodes adjacent to the current retrieved node.

Referring again to sub-graph 1240, when node 1205 is the retrieved node, 1205 would be one of the adjacent nodes, and the process would determine that node 1205 has already been in the queue, has already been assigned a pseudo-color (0), and that the pseudo-colors for nodes 1215 and 1205 are different. Node 1225 is also adjacent to 1215, so node 1225 would be placed in the queue and assigned pseudo-color 0 (the opposite color of node 1215).

If, at 1365, the pseudo-colors are the same for the two nodes, then the process 1300 determines (at 1370) that the sub-graph has a conflict, flags the two nodes causing the conflict, outputs the results, and proceeds to 1375. At 1375, the process determines (at 1375) whether there are any more sub-graphs to process. If so, the process returns to 1305 to retrieve the next sub-graph and repeat operations 1305-1375 until all sub-graphs have been processed, at which point the process ends. Accordingly, after sub-graph 1240 the process would select one of the remaining sub-graphs 1245-1260 to process. FIG. 14 illustrates the result of dividing each of these sub-graphs into split graphs. In the example, none of the sub-graphs have conflicts, and accordingly, the design layout region can be successfully decomposed into multiple exposures.

While the process 1300 illustrates one example of a process to generate a split graph from a CSS graph, one of ordinary skill in the art will recognize that other processes may be used to generate a split graph. For example, some embodiments generate the split graphs at the same time as the CSS graph, rather than using an already-generated CSS graph. Furthermore, one of ordinary skill will recognize that the split graph generation may occur at different times within the overall decomposition process.

Figure 15:
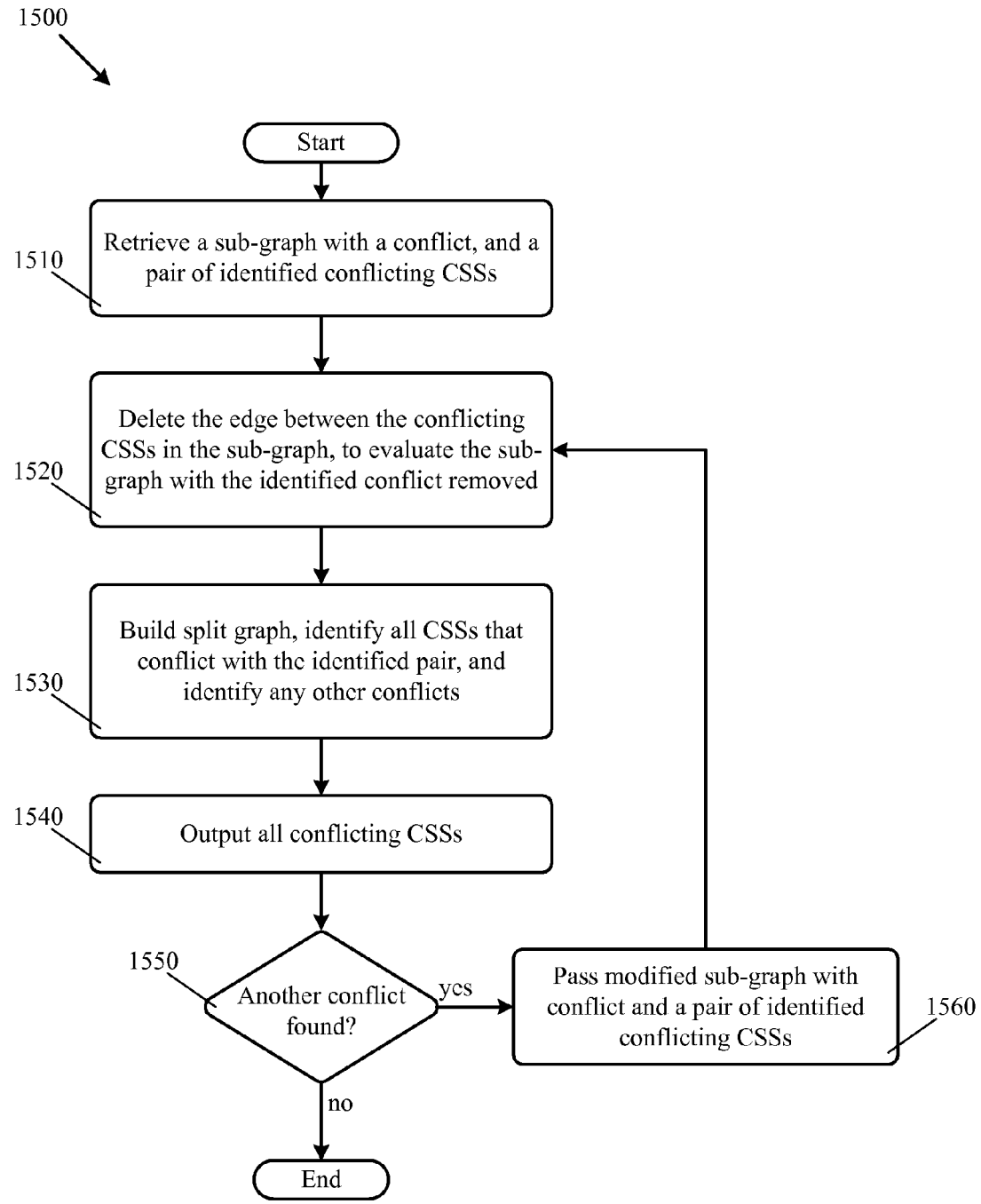
FIG. 15 illustrates the process used to identify all conflicting CSSs and to determine whether there are other conflicts in the sub-graph.

In some embodiments, conflicts are first detected when building the split graphs using process 1300. If two adjacent CSS nodes are determined (at 1365) to have the same pseudo-color, the sub-graph has a conflict and the conflicting CSS nodes and the conflicts are reported (at 1370). FIG. 15 illustrates the process 1500 of some embodiments used to identify all conflicting CSSs within a particular sub-graph and to determine whether there are other conflicts in the sub-graph (i.e. conflicts other than the reported conflict). Detecting all of the conflicts rather than just detecting which sub-graphs have a conflict enables all of the conflicts to be reported, and then fixed, at once so as to avoid repeated iterations of detecting conflicts, attempting to remove all conflicts, and then detecting more conflicts. This can substantially cut down on the amount of time required to arrive at a successful decomposition of a design layout region into multiple exposures.

Figure 16:
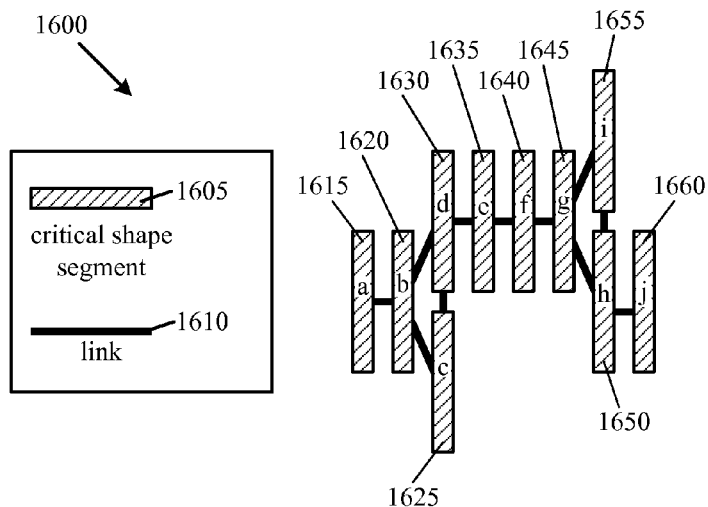
FIG. 16 illustrates a design layout region that includes multiple conflicts.
Figure 17:
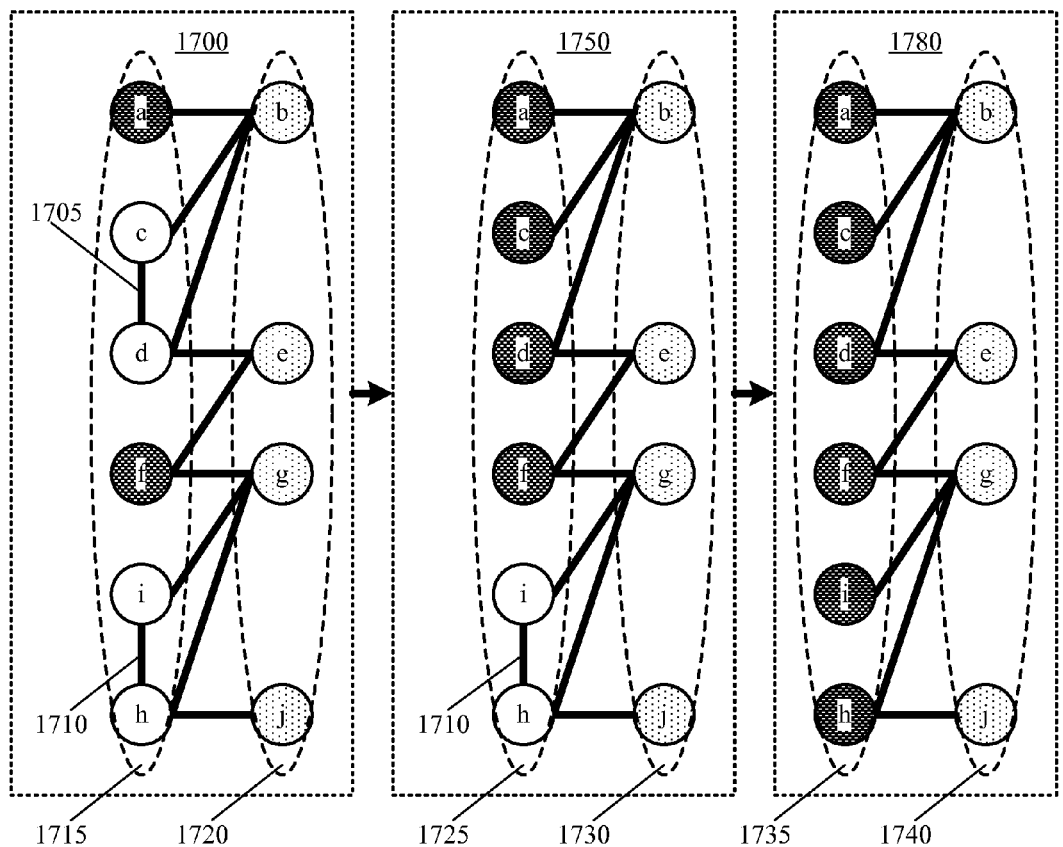
FIG. 17 illustrates the sub-graph corresponding to the design layout region of FIG. 16, as well as the modified sub-graphs drawn and used during the conflict detection process of FIG. 15 of some embodiments.

FIG. 16 illustrates an example of a design layout region 1600 that includes multiple conflicts. As shown, the design layout region 1600 is composed completely of the CSS layer 1605 and the link layer 1610. The example design layout region 1600 includes ten shapes 1615-1660. Each of the shapes 1615-1660 is also a single CSS, corresponding to a single node in a CSS graph. FIG. 17 illustrates the sub-graph 1700 corresponding to the design layout region 1600, as well as the modified sub-graphs 1750 and 1780 drawn and used during the conflict detection process 1500. The sub-graph (which is also a complete CSS graph for the design layout region 1600) includes ten nodes "a" to "j," which correspond to the ten shapes 1615-1660.

The process 1500 begins at 1510 when it receives a sub-graph with a conflict, and the pair of conflicting CSS nodes identified by process 1300. In the example, the process would receive sub-graph 1700 with the conflict (indicated by link 1705 linking two nodes of the same pseudo-color) and the two conflicted nodes (nodes "c" and "d", corresponding to CSSs 1625 and 1630). The process 1500 then deletes (at 1520) the edge (or link) between the conflicted nodes. Thus, in the example, the edge 1705 between nodes "c" and "d" is deleted.

The process then traverses (at 1530) the modified sub-graph to attempt to successfully build a split graph. Some embodiments use the process 1300 to attempt to draw a split graph from the modified sub-graph. Other embodiments use other processes to draw the new split graph.

As a by-product of building the split graph, some embodiments also identify (at 1530) the shortest path between the conflicting CSS nodes that travels over an odd number of edges. The path between the two CSS nodes having an even number of edges cannot be the source of the conflict in some embodiments. In this example, the shortest such path goes from node "c," to node "b," and then to node "d." These nodes represent the conflicting CSSs that will need to be resolved in the layout of the target layer before the decomposition of the target layer may be performed successfully. If the process were to not determine all of the nodes causing the conflict, then successful resolution of the layout would be more difficult. At 1540, the process outputs all of the conflicting CSSs.

Next, the process 1500 determines (at 1550) whether any other conflicts were identified while building the split graph from the modified sub-graph. If the process 1500 determines (at 1550) that no other conflicts were identified, the process ends. If other conflicts are identified (at 1550), the newly identified conflicting CSSs are passed with the modified sub-graph to 1520 and the process proceeds to the edge between the newly identified CSSs and repeat until no more conflicts are found.

Referring to the example in FIGS. 16 and 17, after deleting the edge between nodes "c" and "d", the process would next detect a conflict between nodes "i" and "h". Deleting edge 1710 would indicate that nodes "i", "g", and "h" are the cause of the conflict. In all, process 1500, applied to this example, would output nodes 1620, 1625, 1630, 1645, 1650, and 1655 as conflicted for design layout region 1600.

While the process 1500 illustrates one example of a process to find all of the conflicts within a sub-graph, one of ordinary skill in the art will recognize that other processes may be used to do so. Furthermore, one of ordinary skill will recognize that the conflict detection may occur at different times within the overall decomposition process.

Building the split graphs and searching for conflicts allows for a determination of whether a valid solution exists for the decomposition problem for the design layout region. If there are any conflicts detected, then the design layout region cannot be decomposed within the manufacturing constraints. If, however, no conflicts are detected, then solutions to the decomposition problem exist and so the process can search for a decomposition solution that optimizes the objective function.

C. Identifying an Optimized Decomposition Solution

After determining that there are no conflicts, some embodiments then search for an optimal decomposition solution. In some embodiments, an optimal decomposition solution is a solution that optimizes the objective function. The objective function F of some embodiments is:

$$F = \Sigma f(s),$$

in which $f(s)$ is the number of locations within a particular shape s where the shape s is split between two exposures, and the sum is a sum over all shapes in the design layout region. As such, an optimal solution is a solution that minimizes the number of cuts, or splits in the solution. In other words, an optimal solution for a layout region minimizes the number of locations in the layout region where a shape is broken between two exposures. Some embodiments, on the other hand, only count the number of shapes that are split between multiple exposures.

As each split graph provides two possible decomposition solutions (each split graph can be assigned to exposures in two different ways), in some embodiments if a design layout region has n split graphs, then there are $2^n$ valid decomposition solutions (i.e., the size of the solution space of the objective function is $2^n$). Accordingly, the entire solution space cannot be traversed in polynomial time to find a global optimal solution. As such, some embodiments use an optimization process that traverses the solution space in an intelligent way and runs in polynomial time. As such, some embodiments may not reach the global optimal solution, but instead make a tradeoff that saves time at the expense of possibly increasing the cost of the solution.

i. Generating a Shape Graph

In order to find an optimized decomposition solution, some embodiments use shape graphs in addition to the other graphs described above. Returning to process 700, after building (at 730) the sub-graphs, dividing (735) the sub-graphs into split graphs, and detecting (at 740) and reporting (at 745) conflicts, the decomposition process 700 builds (at 755) a shape graph to represent the associations between shapes. In some embodiments, the shape graphs are used for the assignment of geometries and portions of geometries to the different multiple exposures in the process of searching for an optimal decomposition solution.

Figure 18:
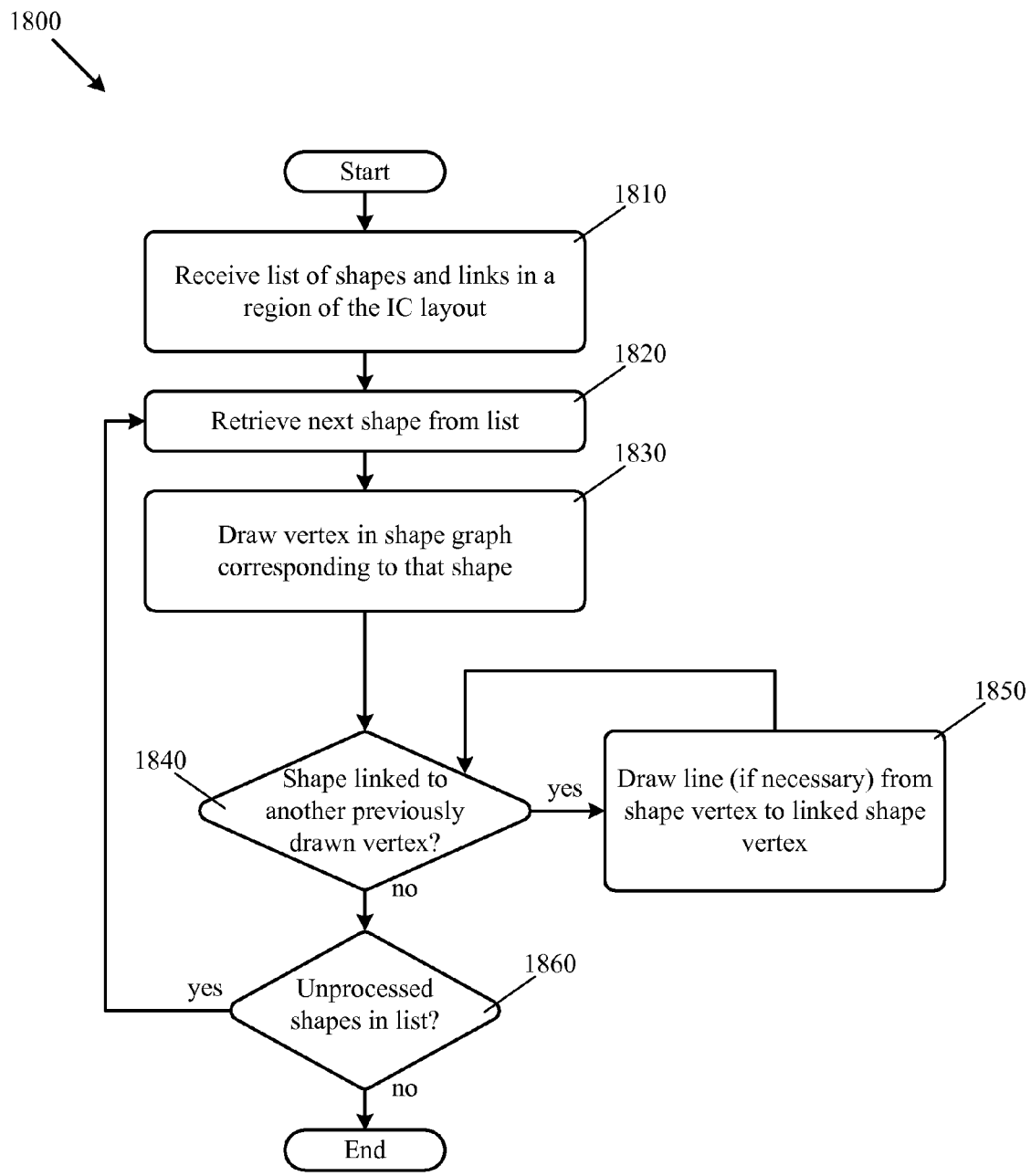
FIG. 18 illustrates the process for drawing a shape graph of some embodiments.

FIG. 18 conceptually illustrates the process 1800 of some embodiments for drawing a shape graph. The process begins at 1810 by receiving a list of shapes and their links for a particular design layout region. Design layout region 800 of FIG. 10 is an example of a design layout region that would be received by process 1800. In some embodiments, CSSs and links within the design layout region have already been identified (e.g., by a prior process or sub-process). The list is ordered such that linked shapes are near each other in some embodiments, whereas in other embodiments the list is more random. Some embodiments provide the list as pairs of shapes that are linked, whereas other embodiments provide the list as each shape with all of its adjacent shapes (in such embodiments, duplicate links would be provided as the entry for a first shape would include a second adjacent shape, and the entry for the second shape would include the first shape as an adjacent shape).

Figure 19:
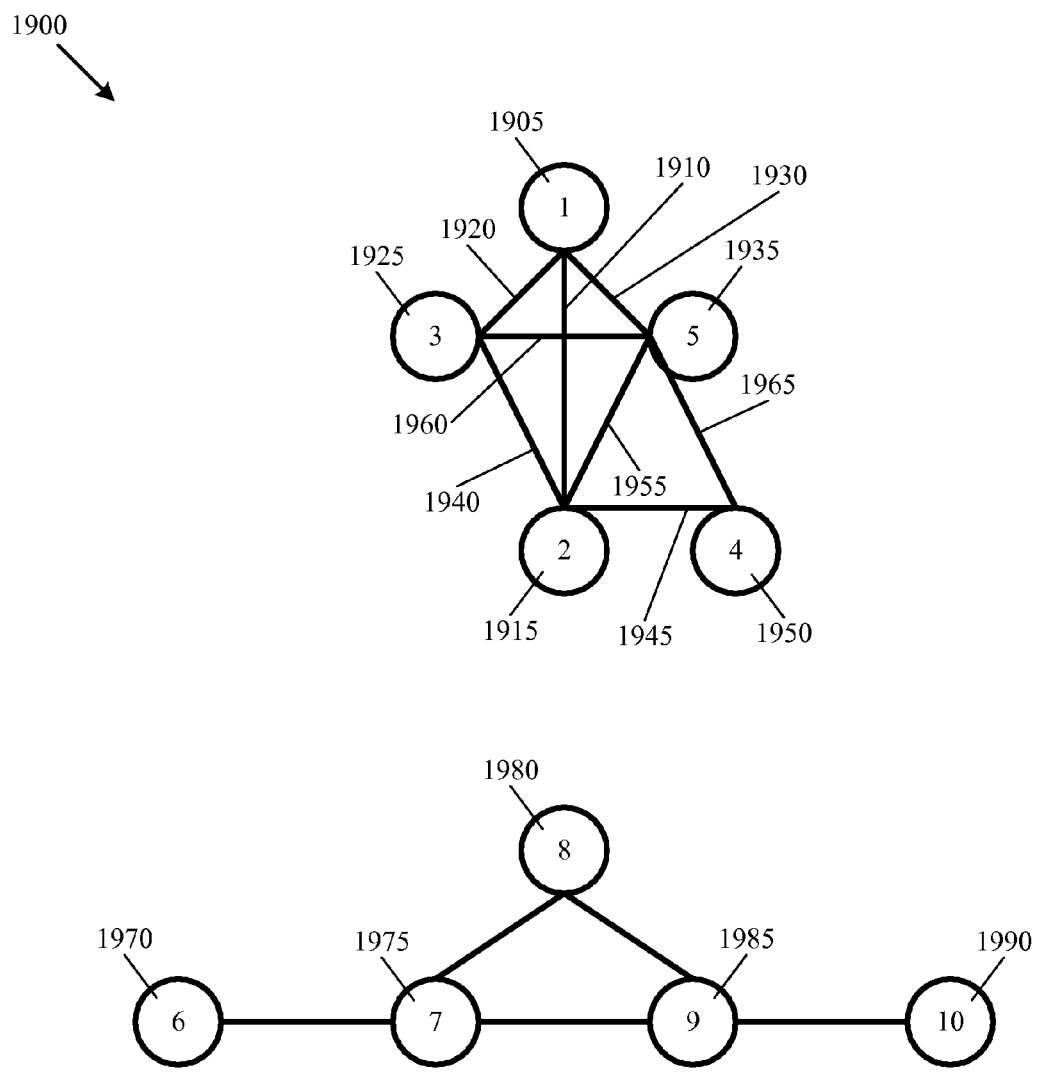
FIG. 19 illustrates the resulting shape graph for the design layout region of FIG. 10 of some embodiments.

The process 1800 then retrieves (at 1820) the first shape in the list. The process draws (at 1830) a node in the shape graph corresponding to the shape retrieved (at 1820) above. FIG. 19 illustrates a shape graph 1900 for the region 800. Taking the first shape retrieved as shape 815 (this would not necessarily be the case, as shape 815 might not be the first shape in the list), node 1905 (node "1") would be drawn corresponding to shape 815.

Next, the process 1800 determines (at 1840) if the retrieved shape is linked to another previously-drawn shape. For the purposes of some embodiments, two shapes are linked if they either include adjacent CSSs or can be linked by a series of adjacent CSSs. For example, referring to FIG. 10, shapes 815 and 835 are linked through CSSs 910, 915, 925, and 935.

The first shape drawn is of course not linked to any previously-drawn shapes, as no other shapes are drawn. If there are no links between the retrieved shape and the previously-drawn shapes, then the process 1800 proceeds to 1860 to determine whether there are any unprocessed shapes in the list (i.e., whether there are any more shapes to add to the shape graph). If there are remaining unprocessed shapes, the process 1800 returns to 1820 to retrieve the next shape from the list.

However, if the retrieved shape is not the first shape and there is a link between the retrieved shape and the previously-drawn shape, the process 1800 draws an edge (i.e., a line) between the nodes corresponding to the retrieved shape and the previously-drawn linked shape. In reference to the example, if after drawing node 1905, the next retrieved shape is shape 820 (drawn as node 1915), then because CSS 910 is linked to CSS 915, edge 1910 is drawn in the shape graph.

The process 1800 continues in this manner until it has drawn all the nodes and links representing the shapes and their associations. Once the process 1800 determines (at 1860) that all of the shapes have been processed, the process ends. FIG. 19 illustrates the completed shape graph for design layout region 800, illustrating the connections between the ten shapes 815-860 in the design layout region.

While the process 1800 illustrates one example of a process for generating a shape graph, one of ordinary skill in the art will recognize that other processes may be used for shape graph generation. Furthermore, one of ordinary skill will recognize that the shape graph generation may occur at different times within the overall decomposition process. For example, some embodiments generate shape graphs at the same time as the node graphs.

ii. Pre-coloring Optimization

Figure 20:
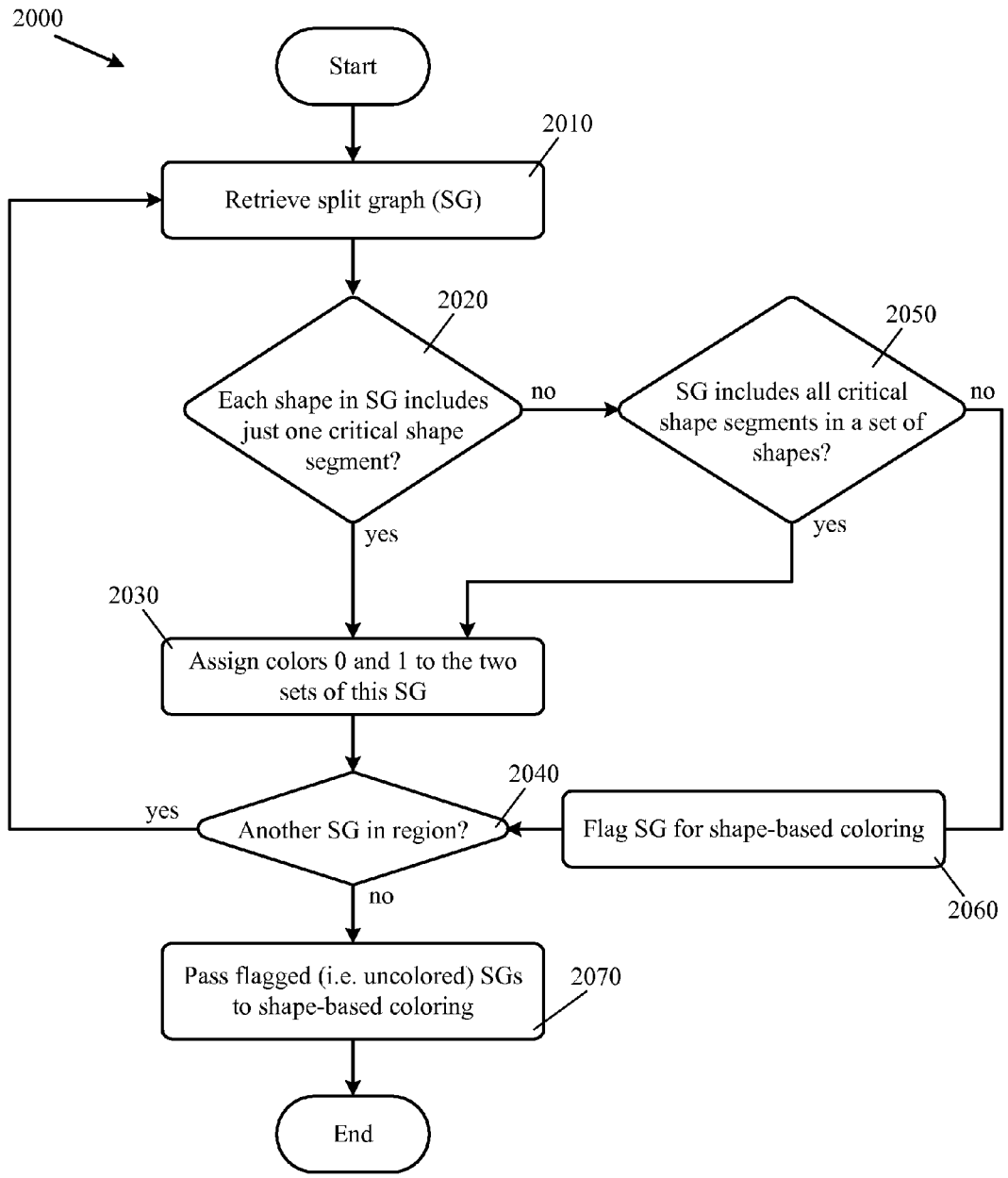
FIG. 20 illustrates the process of pre-coloring optimization of some embodiments.

The decomposition process 700 then performs (at 760) pre-coloring optimization to remove sub-regions from the definition of the objective function and assign them immediately to the multiple exposures. Doing so enables the objective function to be solved and optimized with the use of fewer computational resources. FIG. 20 illustrates a process 2000 of some embodiments for performing pre-coloring optimization.

The pre-coloring optimization process 2000 begins at 2010 when it retrieves a split graph from the current design layout region. The split graph includes a set of nodes that correspond to CSSs, each of which is a portion of a shape. The process then determines (at 2020) whether each CSS that has a node in the split graph is the only CSS in its corresponding shape. In other words, the process determines whether each shape that has a node in the split graph includes no CSSs other than the CSS corresponding to that node. If the process determines that each CSS that has a node in the split graph is the only node in its shape, then the process assigns (at 2030) the two sets of the split graph to the two exposures. These shapes then need not be used in the definition of the objective function, because there is a simple, perfect solution for the set of shapes that includes no split geometries.

Figure 21:
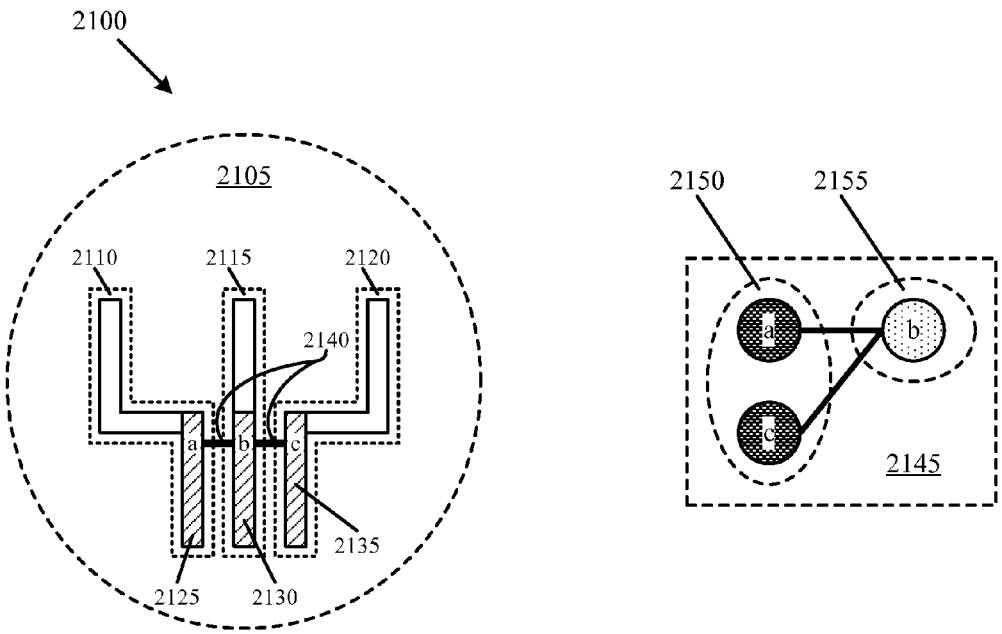
FIG. 21 illustrates a first example of the pre-coloring optimization routine of FIG. 20 of some embodiments.
Figure 22:
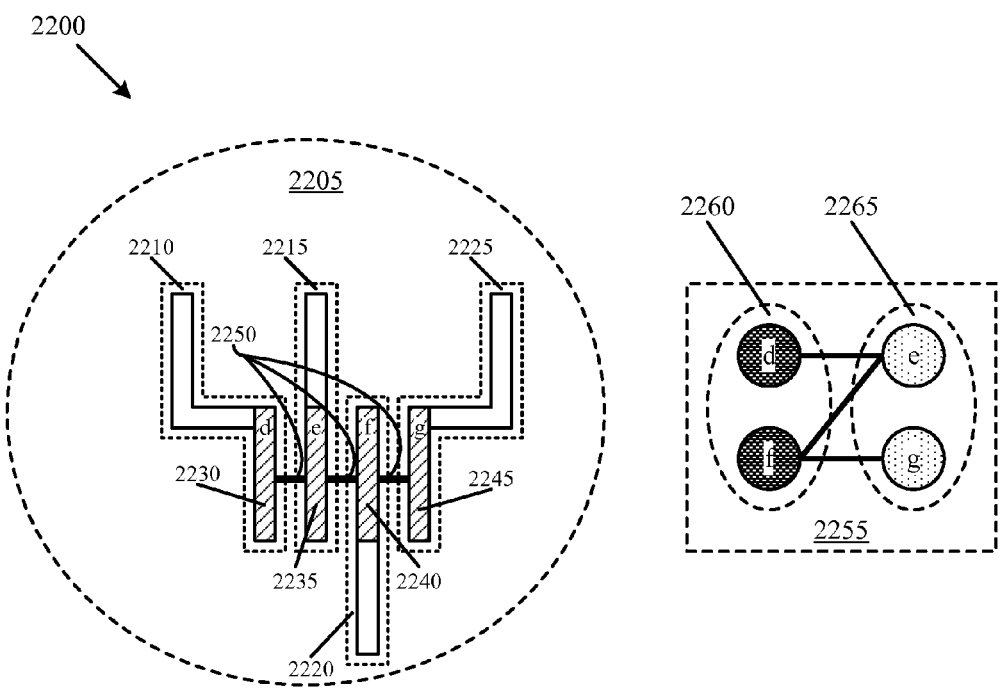
FIG. 22 illustrates a second example of the pre-coloring optimization routine of FIG. 20 of some embodiments.

FIGS. 21 and 22 illustrate examples of split graphs 2145 and 2255 in which each node corresponds to a CSS that is the only CSS for its shape. Design layout region 2105 (the design layout region for which 2145 is the split graph) includes three shapes 2110-2120, each of which have one CSS (2125-2135). The three CSSs are linked (by links 2140), so they are all represented in one split graph. As all nodes in the split graph correspond to nodes that are the only nodes within their respective shapes, the CSSs represented in the split graph can be assigned immediately to the two exposures. Split graph 2145 illustrates that set 2150, including nodes corresponding to 2125 and 2135, are assigned to one exposure (black), while set 2145 is assigned to the other exposure (white). Split graph 2255 of FIG. 22 is a second example of a split graph in which each node corresponds to a CSS that is the only CSS for its shape.

If, however, the process determines (at 2020) that each CSS that has a node in the split graph is not the only CSS in its corresponding shape, the process proceeds to 2050. At 2050, the process determines whether the split graph includes all CSSs in a particular set of shapes. In other words, for the set of shapes represented in the split graph, the process determines whether there are any CSSs not represented in the split graph. If the process determines that the split graph includes all CSSs in a particular set of shapes, then the process assigns (at 2030) the two sets of the split graph to the two exposures. These shapes then need not be used in the definition of the objective function, because there is a simple, perfect solution for the set of shapes that includes no split geometries.

Figure 23:
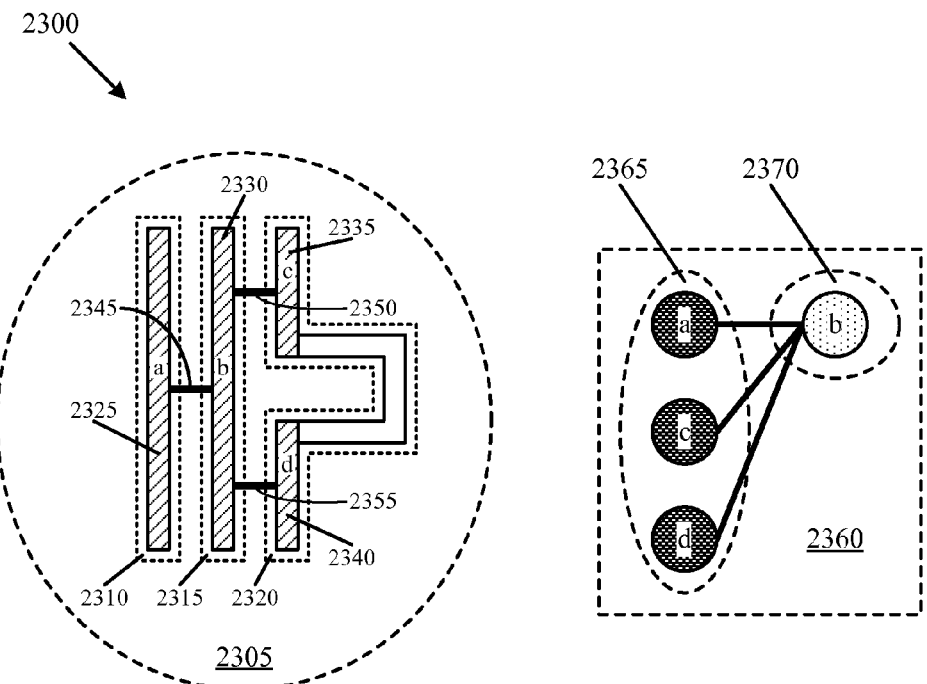
FIG. 23 illustrates a third example of the pre-coloring optimization routine of FIG. 20 of some embodiments.

FIG. 23 illustrates an example design layout region for which the split graph includes all CSSs in the set of shapes 2305. A solution in which shapes 2310 and 2320 (set 2365 in split graph 2360) are assigned to a first exposure (black) and shape 2315 (set 2370 in split graph 2360) are assigned to a second exposure (white) is therefore available, and the region 2305 can be removed from the definition of the objective function.

Figure 24:
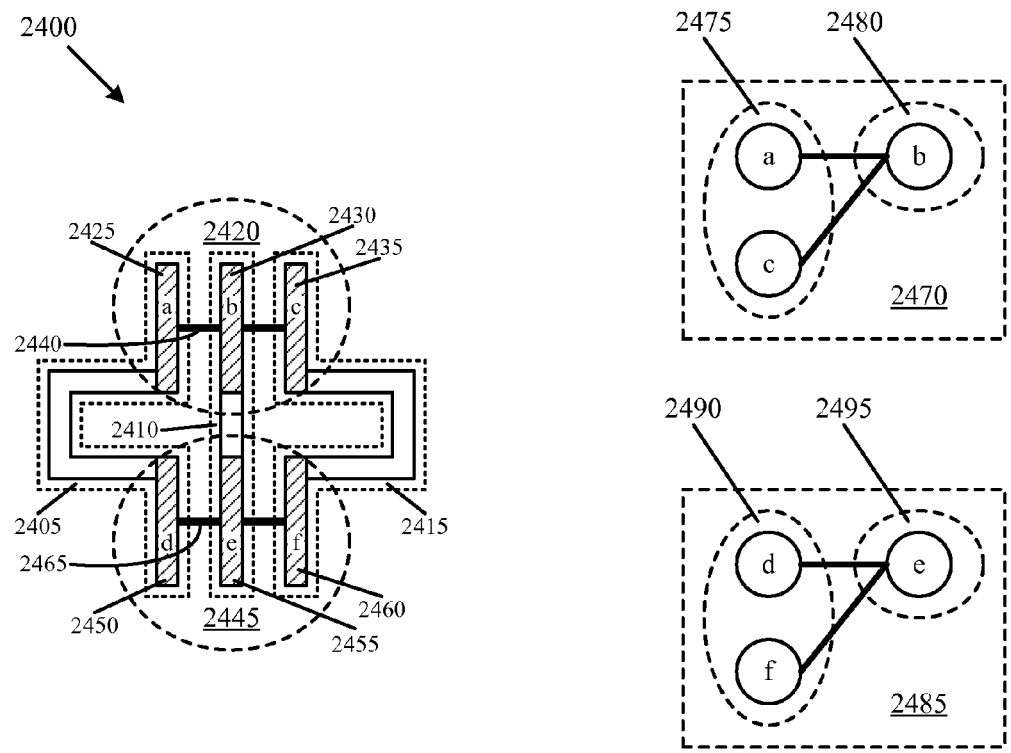
FIG. 24 illustrates a fourth example of the pre-coloring optimization routine FIG. 20 of some embodiments.

FIG. 24, on the other hand, illustrates an example design layout region which would not be assigned to the multiple exposures during process 2000. Each split graph has CSSs that are portions of shapes that also have CSSs in other split graphs, and thus the design layout region cannot be immediately assigned to the multiple exposures, and must instead be included in the definition of the objective function.

If the process does not assign the split graph to the multiple exposures, it instead flags (at 2060) the shapes represented in the split graph as needed for the definition of the objective function. After either 2030 or 2060, the process determines (at 2040) whether there are more split graphs in the region. If more split graphs remain, the process proceeds to 2010 and repeats. The process continues until it determines (at 2040) that there are no other split graphs in the current region. Once all split graphs have been processed, the process outputs (at 2070) the split graphs flagged at 2060 and ends.

While the process 2000 illustrates one example of a process for pre-coloring optimization, one of ordinary skill in the art will recognize that other processes may be used for pre-coloring optimization. For example, some embodiments perform more tests to remove sets of shapes from the objective function to further simplify the optimization process. Furthermore, one of ordinary skill will recognize that the pre-coloring optimization may occur at different times within the overall decomposition process. In fact, some embodiments do not even perform pre-coloring optimization, and instead include all geometries within the definition of the objective function.

iii. Generating Initial Decomposition Solution

The decomposition process 700 next initially assigns (at 765) the shapes to multiple exposures in such a way as to arrive at a near-optimal solution. Some embodiments use a generalized breadth-first search (BFS) algorithm to traverse the shape graph for the design layout region and initially assign the shapes to the multiple exposures. BFS is an uninformed search method that systematically expands and examines all nodes of a graph in search of a solution. Other embodiments use other methods to initially assign the shapes to multiple exposures (e.g., depth first search, etc.). The initial assignment of shapes to the multiple exposures provides an initial, valid, and near-optimal decomposition of the design layout region into multiple exposures in some embodiments.

Figure 25:
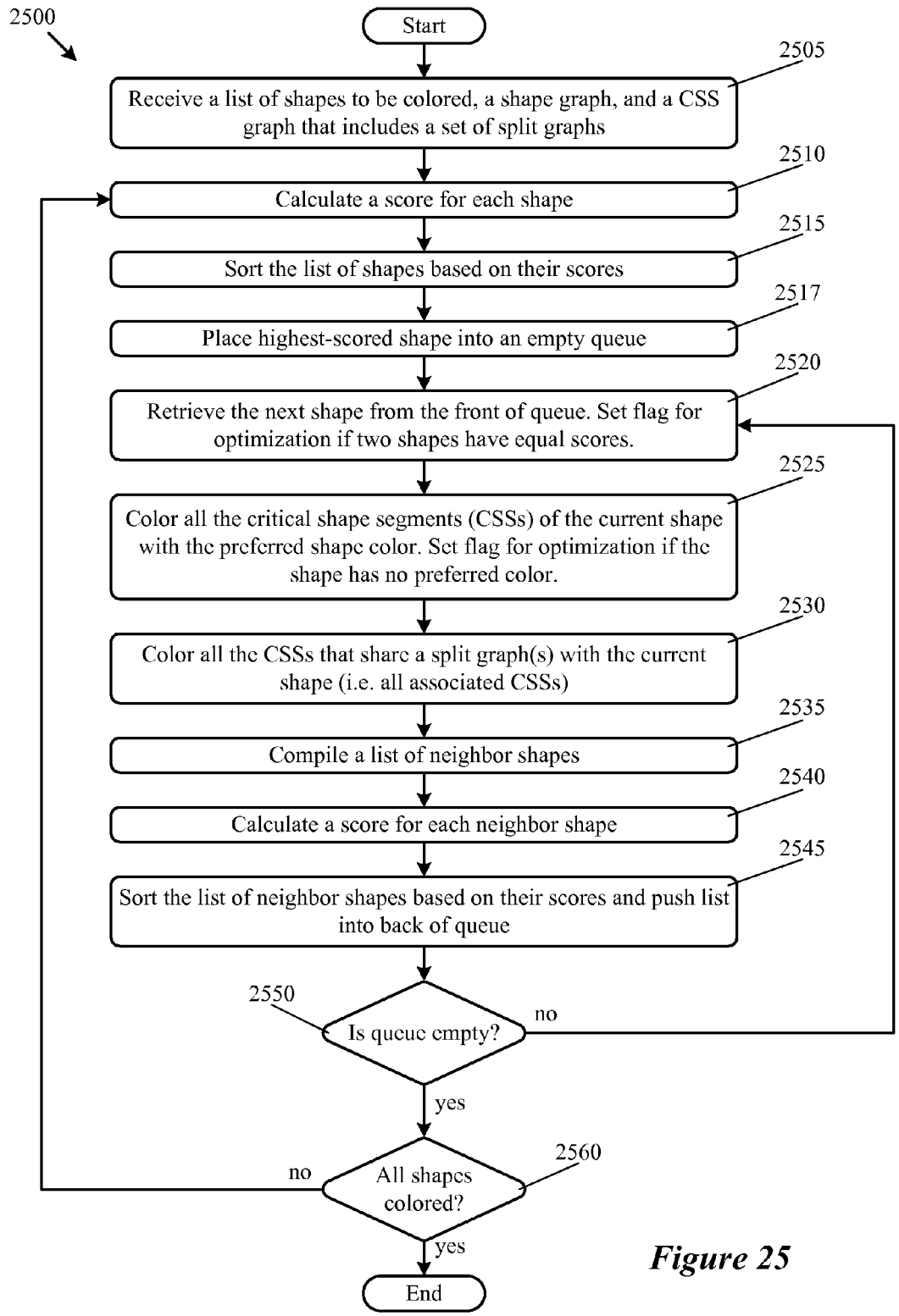
FIG. 25 illustrates the shape-based coloring process of some embodiments.

FIG. 25 conceptually illustrates the shape-based coloring process 2500 of some embodiments. The process 2500 begins at 2505 by receiving a list of shapes, CSSs, and links, and a shape graph for a design layout region. In some embodiments, the list of shapes, CSSs, and links is an unordered roster of the shapes that are in the shape graph with a list of the CSSs and links for each shape. For example, the process might receive the shapes, CSSs, and links for design layout region 800, along with split graphs 1400 for the region.

The process 2500 then calculates (at 2510) a score (referred to as a color score in some embodiments) for each shape. The color score of some embodiments is used to determine which shape should next be evaluated at various stages of process 2500. Because at 2510, all shapes remaining to be processed are uncolored, the score calculated at 2510 is based simply on the number of CSSs in the shape. In some embodiments, the fewer the number of CSSs in a shape, the higher score the shape is given. In such embodiments, therefore, the shape with the fewest CSSs is colored first.

Next, the process 2500 sorts (at 2515) the list of shapes based on their color scores. Some embodiments sort the list such that the shape with the highest color score is first. If shapes have equal scores, some embodiments randomly order the equally scored shapes.

The process 2500 then places (at 2517) the highest-scored shape into an empty queue. If two (or more) shapes have the same color score, a random choice is made between them. In some embodiments, this random choice is based on a random decision in the ordering of the list. Some embodiments flag the random choice for use in the optimization process which searches for a decomposition solution that optimizes the objective function. Some embodiments of the optimization process are described below.

The process then retrieves (at 2520) the next shape from the front of the queue. Next, the process 2500 colors (at 2525) all the uncolored CSSs of the current shape with a preferred shape color. As mentioned above, coloring a shape or shape portion refers to assigning the shape or shape portion to a particular exposure in some embodiments. The preferred color of some embodiments is the color that the majority of CSSs in the shape have been assigned. Some embodiments have a default preferred color (i.e., white or black), whereas some embodiments make a random decision as to whether to assign the shape to white or black. The process also flags the random (or default) choices for use in the optimization process described below.

The process 2500 then colors (at 2530) all the CSSs that share a split graph (or split graphs) with the current shape. In some embodiments, this is done because once any node in a split graph is assigned a color, the color of all of the other nodes in the split graph is mandated. For example, referring back to split graph 1240 in FIG. 14, once node 1205 is assigned to black, node 1225 must also be black and nodes 1215 and 1235 must be white. If the current shape has multiple CSSs that are in different split graphs, then all of the nodes in all of the split graphs are colored.

After coloring (at 2530) all CSSs that share a split graph with the current shape, the process produces (at 2535) a list of neighbor shapes for the current shape. In some embodiments, the list of neighbor shapes of a particular shape is all shapes that share an edge with the particular shape in a shape graph. That is, for two shapes to be neighbors, they need not necessarily have adjacent CSSs, but there must be at least one split graph in which each of the shapes has a node. In some embodiments, the list only includes neighbor shapes that have not yet been colored.

The process then calculates (at 2540) a score for each of the neighbor shapes in the list. The scores of some embodiments are based on a few simple rules for comparing two shapes. In some embodiments, if both shapes are fully colored (i.e., all CSSs within the region are assigned to an exposure), then the shape with the fewest number of CSSs is given a higher score. If only one shape is fully colored, then the fully colored shape has a higher score. If neither shape is fully colored, but one shape has a uniform color (i.e., does not have CSSs assigned to more than one exposure) while the other does not, then the shape with uniform color is given a higher score. Finally, if neither shape or both of the shapes has a uniform color, then the shape with fewer un-colored nodes has a higher score.

The list of neighbor shapes is then sorted (at 2545) by their score and placed in the back of the queue. Some embodiments sort the list such that the shape with the highest color score is first. If shapes have equal scores, some embodiments randomly order the equally scored shapes. In some embodiments, if a neighbor shape is already in the queue, it is left in its place rather than being moved to the back. Placing all of the neighbor shapes into the queue enables the breadth-first search aspect of some embodiments of the coloring process.

Next, the process 2500 determines (at 2550) whether the queue is empty. If not, the process returns to 2520 to retrieve the next shape from the front of the queue and set this shape as the current shape. The process 2500 then repeats operations 2525-2550 until the queue is empty. In some embodiments, the queue will be empty once all shapes connected within a section of a shape graph are colored.

Once all of the neighbor shapes are colored, the process determines (at 2560) whether all shapes in the list (i.e., the design layout region) have been colored. If not, the process repeats the operations 2510-2560 until all shapes are colored. If all shapes are colored, the process ends. At this point in some embodiments, all shapes in the entire design layout region are assigned to the multiple exposures. In other words, a viable decomposition solution has been found in some embodiments. However, this solution is not necessarily the optimal solution in some embodiments, as there may be shapes that are not all one color (i.e., some shapes may have portions assigned to multiple exposures). Shapes that are not entirely one color may arise in some embodiments because a shape has nodes in multiple sub-graphs and the nodes end up colored differently.

While the process 2500 illustrates one example of a process used to initially assign the shapes to multiple exposures, one of ordinary skill in the art will recognize that other processes can be used to do so as well. For example, some embodiments use depth-first search algorithms rather than breadth-first search.

iv. Detailed Shape-based Coloring Example

Figure 26A:
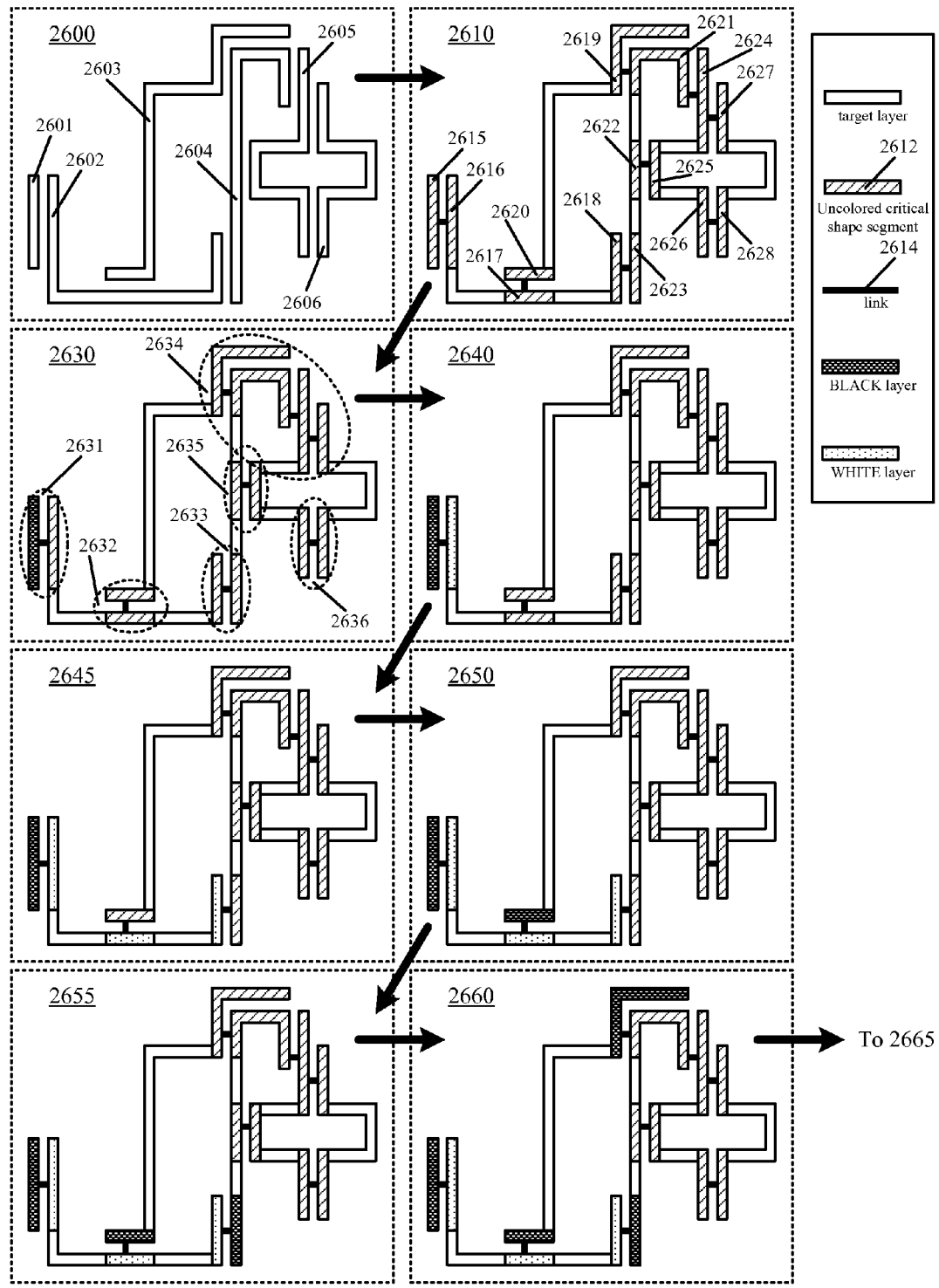
FIG. 26A illustrates a detailed decomposition example using the shape-based coloring flow of FIG. 25 of some embodiments.
Figure 26B:
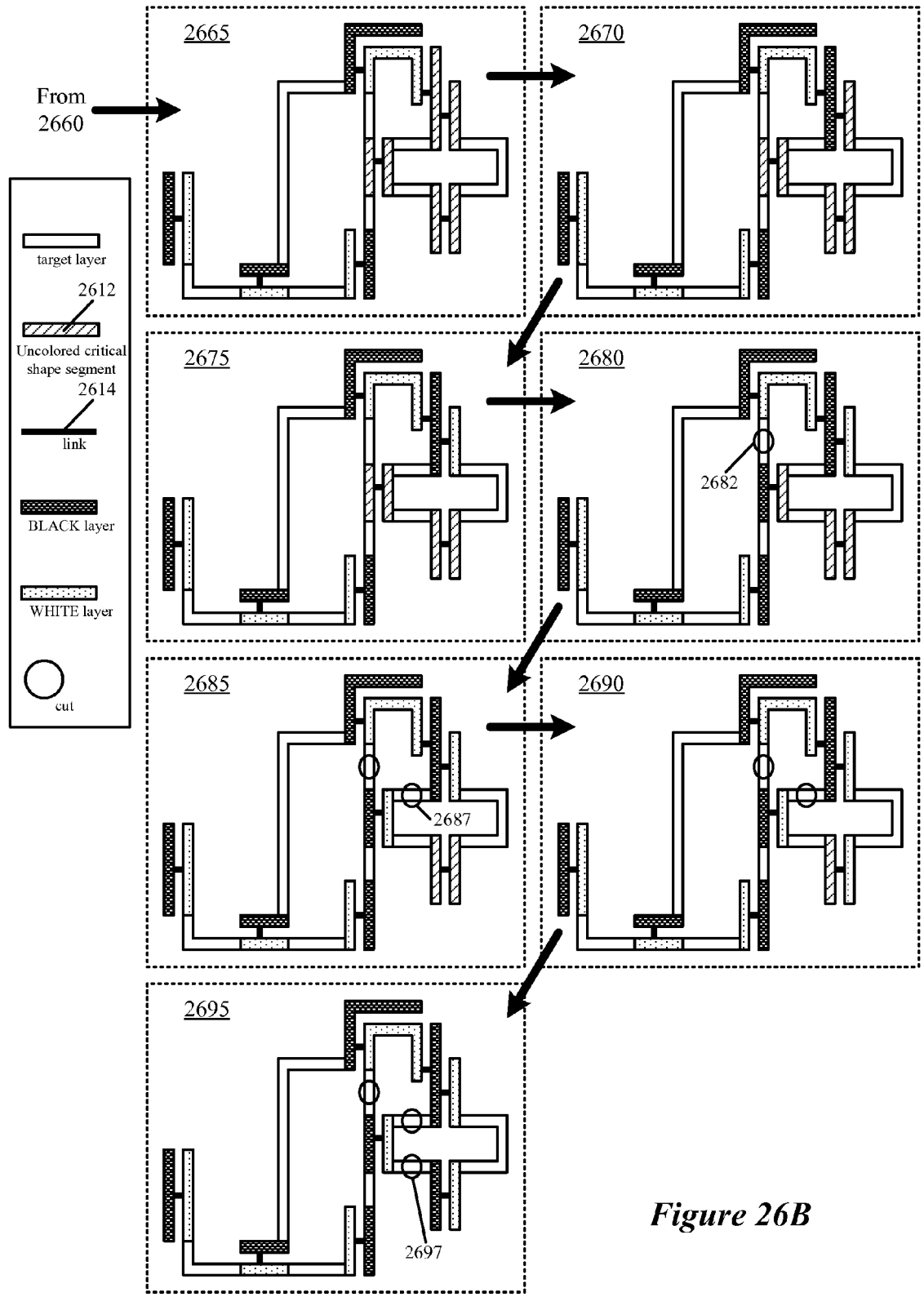
FIG. 26B illustrates the continuation of the detailed decomposition example of FIG. 26A using the shape-based coloring flow of FIG. 25 of some embodiments.

FIGS. 26A and 26B illustrate a detailed example of the initial coloring process for a design layout region 2600 that includes shapes 2601-2606. Section 2610 shows the region 2600 after rule-checking, with CSSs represented on an uncolored CSS layer 2612. These associations between these CSSs are shown through the use of the link layer 2614. As shown, section 2610 includes fourteen identified CSSs 2615-2628, and six associated sets of CSSs. Section 2630 shows the six associated sets 2631-2636. Also shown in section 2630, the first shape 2601 (i.e. the shape with the fewest CSSs) has its single CSS 2615 colored black (i.e., it is assigned to the black exposure). As mentioned above, in some embodiments this assignment is a random choice, and in some embodiments there is a default color.

Next, all CSSs that share a split graph with the first shape 2601 are colored. Since the shape 2601 has only one split graph (the split graph which corresponds to the associated set 2631), just CSS 2616 is colored white, as shown in section 2640. Shape 2601 has only one neighbor shape 2602, which is placed in the queue. Shape 2602 is then retrieved from the queue, and colored white. White is the preferred color for shape 2602 because shape 2602 has one CSS 2616 that has been colored white, while no other CSSs on that shape have been colored. Thus CSSs 2617 and 2618 are colored white, as shown in section 2645.

The process 2500 next colors (at 2530) all the CSSs that share a split graph with the shape 2602. In this example, the shape 2602 is represented in two split graphs, corresponding to the associated sets 2632 and 2633. Thus, CSSs 2620 and 2623 are colored black, as shown in sections 2650 and 2655.

Shape 2602 has two neighbor shapes 2603 and 2604. The shapes are compared to see which shape has a higher color score. Shape 2603 has a higher score, because both shapes 2603 and 2604 are not fully colored, both have a uniform color, and shape 2603 has fewer uncolored CSSs (one uncolored CSS versus two for shape 2604). Accordingly, shape 2603 is placed in the queue ahead of shape 2604.

Shape 2603 is then retrieved from the queue, and the CSSs of shape 2603 (CSS 2619) are colored black, as shown in section 2660. Black is the preferred color for shape 2603 because one of its CSSs 2620 has already been colored black and no other CSSs have been colored.

After the shape 2603 is fully colored, the process 2500 colors all the CSSs in the associated set 2634, as this is the only associated set including a CSS from shape 2603 that does not have all of its CSSs colored. Thus, CSS 2621 is colored white, as shown in section 2665 of FIG. 26B. Next, CSS 2624 is colored black, as shown in section 2670, and CSS 2627 is colored white, as shown in section 2675.

The neighbors of shape 2603 include shape 2604, which is already in the queue, and shapes 2605 and 2606, which are not. Neither of shapes 2605 and 2606 are fully colored, and both have a uniform color (black for 2605 and white for 2606), but 2606 is placed first into the queue because it has fewer un-colored CSSs (just 2628, whereas shape 2605 has un-colored CSSs 2625 and 2626).

Shape 2604, the next shape in the queue, is then retrieved. As shape 2604 has one black-colored CSS and one white-colored CSS, there is no preferred color. Thus, a color is randomly selected and assigned to CSS 2622. In the example, CSS 2622 is assigned the color black, as shown in section 2680. This random assignment is flagged for later use in the optimization process. Shape 2604 is now split between two exposures. This split is indicated by "cut" 2682 in section 2680 of FIG. 26B.

Next, all CSSs that are included in an associated set with a CSS from shape 2604 are colored. Here, this is only CSS 2625, which is colored white, as shown in section 2685. This results in a cut 2655 between CSSs 2621 and 2622 on shape 2605.

All of the neighbors of shape 2604 have been in the queue or are currently in the queue, so the next shape is retrieved from the queue (shape 2606). Shape 2606 is colored white, because CSS 2627 is the only colored CSS in the shape. The result is shown in section 2690. The remaining uncolored CSS 2626 is colored black, because it is part of the associated set 2636 with CSS 2626. This results in a cut 2697, as shown in section 2695. Shape 2605 is then pulled from the queue, although there is nothing left to color for shape 2605. At this point, there are no more shapes remaining, so the coloring process ends.

v. Optimizing the Objective Function

Figure 27:
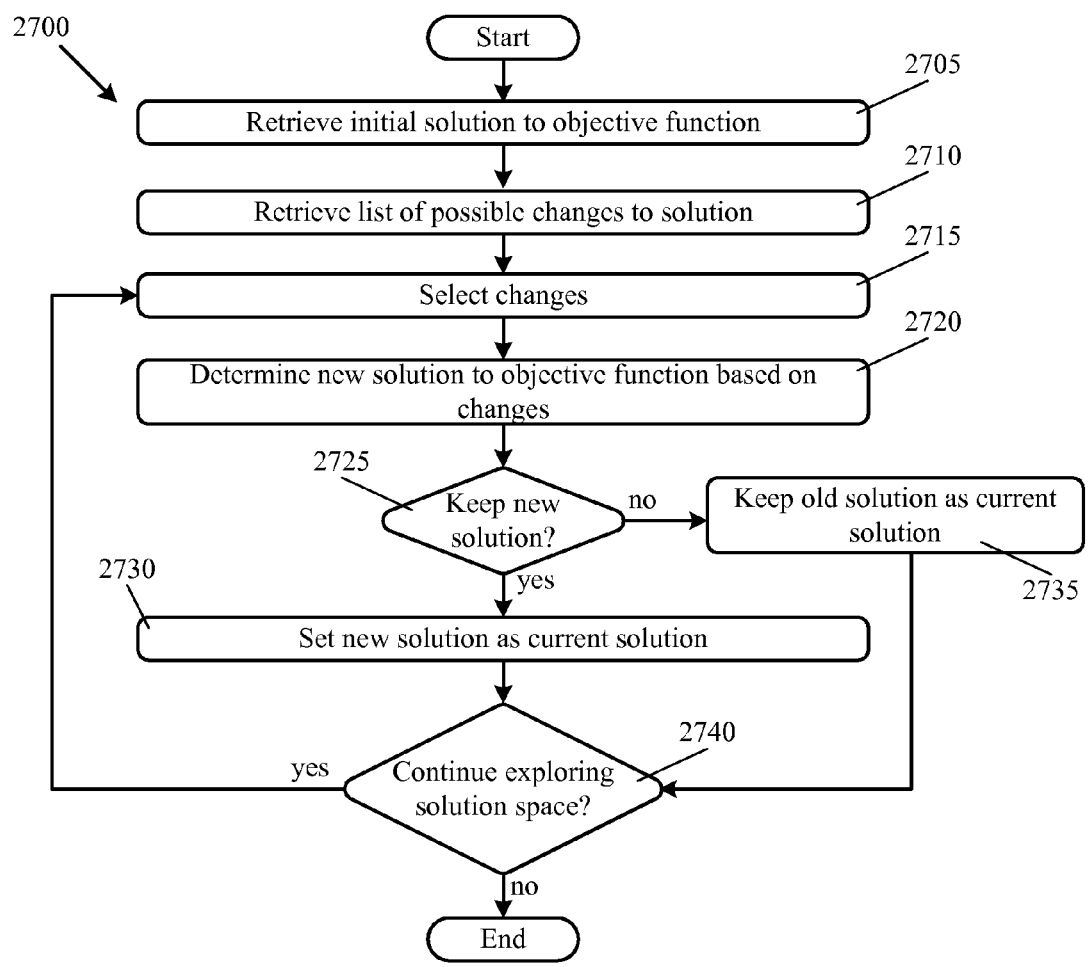
FIG. 27 illustrates the process used to perform optimization of some embodiments.

The decomposition process 700 next searches (at 770) the solution space of the objective function in order to further optimize the decomposition solution. FIG. 27 illustrates a process 2700 of some embodiments for performing this optimization. Process 2700 searches the solution space of the objective function in order to find an optimal solution. Process 2700 begins at 2705 by retrieving the initial decomposition solution. In some embodiments, this initial solution is the solution arrived at via a process such as process 2500. Other embodiments may use other processes to arrive at an initial decomposition solution.

The process 2500 then retrieves a list of possible changes to the decomposition solution. For example, in some embodiments this is a list of CSSs that were set randomly in the initial coloring process. In some embodiments, the list includes random decisions as to which shape should be processed first in the coloring process. Some embodiments include other variables, such as CSSs that were not set randomly, but were set on shapes that already included CSSs with different colors (e.g., the assignment of a CSS to white because its shape already had two white CSSs and only one black CSS).

Figure 28A:
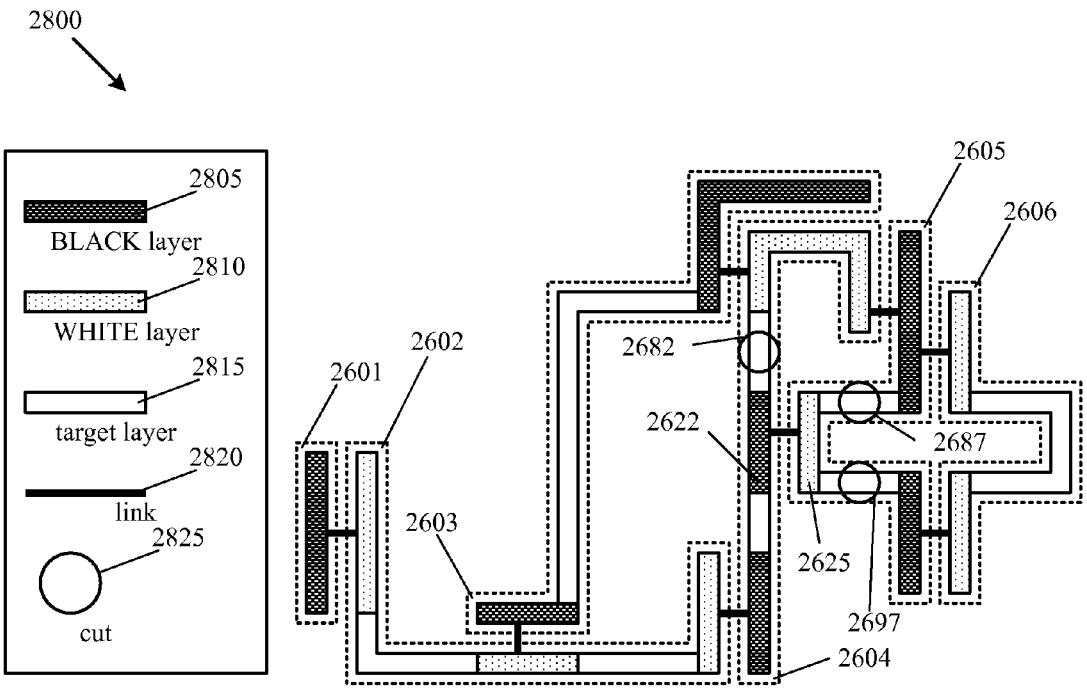
FIG. 28A illustrates an example design layout region used to illustrate the process of FIG. 27 of some embodiments.

At 2715, the optimization process 2700 selects a set of changes to make to the solution. Some embodiments select a set of randomly assigned CSSs, and swap the assignment. If a particular CSS was randomly assigned to a first exposure, then the process assigns the particular CSS to a second exposure. Some embodiments only swap one assignment each pass through operation 2715, whereas other embodiments swap more than one (e.g., two, fifty, one hundred, etc.) assignment. In the detailed example described above with respect to FIGS. 26A and 26B, there was only one randomly assigned CSS (CSS 2622, which was randomly assigned to black). FIG. 28A illustrates this assignment 2800, with the three splits 2682, 2687, and 2697.

Figure 28B:
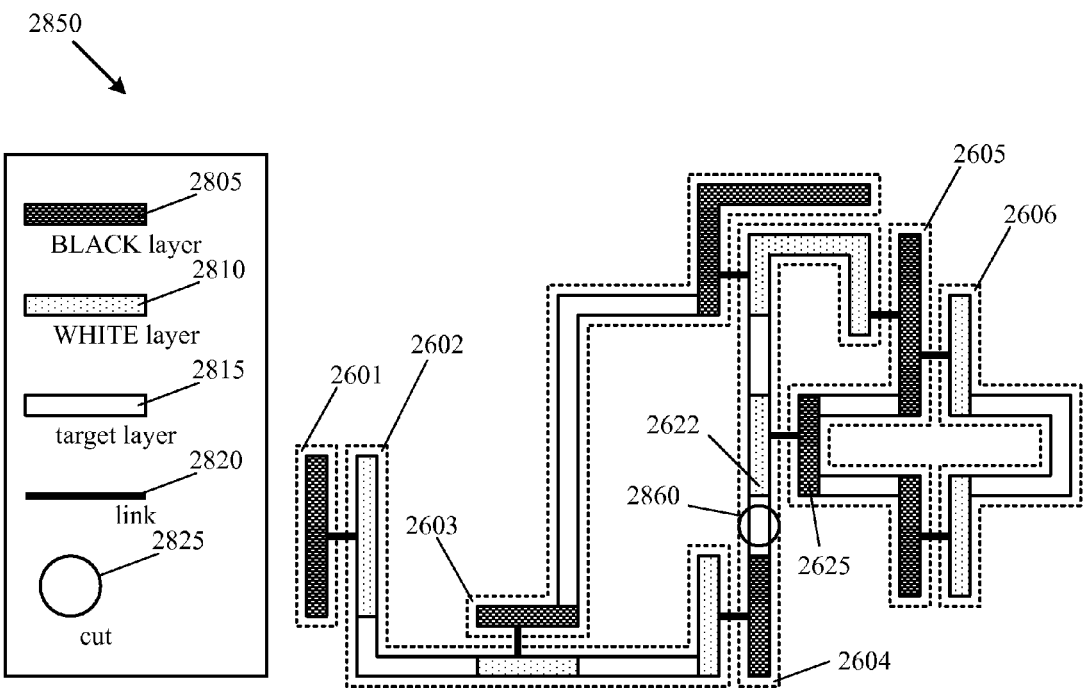
FIG. 28B illustrates the example design layout region of FIG. 28A after optimization.

After making the changes (e.g., swapping color assignments), the process then determines a new decomposition solution based on the changes. For example, some embodiments re-assign CSSs as necessary to find a solution. FIG. 28B illustrates the re-assignments 2850 after CSS 2622 is re-assigned to white. This causes CSS 2625 to be re-assigned to black, while the remainder of the assignments for the design layout region stay the same. This swap results in only one split, 2860. Accordingly, in some embodiments, this is a better solution for the design layout region than 2800.

At 2725, the process 2700 determines whether to keep the new solution. Some embodiments cost the two solutions (the current solution and the new solution) and always keep the lower cost solution (i.e., a greedy algorithm). Some embodiments determine cost in terms of the number of split geometries. For example, some embodiments count the number of splits, whereas other embodiments count the number of geometries that have at least one split. Some embodiments assign a higher cost to the first split in a particular geometry than the second split in the particular geometry, with each subsequent split costing less than the previous split. Conversely, some embodiments assign a higher cost to the second split within a particular geometry, with each subsequent split costing more than the previous split on the particular geometry. Some embodiments factor other variables into the cost, such as the physical device to which the geometry corresponds (e.g., a wire, gate, resistor, capacitor, etc.), with splits in geometries corresponding to some devices costing more than splits in geometries corresponding to other devices.

Whether to keep the new solution is dependent on the type of optimization technique used to perform the operations of the process 2700. For instance, some optimization techniques (e.g., local optimization) only accept changes that improve the cost of the solution. Other optimization techniques (e.g., simulated annealing) accept new solutions that increase the cost, but accept fewer such worse solutions over time.

If the process 2700 determines to keep the new solution, then it sets (at 2730) the new solution as the current solution and proceeds to 2740. If not, then the process 2700 keeps (at 2735) the current solution and proceeds to 2740.

At 2740, the process determines whether to continue exploring the solution space by making changes to the solution. This determination is also made based on the type of optimization used to perform the operations of process 2700. For instance, some embodiments stop exploring the solution space after failing to find a solution that improves the cost by a particular threshold after a certain number of iterations. In some embodiments, the acceptable threshold and number of failed iterations changes over time (i.e., changes based on how many iterations the process 2700 has run through.

While the process 2700 illustrates one example of a process used to find an optimal solution for decomposing a design layout region, one of ordinary skill in the art will recognize that other optimization processes can be used as well. For example, some optimization processes might store numerous past solutions, and revert to a previous, better solution after accepting a certain number of higher cost moves.

Finally, process 700 outputs (at 780) the results (i.e., the optimal decomposition solution) as a set of data that is used to produce multiple masks for fabricating the design layout region. In some embodiments, process 700 is performed several times for several layers of a multi-layer IC, such that multiple layers in the IC design layout are each decomposed into multiple mask layouts for fabricating the layers.

Figure 29:
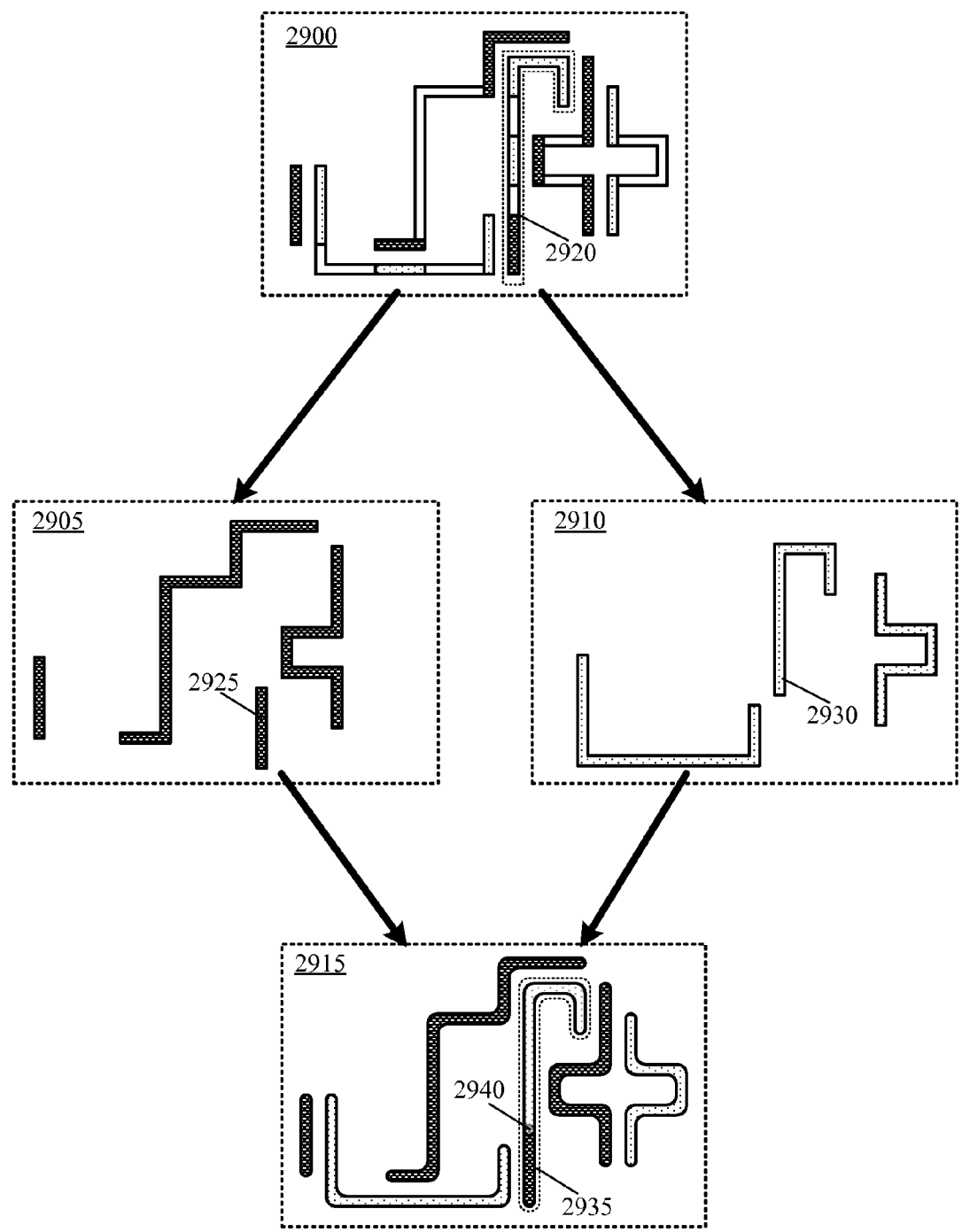
FIG. 29 illustrates the optimal decomposition solution from FIG. 28B.

FIG. 29 illustrates the optimal decomposition solution 2900 from FIG. 28B for decomposing design layout region 2600, including shape 2920 that is split between the two exposures. FIG. 29 also illustrates result data defining two mask layouts 2905 and 2910 for fabricating the design layout region 2600. Mask layout 2905 defines the first (black) exposure, and includes a shape 2925 that makes up part of shape 2920. Mask layout 2910 defines the second (white) exposure, and includes a shape 2930 that makes up the remaining part of shape 2920. In other words, mask layout shapes 2925 and 2930 collectively define the design layout shape 2920.

Lastly, FIG. 29 illustrates a region of a fabricated IC corresponding to design layout region 2600. Mask layout shapes 2925 and 2930 are printed in different exposures so as to form shape 2935 on the fabricated IC. Shape 2935 includes section 2940 where the two portions of shape 2935 that are printed in different exposures overlap.

III. Contact and Via Decomposition

Some embodiments use a simplified process to assign contact and via layers to different exposures. In some embodiments, a simplified process can be used because the contact and via layers only include rectangles and/or squares (i.e., the geometries do not include any bends as seen in the previous example geometries). In such embodiments, each shape in the contact or via layer will have at most one CSS, and so if the layer has a solution, the layer will not have any split geometries.

Figure 30:
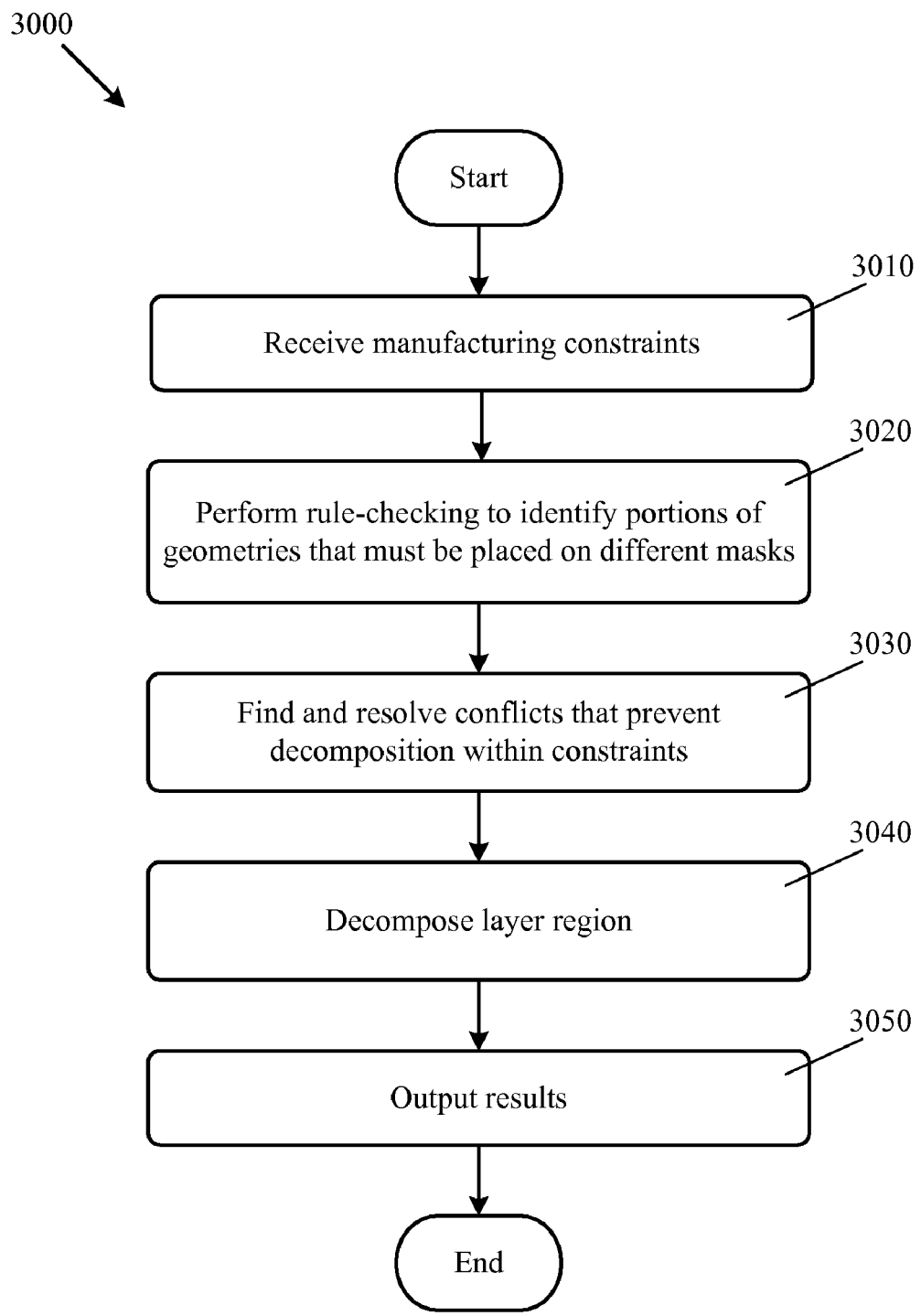
FIG. 30 illustrates the process used when the design layout region is composed of a via or contact layer of some embodiments.

FIG. 30 illustrates a process 3000 of some embodiments for decomposing a contact or via layer into multiple exposures. As with process 500, the process 3000 begins by receiving (at 3010) manufacturing constraints. In some embodiments, the manufacturing constraints include a set of geometries (i.e., shapes) at specified locations within the design layout region. The manufacturing constraints also include a pitch requirement (i.e., the minimum distance that two shapes can be from each other and still be printed in the same exposure) in some embodiments.

After receiving the manufacturing constraints, the process 3000 performs (at 3020) rule-checking to identify portions of geometries that must be placed on different exposures. Some embodiments determine which contact or via shapes are within the pitch requirement of another contact or via shape in the design layout region.

The process 3000 then finds and resolves (at 3030) conflicts in the design layout region that prevent successful decomposition within the manufacturing constraints. In some embodiments, this includes defining CSS graphs and, from the CSS graphs, split graphs for the design layout region. The process 3000 can then decompose (at 3040) the design layout region. Because all shapes in the design layout region have a maximum of one CSS, the decomposition can be based on the split graphs alone. Each split graph divides the sub-graph into two sets of CSSs (shapes) and assigns one set to a first exposure and a second set to a second exposure. The process 3000 then outputs the results at 3050.

No optimization is required, in some embodiments, because there are no shapes split between multiple exposures. However, some embodiments will perform optimization processes for other purposes relating to how the shapes are divided between the multiple exposures.

IV. Hierarchical Decomposition

In some embodiments, the design layout region is a hierarchical design layout region that includes one or more child sub-regions (or "cells"). In some embodiments, a child sub-region is an instance of a pre-defined set of shapes that may be used in multiple locations within the design layout region. In some embodiments, the child sub-regions are standard cells (e.g. logic gates, flip-flops, etc.). In other embodiments, the child sub-regions may be manually-optimized layouts for different functional blocks or other circuitry that is used in multiple locations on the manufactured IC.

Some embodiments pre-decompose each pre-defined set of shapes into multiple exposures. In solving the decomposition problem, the decomposition of a particular set of geometries is applied to each instance of that particular set. In some embodiments, the method does not revisit the particular decomposition of a child sub-region during the optimization process.

Some embodiments modify the processes described above in Section II to accommodate hierarchical design layout regions. In some embodiments, a first modification to the processes described above is that, before assigning the design layout region as a whole to multiple exposures, the shapes within the child cells are assigned to the multiple exposures.

Each child cell is treated as a design layout region itself, and the shapes within the child cell are assigned to the multiple exposures (e.g., assigned black and white colors). This assignment is then given to each instance of the child cell in the design layout region. The process of assigning a child cell to multiple exposures, in some embodiments, includes treating the child cell as a complete design layout region, and drawing CSS graphs and node graphs, and then assigning the CSSs to the different exposures.

Figure 31:
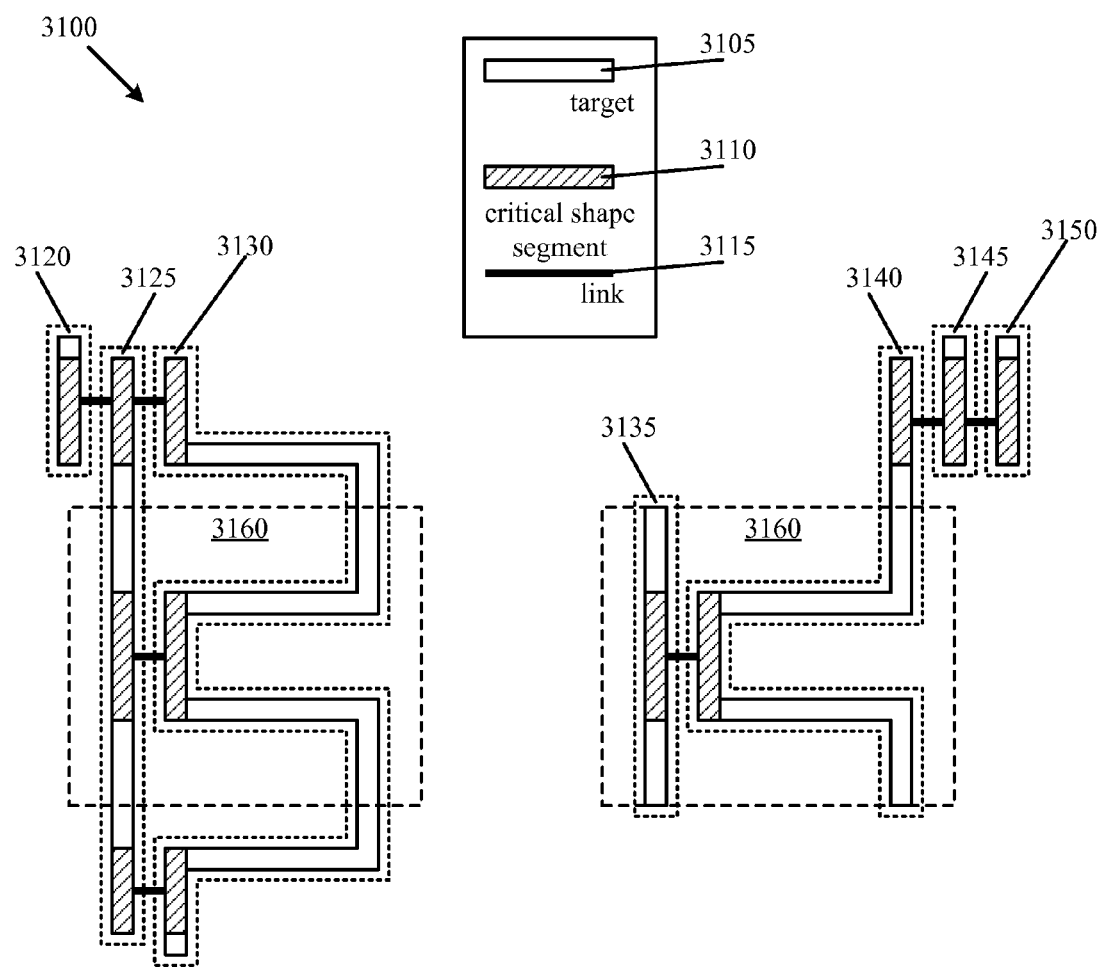
FIG. 31 illustrates a hierarchical design layout region that includes two instances of a child cell.
Figure 32:
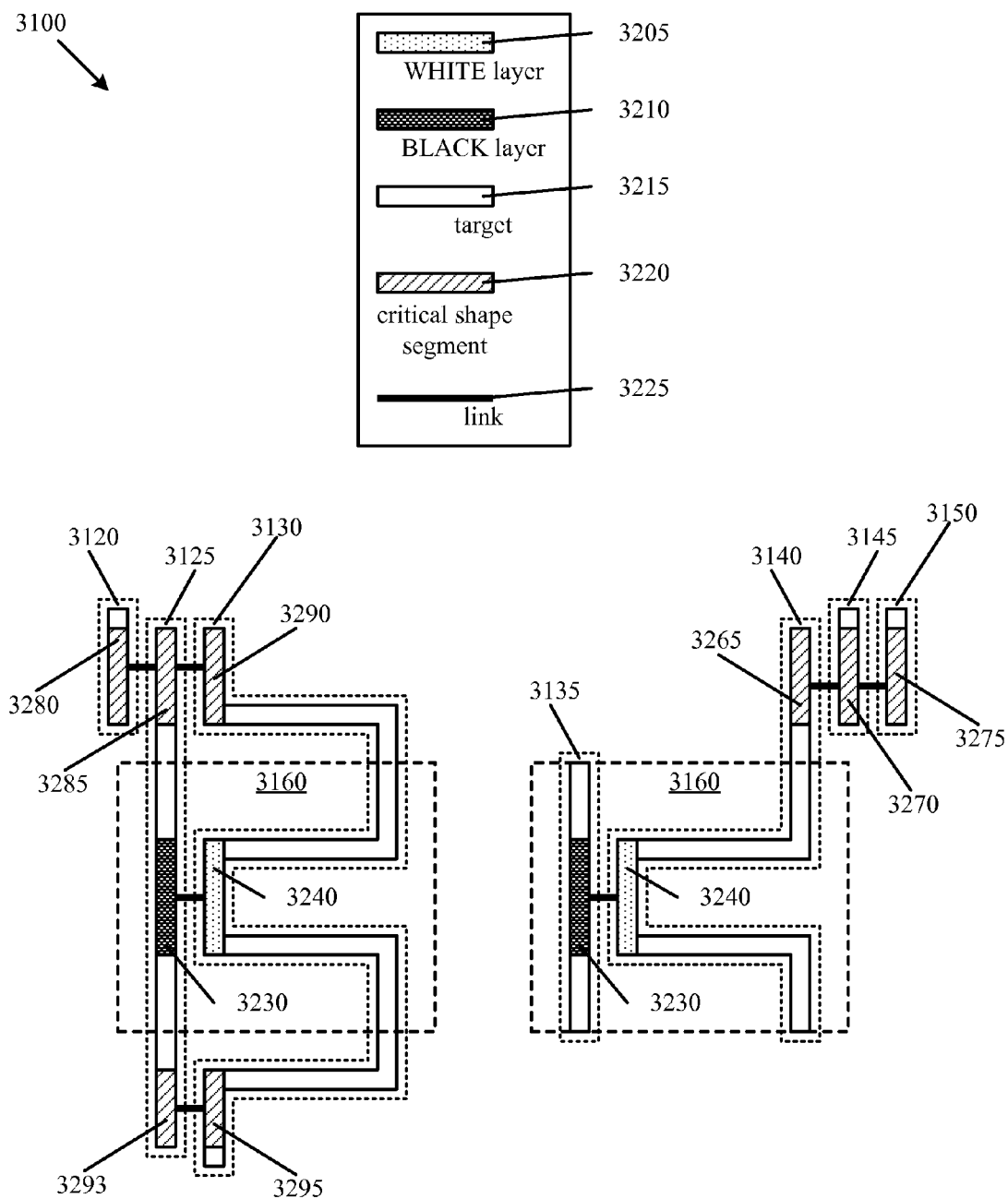
FIG. 32 illustrates a modified design layout region of FIG. 31, which shows the design layout region after the child cells have been colored.

FIG. 31 illustrates a hierarchical design layout region 3100 that includes two instances of a child cell 3160. Design layout region 3100 includes seven shapes 3120-3150, three of which are split between a child instance and the rest of the design layout region. FIG. 31 also indicates the CSSs 3110 and links 3115 in the design layout region 3100. As shown in FIG. 32, a solution is determined for the child cells 3160 such that CSSs 3230 are colored black and CSSs 3240 are colored white. Though not shown in this example, some child cells will have shapes that are split between multiple exposures. For example, the design layout region 2600 of FIG. 26A could be a child cell of a larger design layout region.

When examining the design layout region as a whole, shapes that extend into a child cell are flagged as hierarchical shapes ("h-shapes") in some embodiments. In some embodiments, the CSSs in the child cells are not processed as part of the CSS graph (or split graphs) for the design layout region. Shapes that extend into one or more child cells are given an initial preferred color based on the number of CSSs of each color that are in the child cells in some embodiments. In some embodiments, a shape's preferred color is whichever color is assigned to the most CSSs of the shape that are within child instances.

Some embodiments modify the pre-coloring optimization process to account for the already-assigned CSSs of the child cells. In some embodiments, when a split graph that includes at least one hierarchical shape satisfies a pre-coloring optimization condition (i.e., is removed from the definition of the objective function), the preferred colors are used to determine the assignment of the CSSs in the split graph to multiple exposures.

As discussed above, in some embodiments, a split graph splits its CSSs into two sets that must be assigned to different exposures (e.g., a first set and a second set). Some embodiments, for each of the two sets, determine the number of CSSs within the set that have a preferred color. For example, in design layout region 3100 of FIG. 32, the split graph including CSSs 3265-3275 would be removed for pre-coloring optimization in some embodiments. CSSs 3265 and 3275 are in the first set for this split graph, and CSS 3270 is in the second set. The first set includes one CSS with a preferred color of white, and none with a preferred color of black. The second set includes no CSSs with a preferred color.

This produces four variables in some embodiments (i.e., first set: black CSS counts, first set: white CSS count, second set: black CSS count, second set: white CSS count). In some embodiments, whichever variable is the largest is used to assign the CSSs to an exposure. Thus, if the four variables above are 3, 1, 5, and 4, then the second set is assigned to black (and, as a result, the first set to white). Other embodiments use different assignment processes. For example, some embodiments examine the difference between the number of CSSs in each set that are assigned to a each exposure.

In the example sub-graph including CSSs 3265-3275, CSS 3265 is the only region with a preferred color (white). Therefore, the first set, including CSSs 3265 and 3275, is assigned to white, whereas CSS 3270 is assigned to black.

Some embodiments also modify the assignment process 2500 (or other processes used for initial assignment) to account for hierarchical shapes. One such modification of some embodiments is that a hierarchical shapes (i.e., a shape that extends into a child cell) are all preferred over non-hierarchical shapes in the scoring process. Secondly, in some embodiments, when assigning a color to all uncolored CSSs in a hierarchical shape, the preferred color based on the CSSs in child cells is always used. For example, in design layout region 3100, shapes 3120, 3125, and 3130 would be evaluated by the initial assignment process. Shape 3125 and shape 3130 are both hierarchical shapes, so one of these two would be selected as the first shape for coloring. Randomly selecting 3125 as the first shape (instead of shape 3130), its CSSs (3285 and 3293) are assigned to black because CSS 3230 is already assigned to black. Based on split graphs, the other CSSs (3280, 3290, and 3295), are assigned to white.

During the optimization process, some embodiments treat the assignments of CSSs in child regions as fixed. Some embodiments treat the preferred color of hierarchical shapes as fixed, whereas other embodiments use the preferred color of hierarchical shapes as a variable that can be switched during the optimization process.

One of ordinary skill in the art would recognize that some embodiments may incorporate hierarchical shapes differently. For example, some embodiments modify the various processes for assigning shapes and portions of shapes to different exposures in ways other than those described above. Furthermore, while the examples illustrated above all involve only two levels, one of ordinary skill will recognize that in some cases a design layout region will have more than two levels. For example, the design layout region 3100 could itself be a child cell in a larger design layout region.

V. Pre-Decomposition Filtering

Some embodiments of the invention perform a filtering process prior to optimizing the objective function. Some embodiments implement the filtering process as a process that can be switched on or off by a user. In some embodiments, using a filtering process for design layout regions that have significant numbers of hierarchical shapes and/or levels of hierarchy can be more computationally intensive than proceeding without filtering. In other embodiments (e.g., when the design layout region is flat), applying filtering can significantly reduce computation time. The filtering process is used to detect geometries that can be assigned to multiple exposures without conflicts, without breaking the geometries down into critical portions. Such filtered geometries are immediately assigned to the multiple exposures and removed from the definition of the objective function. In some embodiments, filtering is different for non-hierarchical (i.e., flat) design layout regions and hierarchical design layout regions.

A. Flat Filtering

Figure 33:
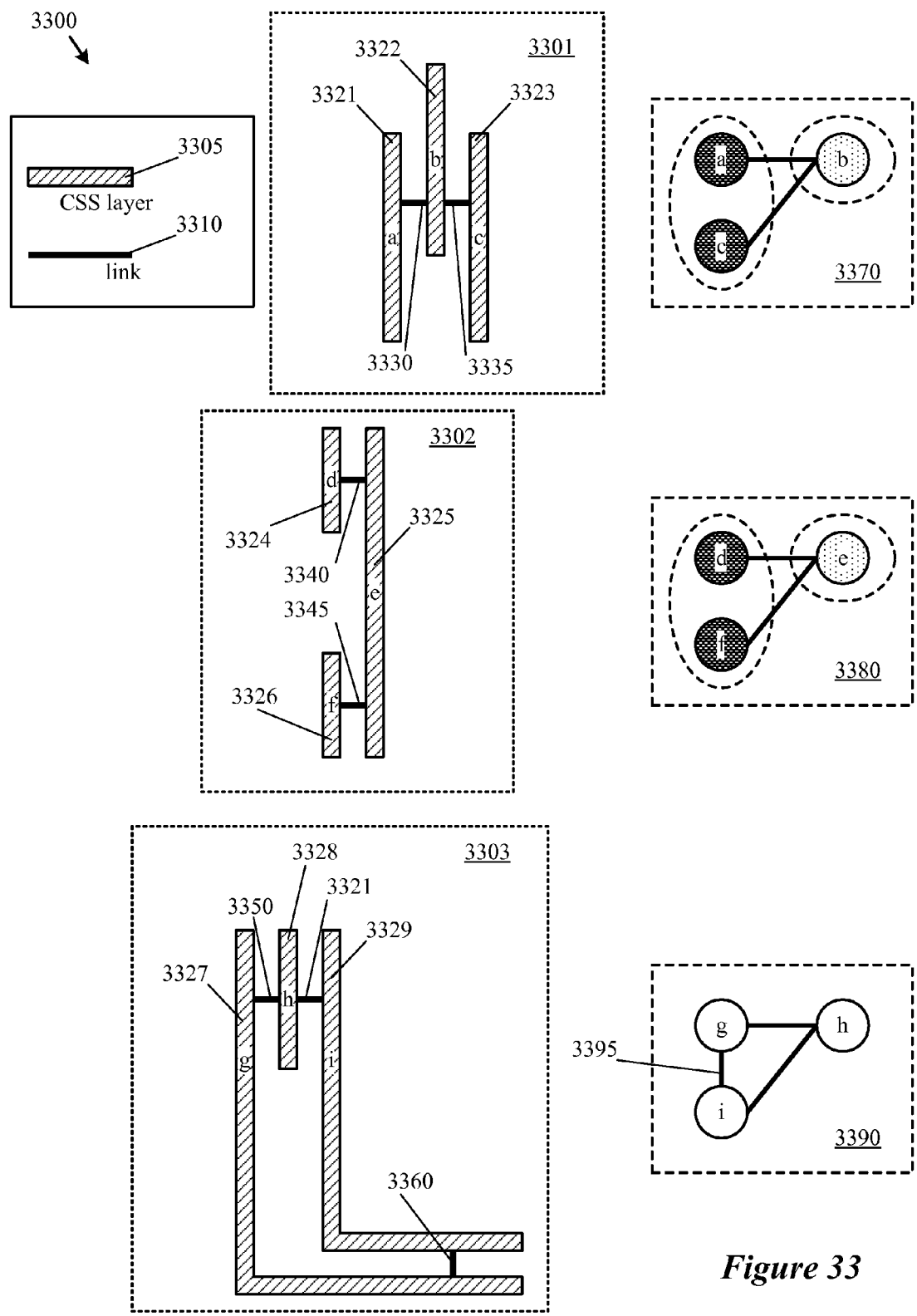
FIG. 33 illustrates a design layout region and its associated CSS graph as an example of a filtering operation.

To perform filtering, some embodiments first treat each shape as a single CSS, and generate links. FIG. 33 illustrates a design layout region 3300 that includes nine shapes 3321-3329 in three sections 3301-3303. Treating each shape as a single CSS, the filtering process draws a CSS graph for the design layout region and partitions the CSS graphs into sub-graphs. FIG. 33 also illustrates split graphs 3370-3390 for the three sections of design layout region 3300.

The filtering process of some embodiments then attempts to build split graphs for each of the sub-graphs. If a particular split graph can be built successfully for a section of the design layout region, then the shapes in the particular split graph can be assigned immediately to different exposures and removed from the definition of the objective function. If all of the split graphs can be built successfully, then a perfect solution (i.e., a solution with no split geometries) exists for the design layout region and thus the optimization of the objective function is not necessary for the design layout region. Sub-graphs that cannot be successfully built into split graphs are not removed from the objective function, and are included in the standard process of optimizing the objective function (e.g., process 700).

In the example design layout region 3300, the split graphs 3370 and 3380 are built successfully. Note that while the shapes in section 3301 would be removed from the objective function anyway with pre-coloring optimization, the shapes in section 3302 would not, because shape 3325 would have CSSs in two different sub-graphs.

The split graph 3390, on the other hand, has a conflict. Accordingly, it cannot be removed from the definition of the objective function for the design layout region 3300 because there is no way to color each shape entirely black or white. As such, the filtering provides an indication that, if section 3303 can be split into multiple exposures successfully, there will be at least one split geometry in the section.

B. Hierarchical Filtering

Figure 34:
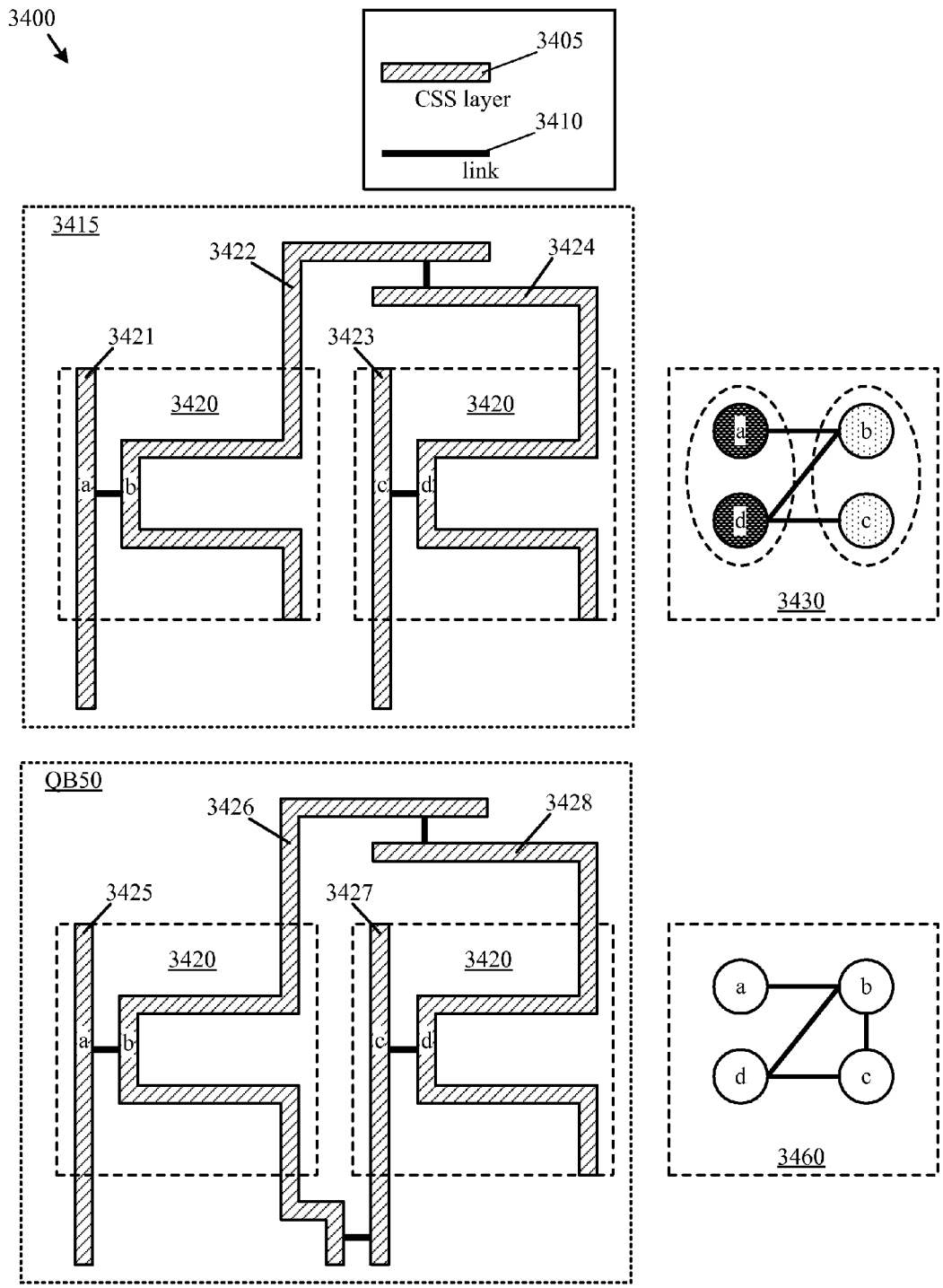
FIG. 34 illustrates a design layout region and its associated CSS graph as an example of a hierarchical filtering operation.

Some embodiments apply a similar filtering process to hierarchical design layout regions. To perform hierarchical filtering, some embodiments do not differentiate between geometries that span across the design hierarchy (i.e., hierarchical shapes that include sections in both a parent cell and its child cell(s) are treated as though they are flat shapes). FIG. 34 illustrates a hierarchical design layout region 3400 that includes four child cells 3420 and eight shapes 3421-3428 in two sections 3415 and 3450. Treating each shape as a single CSS, the filtering process draws a CSS graph for the design layout region and partitions the CSS graphs into sub-graphs. FIG. 34 also illustrates split graphs 3430 and 3460 for the two sections of design layout region 3400.

The hierarchical filtering process of some embodiments then attempts to build split graphs for each of the sub-graphs. If a particular split graph can be built successfully for a section of the design layout region, then the shapes (including hierarchical shapes) in the particular split graph can be assigned immediately to different exposures and removed from the definition of the objective function. If all of the split graphs can be built successfully, then a perfect solution (i.e., a solution with no split geometries) exists for the hierarchical design layout region and thus the optimization of the objective function is not necessary for the hierarchical design layout region. Shapes within sub-graphs that cannot be successfully built into split graphs are not removed from the objective function, and are included in the standard process of optimizing the objective function (e.g., process 700).

In the example design layout region 3400, the split graph 3430 is built successfully, and thus all shapes can be removed from the definition of the objective function for the design layout region 3400. The split graph 3460, on the other hand, has a conflict. Accordingly, it cannot be removed from the definition of the objective function for the design layout region 3400 because there is no way to color each shape entirely black or white while satisfying the manufacturing constraints. As such, the hierarchical filtering provides an indication that, if section 3450 can be split into multiple exposures successfully, there will be at least one split geometry in the section.

VI. Software Architecture

Figure 35:
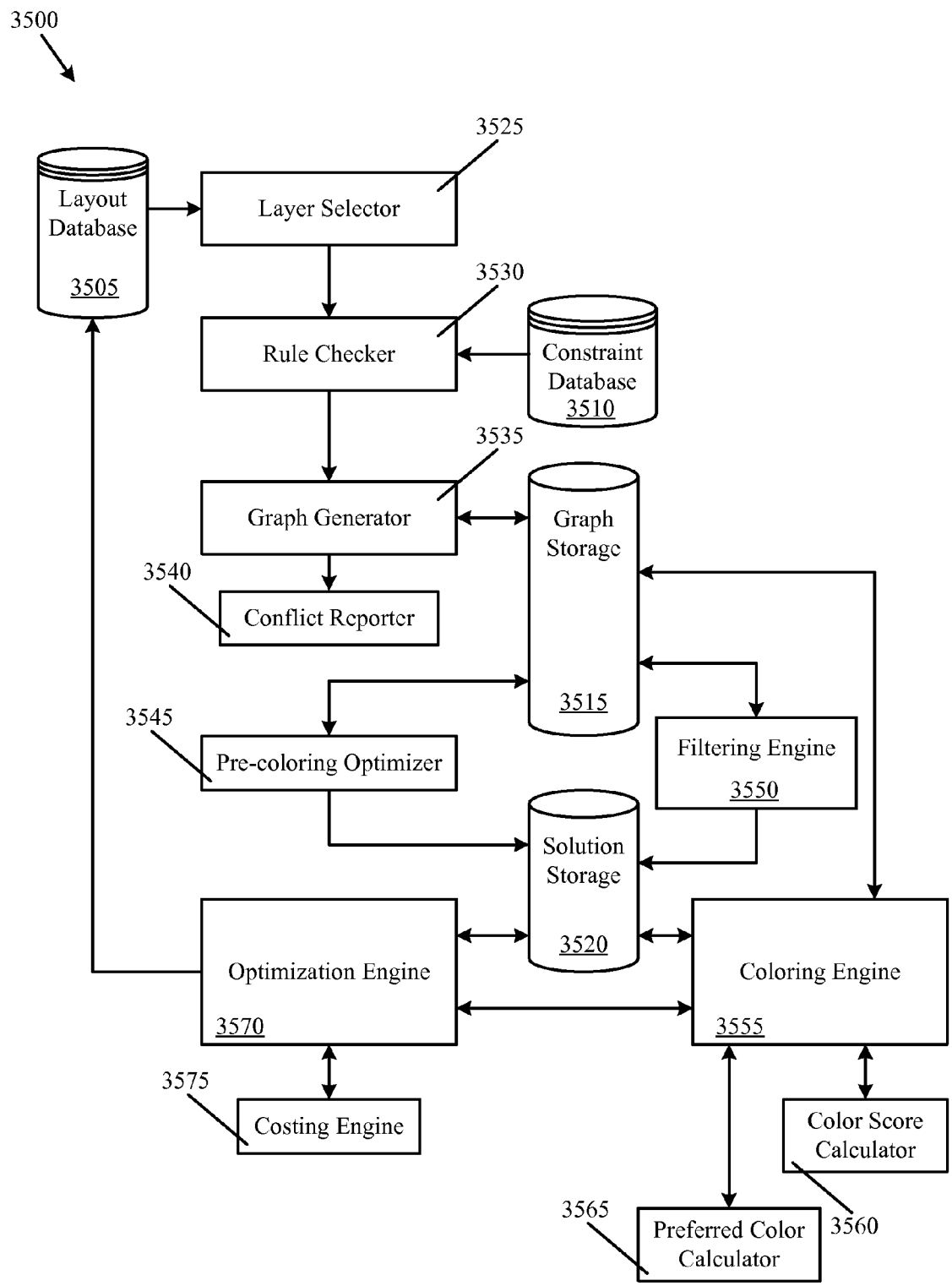
FIG. 35 conceptually illustrates the software architecture of a IC layer decomposition application of some embodiments

Some embodiments of the invention are incorporated into a IC layout decomposition application that performs the decomposition, optimization, etc. In some embodiments, the application is a design automation application. FIG. 35 conceptually illustrates the software architecture of an IC layout decomposition application 3500 of some embodiments that. In some embodiments, the IC layout decomposition application 3500 is a stand-alone application, while in other embodiments the application might be integrated into another application, and in yet other embodiments the application might be implemented within an operating system.

IC layer decomposition application 3500 includes a layout database 3505, a constraints database 3510, a graph storage element 3515 and a solution storage element 3520. In addition, the application 3500 includes a layer selector 3525, a rule checker 3530, a graph generator 3535, and a conflict reporter 3540. The application 3500 also includes a pre-coloring optimizer 3545, a filtering engine 3550, a coloring engine 3555, a color score calculator 3560, a preferred color calculator 3565, an optimization engine 3570, and a costing engine 3575.

The layout database 3505 stores one or more sets of IC layout data (i.e., a set of data which defines a number of geometries which will be fabricated on a number of layers of an IC). In some embodiments, the layer decomposition application 3500 receives an IC layout from the layout database 3505. In other embodiments, the layout may be received from a different database or a different type of storage element. The IC layout data is received by a layer selector 3525, which in some embodiments selects a single layer of the IC layout to be decomposed into multiple exposures or masks. The layer selector 3525 provides the selected layer data to the rule checker 3530 in some embodiments.

The rule checker 3530 receives the selected layer data from the layer selector 3525 and a set of manufacturing constraints from the constraint database. In some embodiments, the set of manufacturing constraints may include a pitch requirement (i.e., adjacent geometry constraints), grid placement constraints, edge placement constraints, etc. The rule checker 3530 of some embodiments determines the CSSs of the received layer of the IC. In some embodiments, the rule checker also associates the identified CSSs with a shape (e.g., the shape that includes the particular CSS), and associates particular CSSs to other particular CSSs.

The rule checker 3530 passes the identified and associated CSS data to the graph generator 3535. In some embodiments, the graph generator is used to draw a line graph (e.g., a CSS graph or a shape graph). In addition, the graph generator may be used to partition the CSS graph into sub-graphs or to divide each sub-graph into a split graph. The graph generator 3535, in addition to receiving data from the rule checker 3530, may also receive data from a graph storage element 3515. The graph generator of some embodiments passes its output to the graph storage element for use during later stages of the decomposition process. The graph generator 3535 of some embodiments also passes its output to the conflict reporter 3540. In some embodiments, the graph generator 3535 identifies a set of conflicts which may be all of the conflicts in the layer or a sub-set of the conflicts in the layer. The conflict reporter 3540 identifies and reports conflicts to a user. In some embodiments, the conflict reporter identifies a set of conflicts based on a sub-set of conflicts received from the graph generator 3535, while in other embodiments the conflict reporter simply reports the conflicts received from the graph generator.

The filtering engine 3550 of some embodiments receives data from the graph storage element 3515. The filtering engine 3550 determines whether the received data may be processed using a simplified algorithm to perform the assignment of geometries to multiple exposures. If the data is able to be processed using the simplified algorithm, the filtering engine 3550 processes the data and passes it to the solution storage element 3520. If the data is not able to be processed using the simplified algorithm, the filtering engine 3550 returns the data to the graph storage element 3515. In some embodiments, the filtering engine 3550 is able to process a sub-set of the received data using the simplified algorithm, in which case, the processed (or filtered) sub-set of data is passed to the solution storage element 3520, while the sub-set of data that the filtering engine 3550 is unable to process using the simplified algorithm is returned to the graph storage element 3515.

The pre-coloring optimizer 3545 of some embodiments also receives data from the graph storage element 3515. The pre-coloring optimizer 3545 determines whether the received data may be removed from the definition of the objective function and immediately assigned to the multiple exposures. If the data can be immediately assigned, the pre-coloring optimizer 3545 performs this assignment and passes this data to the solution storage element 3520. If the data cannot be immediately assigned, the pre-coloring optimizer 3545 returns the data to the graph storage element 3515. In some embodiments, the pre-coloring optimizer 3545 is able to optimize a sub-set of the received data, in which case, the optimized sub-set of data is passed to the solution storage element 3520, while the sub-set of data that the pre-coloring optimizer is unable to optimize is returned to the graph storage element 3515.

The coloring engine 3555 of some embodiments receives data from the graph storage element 3515, the solution storage element 3520, the optimization engine 3570, the color score calculator 3560, and/or the preferred color calculator 3565. The coloring engine of some embodiments provides its output to the graph storage element 3515, the solution storage element 3520, the color score calculator 3560, the preferred color calculator 3565, and/or the optimization engine 3570. In some embodiments, the coloring engine 3555 finds a solution to the decomposition problem (i.e., an assignment of all geometries on a design layout region to multiple exposures) and passes the solution to the solution storage element 3520.

The coloring engine may pass data representing a set of geometries on the layer to the color score calculator 3560. The color score calculator calculates color scores for the set of geometries and provides the information to the coloring engine 3555. In some embodiments, the color score calculator receives a pair of geometries and calculates which one has a higher score. In other embodiments, the color score calculator may calculate numerical scores for a set of geometries. In addition, the coloring engine 3555 may pass data representing a single geometry which includes multiple critical shape segments to the preferred color calculator 3565. The preferred color calculator determines a preferred color for the received geometry and passes the determined preferred color to the coloring engine 3555.

The optimization engine 3570 receives data from the solution storage element 3520, the coloring engine 3555, and the costing engine 3575. The optimization engine 3570 outputs data to the storage engine 3520, the coloring engine 3555, the costing engine 3575 and the layout database 3505. In some embodiments, the optimization engine 3570 receives an initial solution from the solution storage element 3520. The optimization engine 3570 provides data to the costing engine 3575, which calculates a cost function and outputs the calculated cost to the optimization engine 3570. In some embodiments, the cost function is the objective function described above. The optimization engine attempts to optimize the initial solution. The optimization engine identifies variations on the initial solution and passes the data to the coloring engine 3555. The coloring engine re-assigns geometries to multiple exposures according to the variations provided by the optimization engine 3570 and returns the results to the optimization engine. When the optimization engine (in conjunction with the costing engine 3575) determines that to keep a newer solution, it replaces the initial solution in the solution storage element 3520 with the improved solution. Some embodiments also store numerous past solutions in the solution storage element 3520. Upon arriving at an optimal solution to the decomposition problem, some embodiments of the optimization engine pass the optimal solution to the layout database 3505. In some embodiments, the optimization engine 3570 passes the optimized solution to another database or storage element.

While many of the features have been described as being performed by one module (e.g., the graph generator 3535 or the coloring engine 3555), one of ordinary skill would recognize that a particular operation might be split up into multiple modules, and the performance of one feature might even require multiple modules in some embodiments.

VII. Computer System

Many of the above-described components implement some or all the above described functionality through software processes that are specified as a set of instructions recorded on a machine readable medium (also referred to as computer readable medium). When these instructions are executed by one or more computational element(s) (such as processors or other computational elements like application specific ICs (ASICs) and field programmable gate arrays (FPGAs)), they cause the computational element(s) to perform the actions indicated in the instructions. Computer is meant in its broadest sense, and can include any electronic device with a processor. Examples of computer readable media include, but are not limited to, CD-ROMs, flash drives, RAM chips, hard drives, EPROMs, etc.

In this specification, the term "software" is meant in its broadest sense. It can include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention.

Figure 36:
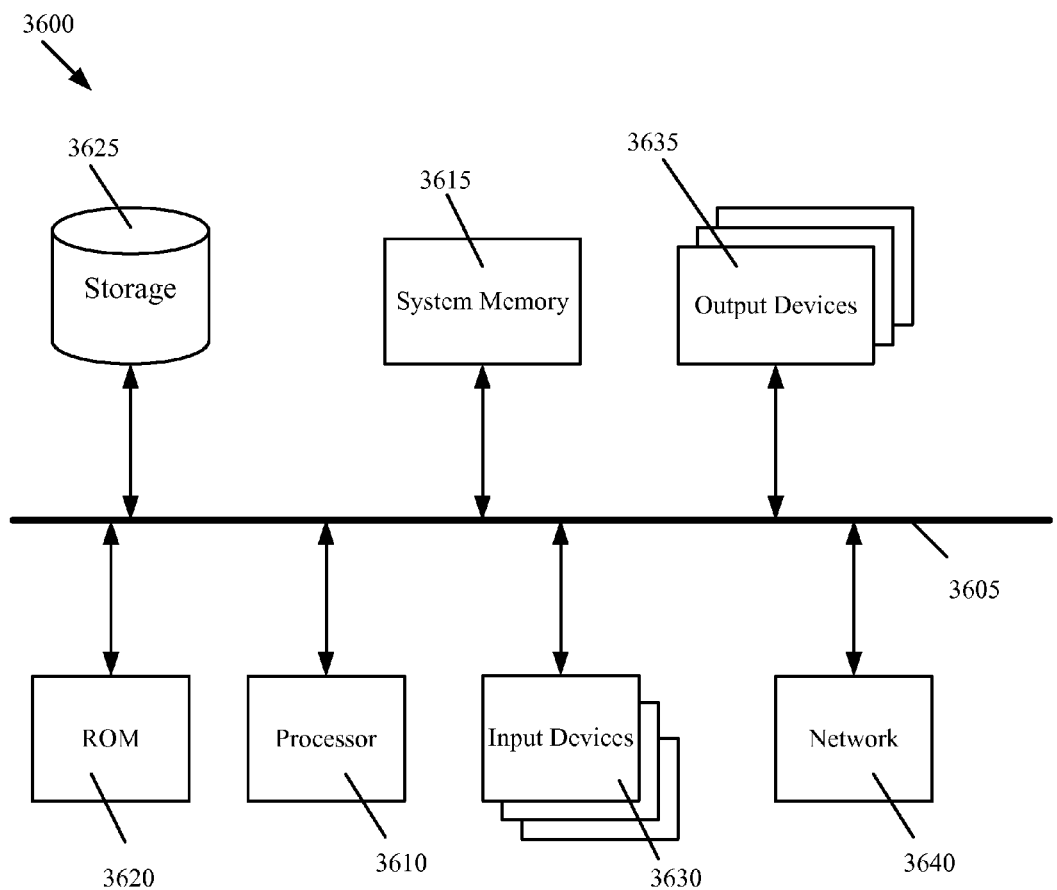
FIG. 36 illustrates a computer system with which some embodiments of the invention are implemented.

FIG. 36 illustrates a computer system with which some embodiments of the invention are implemented. Such a computer system includes various types of computer readable mediums and interfaces for various other types of computer readable mediums. Computer system 3600 includes a bus 3605, a processor 3610, a system memory 3615, a read-only memory 3620, a permanent storage device 3625, input devices 3630, and output devices 3635.

The bus 3605 collectively represents all system, peripheral, and chipset buses that communicatively connect the numerous internal devices of the computer system 3600. For instance, the bus 3605 communicatively connects the processor 3610 with the read-only memory 3620, the system memory 3615, and the permanent storage device 3625. From these various memory units, the processor 3610 retrieves instructions to execute and data to process in order to execute the processes of the invention.

The read-only-memory (ROM) 3620 stores static data and instructions that are needed by the processor 3610 and other modules of the computer system. The permanent storage device 3625, on the other hand, is a read-and-write memory device. This device is a non-volatile memory unit that stores instructions and data even when the computer system 3600 is off. Some embodiments of the invention use a mass-storage device (such as a magnetic or optical disk and its corresponding disk drive) as the permanent storage device 3625.

Other embodiments use a removable storage device (such as a floppy disk, flash drive, or ZIP® disk, and its corresponding disk drive) as the permanent storage device. Like the permanent storage device 3625, the system memory 3615 is a read-and-write memory device. However, unlike storage device 3625, the system memory is a volatile read-and-write memory, such a random access memory (RAM). The system memory stores some of the instructions and data that the processor needs at runtime. In some embodiments, the invention's processes are stored in the system memory 3615, the permanent storage device 3625, and/or the read-only memory 3620.

The bus 3605 also connects to the input and output devices 3630 and 3635. The input devices enable the user to communicate information and select commands to the computer system. The input devices 3630 include alphanumeric keyboards and pointing devices (also called "cursor control devices"). The input devices 3630 also include audio input devices (e.g., microphones, MIDI musical instruments, etc.). The output devices 3635 display images generated by the computer system. For instance, these devices display a GUI. The output devices include printers and display devices, such as cathode ray tubes (CRT) or liquid crystal displays (LCD).

Finally, as shown in FIG. 36, bus 3605 also couples computer 3600 to a network 3640 through a network adapter (not shown). In this manner, the computer can be a part of a network of computers (such as a local area network ("LAN"), a wide area network ("WAN"), or an Intranet, or a network of networks, such as the internet.

As mentioned above, the computer system 3600 may include one or more of a variety of different computer-readable media. Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ZIP® disks, read-only and recordable blu-ray discs, any other optical or magnetic media, and floppy disks.

It should be recognized by one of ordinary skill in the art that any or all of the components of computer system 3600 may be used in conjunction with the invention. Moreover, one of ordinary skill in the art will appreciate that any other system configuration may also be used in conjunction with the invention or components of the invention.

While the invention has been described with reference to numerous specific details, one of ordinary skill in the art will recognize that the invention can be embodied in other specific forms without departing from the spirit of the invention. For example, while the examples shown illustrate splitting a design layout region into two exposures, one of ordinary skill in the art would recognize that some embodiments would use similar processes to split a design layout region into more than two (e.g., three, four, etc.) exposures. One of ordinary skill in the art will also recognize that in some instances above, when referring to assigning geometries or portions of geometries to multiple exposures, the geometries (or portions thereof) are actually assigned to multiple mask layouts that are used to create multiple masks that enable a design layout layer to be printed in multiple exposures. Similarly, one of ordinary skill would recognize that while many instances above refer to "drawing" a graph, some embodiments do not actually draw the visible graph, but instead define the graph as a data structure. Thus, one of ordinary skill in the art would understand that the invention is not to be limited by the foregoing illustrative details, but rather is to be defined by the appended claims.

What is claimed is:

1. A method for decomposing a region of an integrated circuit ("IC") design layout into a plurality of mask layouts, the design layout region comprising a plurality of geometries, each geometry comprising a set of segments, the method comprising:
    at a computing device, iteratively examining different decomposition solutions for the design layout region to assign the sets of geometry segments to the plurality of mask layouts, at least one geometry segment being in conflict with at least one other geometry segment according to a design rule such that the two geometry segments must be assigned to different mask layouts, no two decomposition solutions assigning the geometry segments identically to the different mask layouts; and
    selecting a decomposition solution that reduces a number of splits, wherein a split occurs when a geometry is divided into two different segments that are assigned to two different mask layouts.

2. The method of claim 1, wherein selecting the decomposition solution comprises defining an objective function in terms of potential splits of at least one geometry among the plurality of geometries.

3. The method of claim 2, wherein selecting the decomposition solution further comprises searching a solution space of the objective function to find a decomposition solution that optimizes the objective function.

4. The method of claim 2, wherein examining the different decomposition solution comprises:
    computing a result for the objective function for each of the different decomposition solutions;
    evaluating the computed results; and
    based on said evaluation, selecting a decomposition solution that optimizes the objective function as a current decomposition solution.

5. The method of claim 4, wherein examining the different decomposition solutions further comprising, iteratively:
    modifying the current decomposition solution to produce a new decomposition solution;
    computing a result for the objective function for each of the current decomposition solution and the new decomposition solution;
    evaluating said results; and
    based on said evaluation, selecting a decomposition solution that optimizes the objective function as the current decomposition solution for the next iteration.

6. The method of claim 1, wherein selecting the decomposition solution comprises:
    determining a number of splits for each of the examined decomposition solutions; and
    selecting a decomposition solution having a smallest number of splits.

7. The method of claim 1, wherein two geometry segments must be assigned to different mask layouts when a distance between the two geometry segments is less than a particular distance.

8. The method of claim 1, wherein examining the different decomposition solutions comprises:
    identifying a first decomposition solution by assigning the geometry segments the region to the plurality of mask layouts such that no two geometry segments that must be assigned to different mask layouts are assigned to one mask layout; and modifying the first decomposition solution to produce a second decomposition solution by assigning a particular geometry segment to a mask layout different from a mask layout that the particular geometry segment was originally assigned to in the first decomposition solution.

9. The method of claim 8, wherein identifying the first decomposition solution comprises randomly assigning the particular geometry segment to a particular mask layout.

10. The method of claim 8, wherein identifying the first decomposition solution comprises:

identifying a plurality of sets of geometries in the design layout region that must be collectively assigned to the plurality of mask layouts;

assigning the geometries in a first group of collectively-assigned sets to different mask layouts without splitting any of the geometries, wherein each geometry in the first group only includes one geometry segment; and assigning the geometries in a second group of the collectively-assigned sets to different mask layouts in such a way so as to minimize the number of splits in the geometries of the second group.

11. The method of claim 10, wherein at least one geometry in each set in the second group must be split between multiple mask layouts.

12. The method of claim 10, wherein a split in a particular geometry results from assigning a first segment of the particular geometry to a first mask layout and a second segment of the particular geometry to a second mask layout, wherein the first and second segments are contiguous.

13. The method of claim 10, wherein a set of geometries must be collectively assigned to the plurality of mask layouts when an assignment of a segment of a first geometry in the set to a first mask layout determines an assignment of at least one segment of each of the other geometries in the set to the plurality of mask layouts.

14. The method of claim 10, wherein at least one geometry in each of the sets in the second group must be assigned to more than one mask layout such that a first segment of the geometry is assigned to a first mask layout and a second segment of the geometry is assigned to a second mask layout.

15. The method of claim 1, wherein the design layout region further comprises a plurality of sub-regions that are instances of a particular arrangement of geometries.

16. The method of claim 15, wherein the geometry segments of a particular sub-region are assigned to the plurality of mask layouts prior to assigning the rest of the geometry segments of the design layout region to the plurality of mask layouts.

17. The method of claim 16, wherein the assignment of the geometry segments of the particular sub-region to the plurality of mask layouts is applied to other sub-regions of the design layout region.

18. The method of claim 1 further comprising determining sets of geometries for which an optimal solution exists, wherein an optimal solution for a particular set of geometries comprises assigning each geometry in the set of geometries to a single mask layout without splitting the geometry, wherein all geometries assigned to the single mask layout are in accordance with a set of design rules.

19. The method of claim 1 further comprising partitioning the design layout region into sets geometry segments, wherein an assignment of one geometry segment in a set to a particular mask layout determines assignments of all other geometry segments in the set.

20. The method of claim 1, wherein the plurality of mask layouts are for creating multiple masks to fabricate a layer of the IC in multiple exposures.

21. A non-transitory computer readable storage medium storing a computer program for decomposing a region of an integrated circuit ("IC") design layout into a plurality of mask layouts, the design layout region comprising a plurality of geometries, each geometry comprising a set of segments, the computer program or execution by at least one processor, the computer program comprising sets of instructions for:

iteratively examining different decomposition solutions for the design layout region to assign the sets of geometry segments to the plurality of mask layouts at least one geometry segment being in conflict with at least one other geometry segment according to a design rule such that the two geometry segments must be assigned to different mask layouts, no two decomposition solutions assigning the geometry segments identically to the different mask layouts; and selecting a decomposition solution that reduces a number of splits, wherein a split occurs when a geometry is divided into two different segments that are assigned to two different mask layouts.

22. The non-transitory computer readable medium of claim 21, wherein the sets of instructions for selecting the decomposition solution comprise sets of instructions for:

determining a number of splits for each of the examined decomposition solutions; and selecting a decomposition solution having a smallest number of splits.

23. The non-transitory computer readable medium of claim 22, wherein the set of instructions for examining the different decomposition solutions comprises sets of instructions for:

identifying a first decomposition solution by assigning the geometry segments in the region to the plurality of mask layouts such that no two geometry segments that must be assigned to different mask layouts are assigned to one mask layout; and modifying the first decomposition solution to produce a second decomposition solution by assigning a particular geometry segment to a mask layout different from a mask layout that the particular geometry segment was originally assigned to in the first decomposition solution.

24. The non-transitory computer readable medium of claim 23, wherein the set of instructions for identifying the first decomposition solution comprises a set of instructions for randomly assigning the particular geometry segment to a particular mask layout.

25. The non-transitory computer readable storage medium of claim 23, wherein the set of instructions for identifying the first decomposition solution comprises sets of instructions for:

identifying a plurality of sets of geometries in the design layout region that must be collectively assigned to the plurality of mask layouts;

assigning the geometries in a first group of collectively-assigned sets to different mask layouts without splitting any of the geometries, wherein each geometry in the first group only includes one geometry segment; and assigning the geometries in a second group of the collectively-assigned sets to different mask layouts in such a way so as to minimize the number of splits in the geometries of the second group.

26. The non-transitory computer readable medium of claim 21, wherein the design rule specifies a minimum spacing between a first geometry and a second geometry.

27. The non-transitory computer readable medium of claim 21, wherein the sets of instructions for selecting the decomposition solution comprises a set of instructions for defining an objective function in terms of potential splits of at least one geometry among the plurality of geometries.

28. The non-transitory computer readable medium of claim 27, wherein the set of instructions for examining the different decomposition solutions comprising sets of instructions for:
  computing a result for the objective function for each of the different decomposition solutions;
  evaluating the computed results; and
  based on said evaluation, selecting a decomposition solution that optimizes the objective function as a current decomposition solution.

29. The non-transitory computer readable medium of claim 28, wherein the set of instructions for examining the different decomposition solutions comprises sets of instructions for:
  iteratively modifying the current decomposition solution to produce a new decomposition solution;
  computing a result for the objective function for each of the current decomposition solution and the new decomposition solution; and
  based on the computed object function results, selecting a decomposition solution that optimizes the objective function as the current decomposition solution for the next iteration.

30. The method of claim 1, wherein the design layout region corresponds to a particular layer of an IC design comprising a plurality of layers, wherein the particular layer of the IC design is a polysilicon layer or a metal layer.

31. The method of claim 1, wherein the design layout region corresponds to a particular layer of an IC design comprising a plurality of layers, wherein the design rule specifies a minimum spacing between a first geometry and a second geometry on the particular layer.

32. A method for decomposing a region of an integrated circuit ("IC") design layout into a plurality of mask layouts, the design layout region comprising a plurality of geometries, the method comprising:
  at a computing device, iteratively identifying a plurality of different decomposition solutions for the design layout region, each decomposition solution decomposing each of the plurality of geometries into a set of segments that are assigned to the plurality of mask layouts, no one decomposition solution assigning all segments to the different mask layouts identically to any other decomposition solutions;
  for each of the plurality of different identified decomposition solutions, determining a cost for the decomposition solution based on a number of splits occurred in the plurality of geometries, wherein a split occurs when a geometry is divided into two different segments that are assigned to two different mask layouts; and
  selecting a decomposition solution from the plurality of different decomposition solutions based on the determined costs of the different decomposition solutions.

33. The method of claim 32 further comprising identifying an initial decomposition solution before iteratively identifying the plurality of different decomposition solutions.

34. The method of claim 33, wherein identifying the initial decomposition solution comprises starting with a first geometry in the design layout region, traversing the plurality of geometries to assign the geometry segments to the plurality of mask layouts.

35. The method of claim 32, wherein selecting the decomposition solution comprises selecting a decomposition solution that has a smallest number of splits.

36. The method of claim 32, wherein any two decomposition solutions in the plurality of different decomposition solutions either have different number of segments or assign the segments differently to the plurality of mask layouts.

37. The method of claim 32, wherein the plurality of different decomposition solutions comprises a group of decomposition solutions, wherein each decomposition solution in the group has a different number of segments than any other decomposition solutions in the group.

38. The method of claim 32, wherein the plurality of different decomposition solutions comprises a group of decomposition solutions having identical segments, wherein no two decomposition solutions in the group assign the segments identically to the plurality of mask layouts.

* * * * *